US012677075B2

(12) United States Patent
Ikuma et al.

(10) Patent No.: US 12,677,075 B2
(45) Date of Patent: Jul. 7, 2026

(54) SOLID-STATE IMAGING APPARATUS, IMAGING APPARATUS, AND DISTANCE-MEASURING IMAGING APPARATUS

(71) Applicant: Nuvoton Technology Corporation Japan, Kyoto (JP)

(72) Inventors: Makoto Ikuma, Hyogo (JP); Yutaka Abe, Osaka (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 69 days.

(21) Appl. No.: 18/514,819

(22) Filed: Nov. 20, 2023

(65) Prior Publication Data

US 2024/0089625 A1 Mar. 14, 2024

Related U.S. Application Data

(63) Continuation of application No. PCT/JP2022/017640, filed on Apr. 12, 2022.

(30) Foreign Application Priority Data

May 27, 2021 (JP) ................................. 2021-089530

(51) Int. Cl.
*H04N 25/77* (2023.01)
*G01S 17/894* (2020.01)
(Continued)

(52) U.S. Cl.
CPC ........... *H04N 25/77* (2023.01); *G01S 17/894* (2020.01); *H04N 25/60* (2023.01); *H04N 25/616* (2023.01);
(Continued)

(58) Field of Classification Search
CPC ........ H04N 25/60; H04N 25/65; H04N 25/77; H04N 25/616
See application file for complete search history.

(56) References Cited

U.S. PATENT DOCUMENTS 3,134,101 A * 5/1964 Dickey, Jr. ............ G01S 13/528
342/163
7,277,129 B1 * 10/2007 Lee ...................... H04N 25/616
348/E5.079
(Continued)

FOREIGN PATENT DOCUMENTS

CN 100561251 C * 11/2009
EP 0254813 A2 * 2/1988 ........... G08B 13/191
(Continued)

OTHER PUBLICATIONS

International Search Report dated Jul. 12, 2022 issued in International Patent Application No. PCT/JP2022/017640, with English translation.

(Continued)

*Primary Examiner* — David N Werner
(74) *Attorney, Agent, or Firm* — Rimon P.C.

(57) ABSTRACT

A solid-state imaging apparatus includes a pixel circuit that outputs a pixel signal and a negative feedback circuit. The negative feedback circuit includes a sample and hold circuit (hereinafter "SH circuit") that samples and holds the pixel signal, and a feedback amplifier that negatively feeds back, to the SH circuit, a feedback signal according to a difference between the pixel signal from the pixel circuit and an output signal from the SH circuit.

18 Claims, 30 Drawing Sheets

(51) Int. Cl.

| | |
|---|---|
| *H04N 25/60* | (2023.01) |
| *H04N 25/616* | (2023.01) |
| *H04N 25/65* | (2023.01) |
| *H04N 25/78* | (2023.01) |
| *H04N 25/79* | (2023.01) |
| *H04N 25/76* | (2023.01) |
| *H10F 39/00* | (2025.01) |

(52) U.S. Cl.
CPC ............ *H04N 25/65* (2023.01); *H04N 25/78* (2023.01); *H04N 25/79* (2023.01); *H04N 25/7795* (2023.01); *H10F 39/809* (2025.01)

(56) References Cited

U.S. PATENT DOCUMENTS

| | | | | |
|---|---|---|---|---|
| 10,404,445 | B1 * | 9/2019 | Zhang .................... | H03L 7/0807 |
| 10,834,351 | B2 | 11/2020 | Wang et al. | |
| 11,165,983 | B1 * | 11/2021 | Park ........................ | H04N 25/59 |
| 2006/0082502 | A1 * | 4/2006 | Dooley ................. | G01S 5/0218 |
| | | | | 342/453 |
| 2006/0146158 | A1 | 7/2006 | Toros et al. | |
| 2006/0193016 | A1 * | 8/2006 | Machida ................ | H04N 25/77 |
| | | | | 348/E5.079 |
| 2008/0266434 | A1 | 10/2008 | Sugawa et al. | |
| 2008/0291310 | A1 * | 11/2008 | Ladd .................... | H04N 25/573 |
| | | | | 348/308 |
| 2009/0256060 | A1 * | 10/2009 | Meynants ............ | H04N 25/616 |
| | | | | 250/214 A |
| 2010/0117884 | A1 * | 5/2010 | Ahmed .................... | G01S 19/22 |
| | | | | 342/14 |
| 2011/0267505 | A1 * | 11/2011 | Dierickx ................ | H04N 25/77 |
| | | | | 348/E5.079 |
| 2011/0273332 | A1 * | 11/2011 | Ahmed ................. | G01S 19/246 |
| | | | | 342/357.72 |
| 2011/0292263 | A1 | 12/2011 | Kinugasa | |
| 2014/0346321 | A1 * | 11/2014 | Kinugasa ............... | H04N 25/65 |
| | | | | 250/208.1 |
| 2014/0375855 | A1 * | 12/2014 | Nishihara .......... | H03M 1/1019 |
| | | | | 348/301 |
| 2016/0006969 | A1 * | 1/2016 | Matsumoto ......... | H04N 25/701 |
| | | | | 348/308 |
| 2016/0028974 | A1 * | 1/2016 | Guidash ............... | H04N 25/616 |
| | | | | 348/294 |
| 2016/0190188 | A1 | 6/2016 | Murakami et al. | |
| 2017/0104946 | A1 | 4/2017 | Hong | |
| 2017/0180660 | A1 | 6/2017 | Xu et al. | |
| 2018/0220880 | A1 * | 8/2018 | Akahane .............. | H04N 25/778 |
| 2018/0234649 | A1 * | 8/2018 | Matsuura ............ | H04N 25/709 |
| 2019/0098232 | A1 | 3/2019 | Mori et al. | |
| 2019/0230299 | A1 | 7/2019 | Ohta | |
| 2019/0361098 | A1 * | 11/2019 | Hollmann ............ | G01S 7/4863 |
| 2020/0259571 | A1 * | 8/2020 | Schmidt ............... | H04B 17/103 |
| 2021/0026036 | A1 * | 1/2021 | Thun-Hohenstein ... | G01S 17/32 |
| 2022/0357427 | A1 * | 11/2022 | Kirillov ............... | G01S 7/4815 |

FOREIGN PATENT DOCUMENTS

| | | | | | | |
|---|---|---|---|---|---|---|
| EP | | 1253781 | A2 | * | 10/2002 | ............ H04N 25/65 |
| EP | | 1343310 | A2 | * | 9/2003 | .......... H04N 25/616 |
| EP | | 2442557 | A2 | * | 4/2012 | .............. H04N 5/32 |
| EP | | 3617676 | A1 | * | 3/2020 | ........... G01J 5/0014 |
| JP | | 6785433 | B2 | | 11/2020 | |
| KR | | 100856573 | B1 | * | 9/2008 | |
| RU | | 2189054 | C2 | * | 9/2002 | |
| WO | WO-2006007088 | A1 | | * | 1/2006 | .......... G01C 15/006 |

OTHER PUBLICATIONS

Extended European Search Report dated Aug. 26, 2024 issued in the corresponding European Patent Application No. 22811055.7.

* cited by examiner

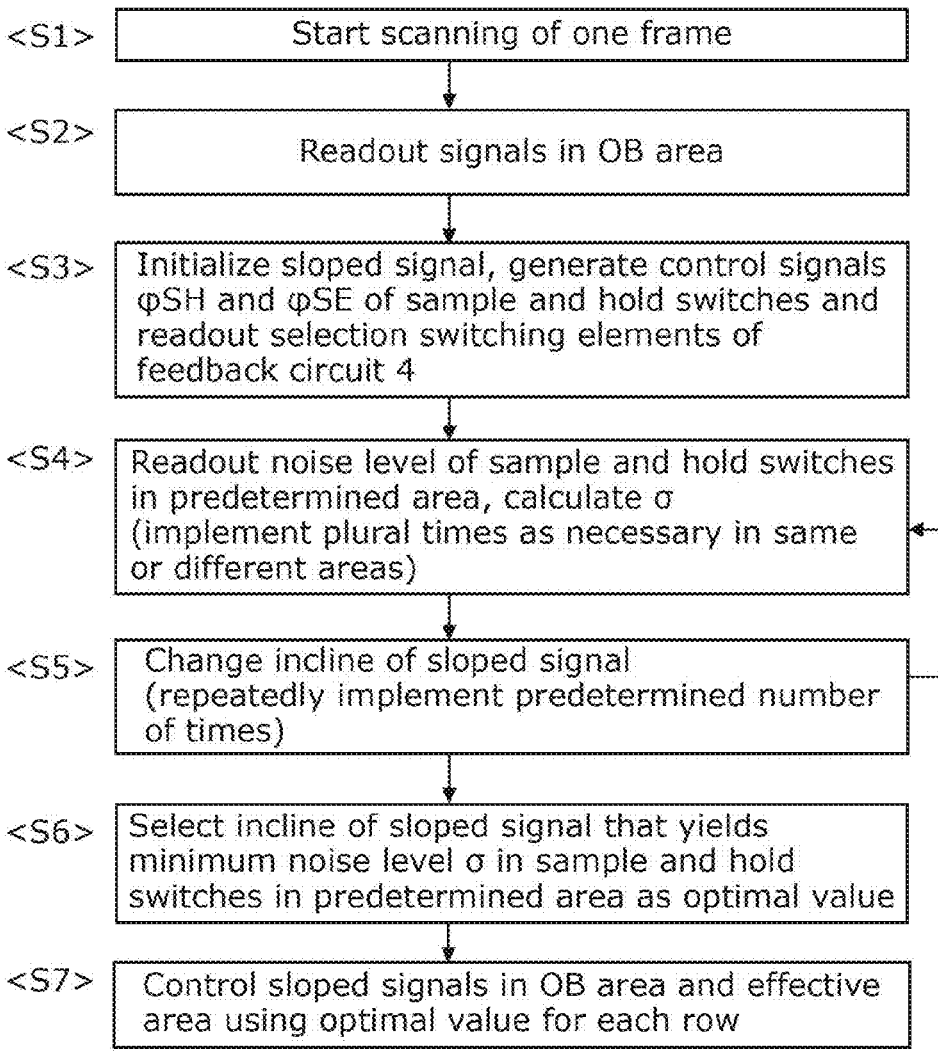

<S1>   Start scanning of one frame

<S2>   Readout signals in OB area

<S3>   Initialize sloped signal, generate control signals φSH and φSE of sample and hold switches and readout selection switching elements of feedback circuit 4

<S4>   Readout noise level of sample and hold switches in predetermined area, calculate σ (implement plural times as necessary in same or different areas)

<S5>   Change incline of sloped signal (repeatedly implement predetermined number of times)

<S6>   Select incline of sloped signal that yields minimum noise level σ in sample and hold switches in predetermined area as optimal value <S7>   Control sloped signals in OB area and effective area using optimal value for each row

FIG. 13

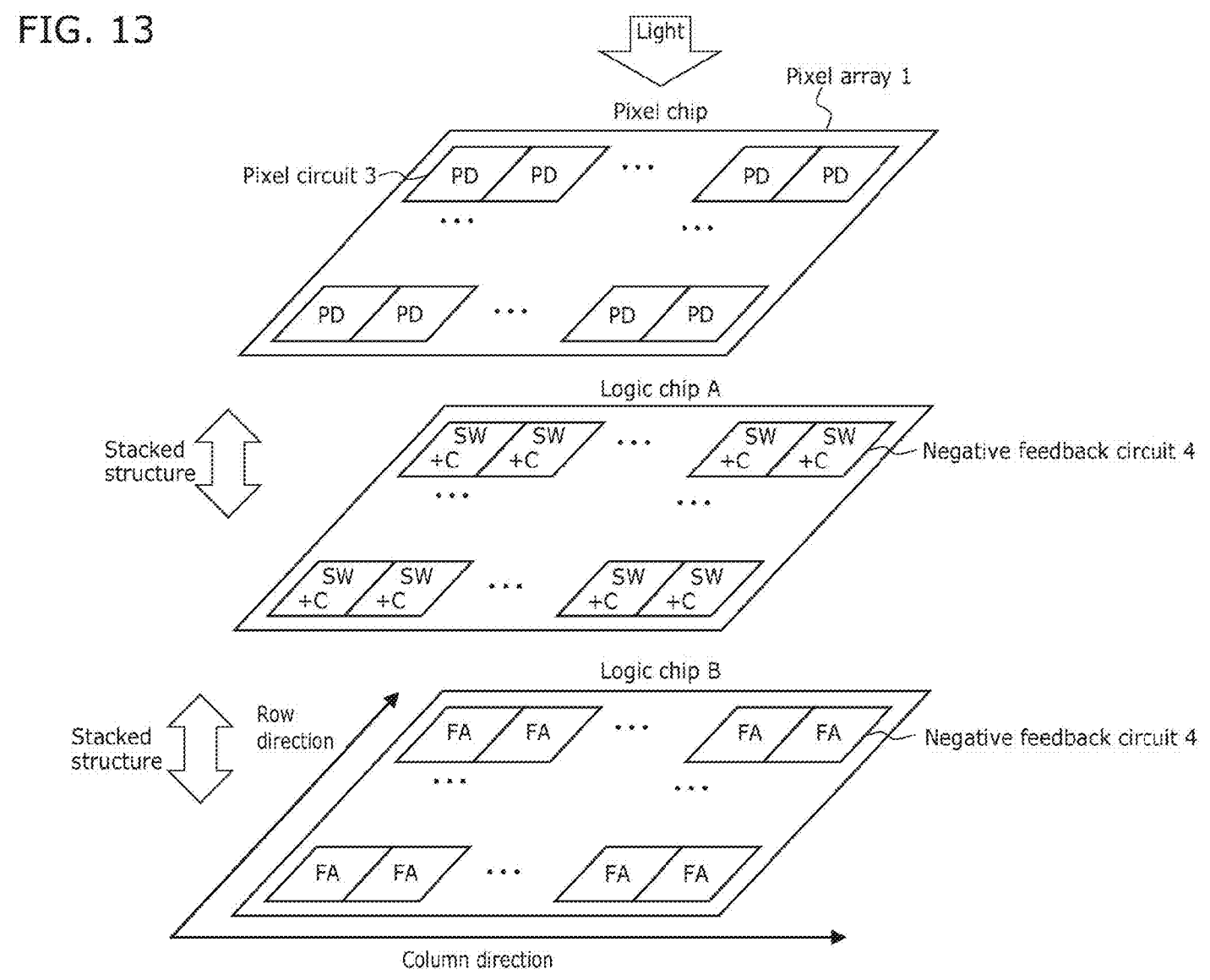

Light

Pixel chip

Pixel array 1

Pixel circuit 3

PD | PD

PD | PD

PD

PD

PD | PD

Logic chip A

Negative feedback circuit 4

SW +C | SW +C

SW +C

SW +C

SW +C | SW +C

Stacked structure

Logic chip B

Negative feedback circuit 4

FA | FA

FA | FA

FA | FA

FA | FA

Row direction

Stacked structure

Column direction

FIG. 21

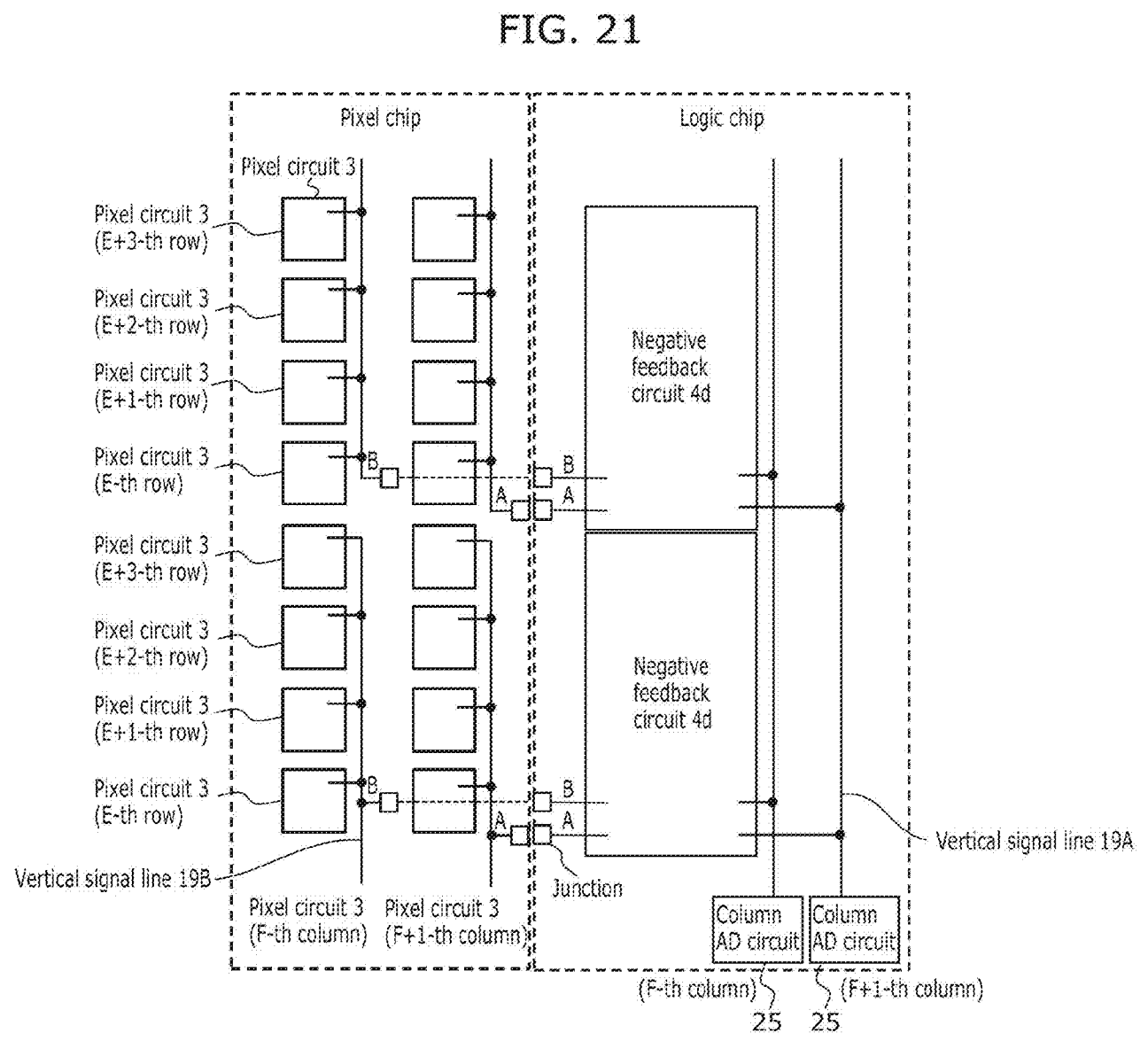

Logic chip

Pixel chip

Negative feedback circuit 4d

Negative feedback circuit 4d

Column AD circuit

Column AD circuit

Column AD circuit

25

25

(F-th column)

(F+1-th column)

Junction

B

A

A

B

A

B

A

Vertical signal line 19A

Pixel circuit 3 (F-th column)

Pixel circuit 3 (F+1-th column)

Pixel circuit 3 (E+3-th row)

Pixel circuit 3 (E+2-th row)

Pixel circuit 3 (E+1-th row)

Pixel circuit 3 (E-th row)

Pixel circuit 3 (E+3-th row)

Pixel circuit 3 (E+2-th row)

Pixel circuit 3 (E+1-th row)

Pixel circuit 3 (E-th row)

Vertical signal line 19B (a)

(a) Exposure/shutter/readout timing of charge Q0
dashed line in exposure time indicates shutter timing;
solid line indicates timing of readout from pixel

• T1_Q0: period in which Q0 signals are transferred to
SH capacitors for all pixels simultaneously (a) Exposure/shutter/readout timing of charge Q0
dashed line in exposure time indicates shutter timing;
solid line indicates timing of readout from pixel ・T1_Q0: period in which Q0 signals are transferred to
SH capacitors row by row

FIG. 28

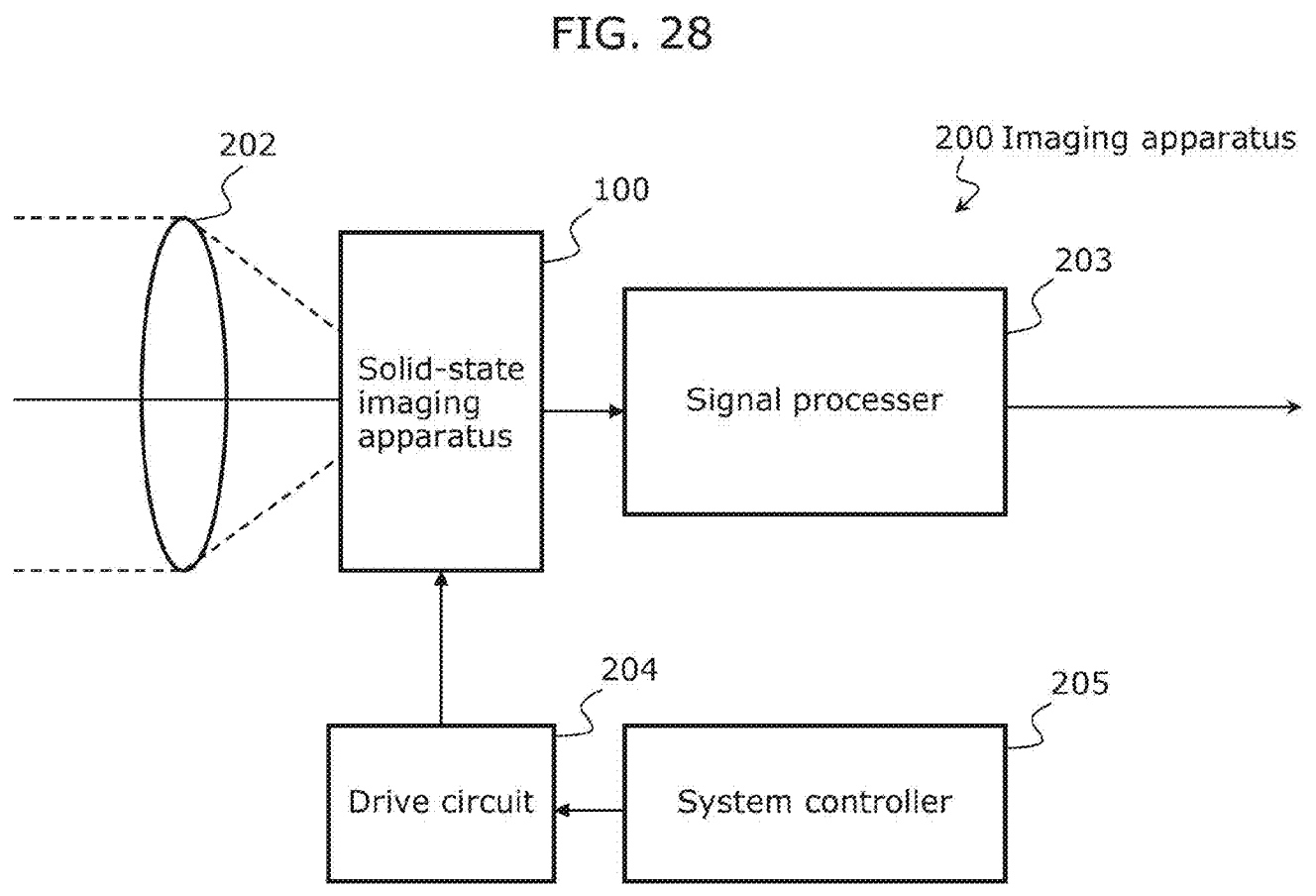

200 Imaging apparatus

203

Signal processer

205

System controller

100

Solid-state imaging apparatus

204

Drive circuit

300 Distance-measuring imaging apparatus

SOLID-STATE IMAGING APPARATUS, IMAGING APPARATUS, AND DISTANCE-MEASURING IMAGING APPARATUS

CROSS REFERENCE TO RELATED APPLICATIONS

This is a continuation application of PCT International Application No. PCT/JP2022/017640 filed on Apr. 12, 2022, designating the United States of America, which is based on and claims priority of Japanese Patent Application No. 2021-089530 filed on May 27, 2021. The entire disclosures of the above-identified applications, including the specifications, drawings, and claims are incorporated herein by reference in their entirety.

FIELD

The present invention relates to a solid-state imaging apparatus, an imaging apparatus, and a distance-measuring imaging apparatus.

BACKGROUND

Patent Literature (PTL) 1 discloses a sample and hold circuit connected to a pixel circuit.

PTL 2 discloses a method for reducing kTC noise (reset noise) generated in a pixel circuit.

Citation List

PATENT LITERATURE

PTL 1: U.S. Pat. No. 10,834,351
PTL 2: Japanese Patent No. 6785433

SUMMARY

Technical Problem

In PTL 1, there is a large amount of noise because no measures are taken to reduce kTC noise generated when sampling the pixel signal, making it difficult to improve the S/N in low illuminance.

In PTL 2, a negative feedback circuit is included as a way to reduce kTC noise generated during pixel reset. While this negative feedback circuit negatively feedbacks the reset component of the pixel signal, it cannot negatively feedback the signal component of the pixel signal.

In view of the above, the present disclosure provides a solid-state imaging apparatus, an imaging apparatus, and a distance-measuring imaging apparatus that improve the S/N in low illuminance and extend the dynamic range by reducing kTC noise generated during sampling when a pixel signal (both reset and signal components) is read into a sample and hold circuit.

Solution to Problem

In order to overcome the above problem, a solid-state imaging apparatus according to one aspect of the present disclosure includes a pixel circuit that outputs a pixel signal and a negative feedback circuit. The negative feedback circuit includes a sample and hold circuit that samples and holds the pixel signal, and a feedback amplifier that negatively feeds back, to the SH circuit, a feedback signal according to a difference between the pixel signal from the pixel circuit and an output signal from the SH circuit.

An imaging apparatus according to one aspect of the present disclosure includes: the solid-state imaging apparatus described above that captures an image of a subject; an imaging optical system that guides incident light from the subject to the solid-state imaging apparatus; and a signal processor that processes an output signal from the solid-state imaging apparatus.

A distance-measuring imaging apparatus according to one aspect of the present disclosure includes: the solid-state imaging apparatus described above that captures reflected light from a target irradiated with pulsed light; an imaging optical system that guides the reflected light from the target to the solid-state imaging apparatus; and a signal processor that processes an output signal from the solid-state imaging apparatus.

Advantageous Effects

The solid-state imaging apparatus, imaging apparatus, and distance-measuring imaging apparatus according to the present disclosure can improve the S/N in low illuminance and extend the dynamic range.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 9 illustrates the variation (standard deviation) in the kTC noise in a predetermined area.

FIG. 10 is a flowchart showing an example of a process for generating a sloped signal.

FIG. 13 illustrates an example of the solid-state imaging apparatus according to Embodiments 1A, 1B, 2A, 2B, and 4 configured as a stacked-structure back-side illumination image sensor.

FIG. 21 illustrates an example of a junction between a pixel circuit and a negative feedback circuit according to Embodiment 3.

FIG. 28 is a diagram illustrating an example of a camera system including an imaging apparatus according to Embodiment 5.

FIG. 29 is a diagram illustrating an example of a distance measuring system including a distance-measuring imaging apparatus according to Embodiment 5.

DESCRIPTION OF EMBODIMENTS

Underlying Knowledge Forming Basis of the Present Disclosure

The inventors have found that the following issues arise in connection with a solid-state imaging apparatus described in the Background section above.

In the solid-state imaging apparatus disclosed in PTL 1, the signal charge generated by photodiode PD is transferred to and stored in the charge storage (FD), output from the amplification transistor, and the voltage-converted pixel signal is sampled and held in sample and hold capacitive element C. Here, since no measures are taken to reduce kTC noise, the noise level is significant and degrades the low-illuminance noise.

To reduce kTC noise, sample and hold capacitive element C is required to have high-density and low-leakage characteristics.

High-density characteristics are required because, as can be seen when the kTC noise is expressed in terms of voltage as $\sqrt{(kT/C)}(V)$, the larger the capacitance value C is, the lower the noise level is. In particular, to achieve a layout surface area that accommodates increasingly smaller pixel sizes, high density is essential.

Low-leakage characteristics are required because a global shutter method in which all pixels are simultaneously exposed requires a long storage period (signal retention period) from when the signal is read out from pixel circuit 3 to sample and hold capacitive element C and subsequently actually read out. In particular, since each row is scanned and read out using a rolling method by the vertical scanning circuit, the leakage characteristics of sample and hold capacitive element C must not affect the first and last readout rows.

The reality is that creating a sample and hold capacitive element C that combines both of these two characteristics using processing technology is both technically challenging and cost-prohibitive. In particular, the technical challenge increases as the pixels become smaller.

In view of this, the present disclosure provides a solid-state imaging apparatus and an imaging apparatus that improve the S/N in low illuminance and extend the dynamic range.

Figure 1A:
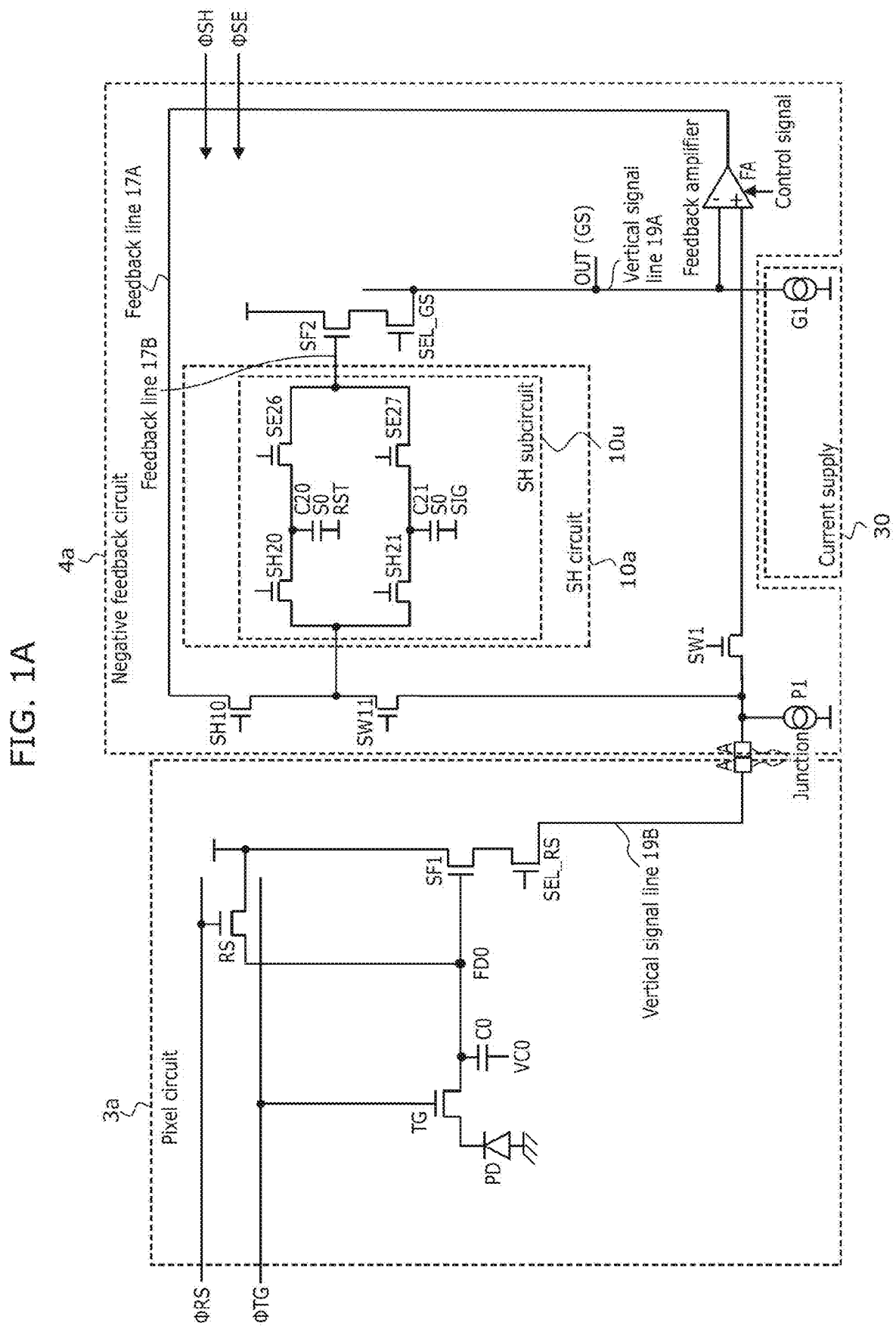
FIG. 1A illustrates a circuit example of a pixel circuit and a negative feedback circuit according to Embodiment 1A.

Overview of the Solid-State Imaging Apparatus According to One Aspect of the Present Disclosure As illustrated in FIG. 1A, a solid-state imaging apparatus according to one aspect of the present disclosure includes pixel circuit 3a that outputs a pixel signal and negative feedback circuit 4a. Negative feedback circuit 4a includes sample and hold circuit 10a that samples and holds the pixel signal and a feedback amplifier that negatively feeds back, to sample and hold circuit 10a, a feedback signal according to the difference between the pixel signal from pixel circuit 3a and the output signal from sample and hold circuit 10a. Hereinafter, "sample and hold circuit" may be abbreviated to "SH circuit".

Figure 14:
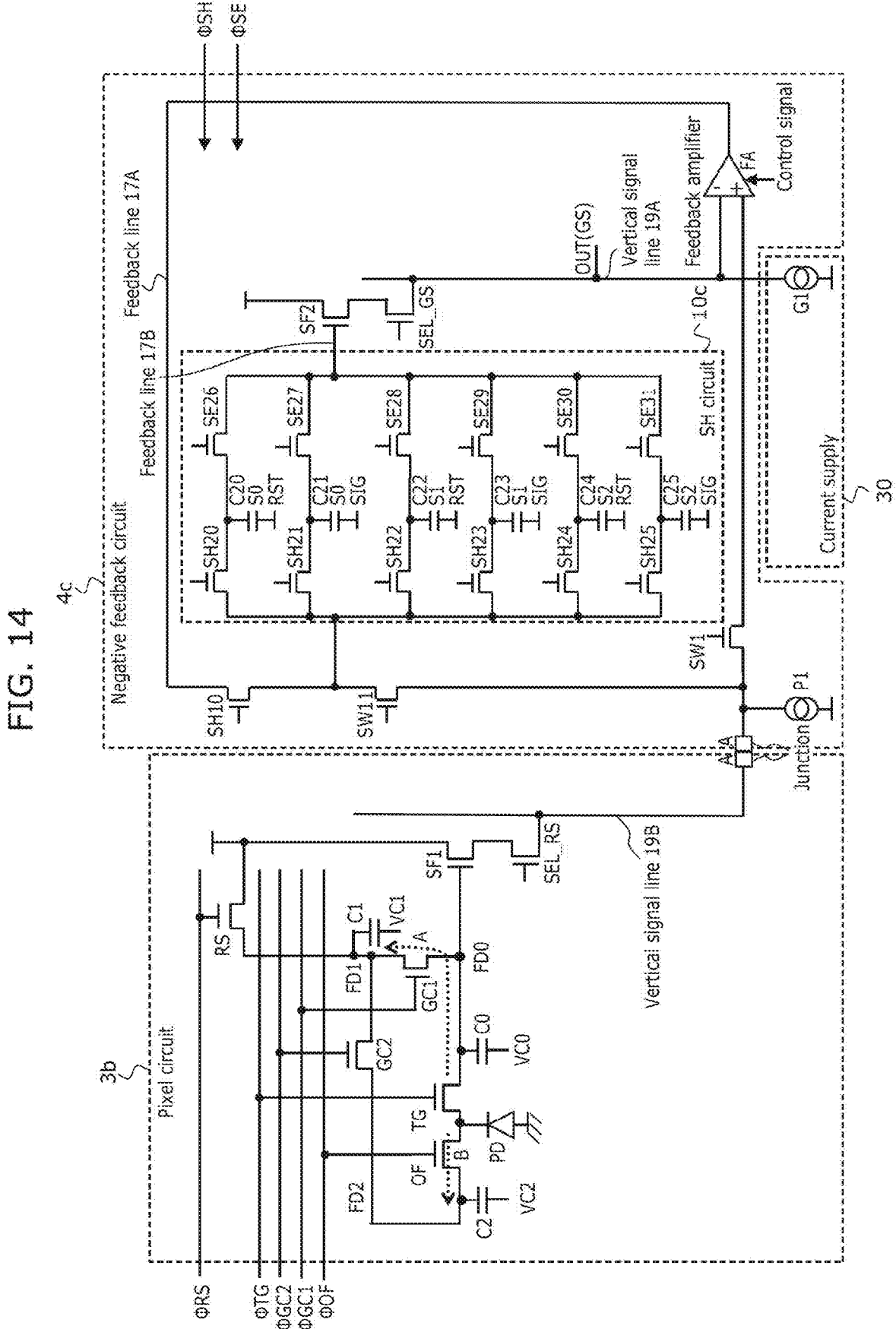
FIG. 14 illustrates a circuit example of a pixel circuit and a negative feedback circuit according to Embodiment 2A.
Figure 15:
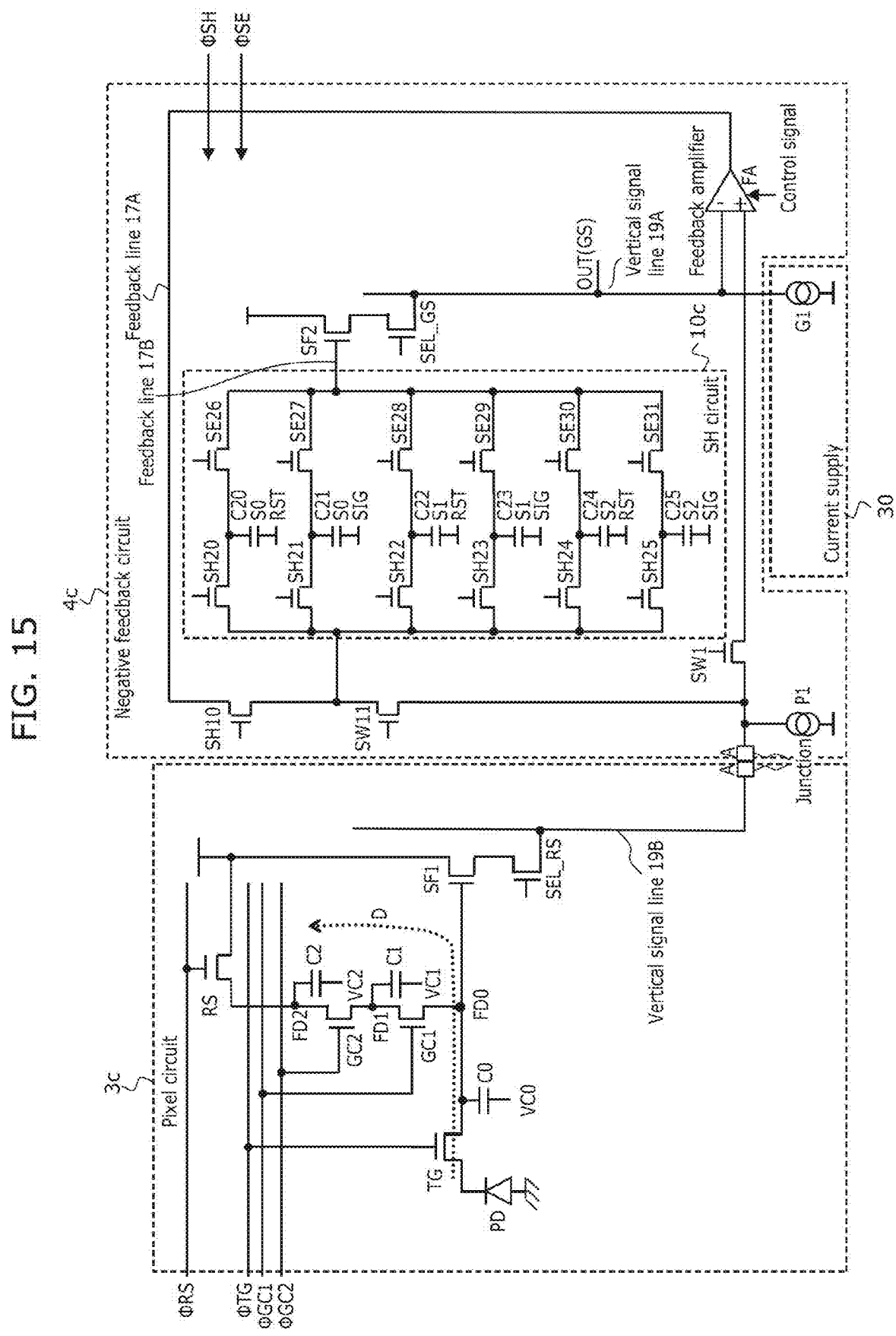
FIG. 15 illustrates a circuit example of a pixel circuit and a negative feedback circuit according to Embodiment 2B.

Pixel circuit 3a illustrated in FIG. 1A is one example of the pixel circuit, and may be pixel circuit 3b illustrated in FIG. 14 or pixel circuit 3c illustrated in FIG. 15.

Pixel circuit 3a illustrated in FIG. 1A includes a charge storage (FD0) that holds the signal charge from photodiode PD.

Pixel circuit 3b illustrated in FIG. 14 and pixel circuit 3c illustrated in FIG. 15 are provided with a storage circuit including switching elements (OF, GC1, and GC2) as overflow gates and storage capacitive elements (C1 and C2) to hold the signal charge that overflows from photodiode PD.

Here, pixel circuit 3b illustrated in FIG. 14 is configured to include the above storage circuit in the horizontal direction relative to photodiode PD. Pixel circuit 3c illustrated in FIG. 15 includes a group of storage circuits for overflow signal charge including the above-described storage circuits in series in the vertical direction in a plurality of stages (m stages; m≥1) in series.

In pixel circuit 3c, during the exposure period, when m=1, the storage capacitive element of a storage circuit receives the charge that overflows from photodiode PD. When m≥2, the charge that overflows from this storage capacitive element is further received by the storage capacitive element in a subsequent stage storage circuit.

Figure 2:
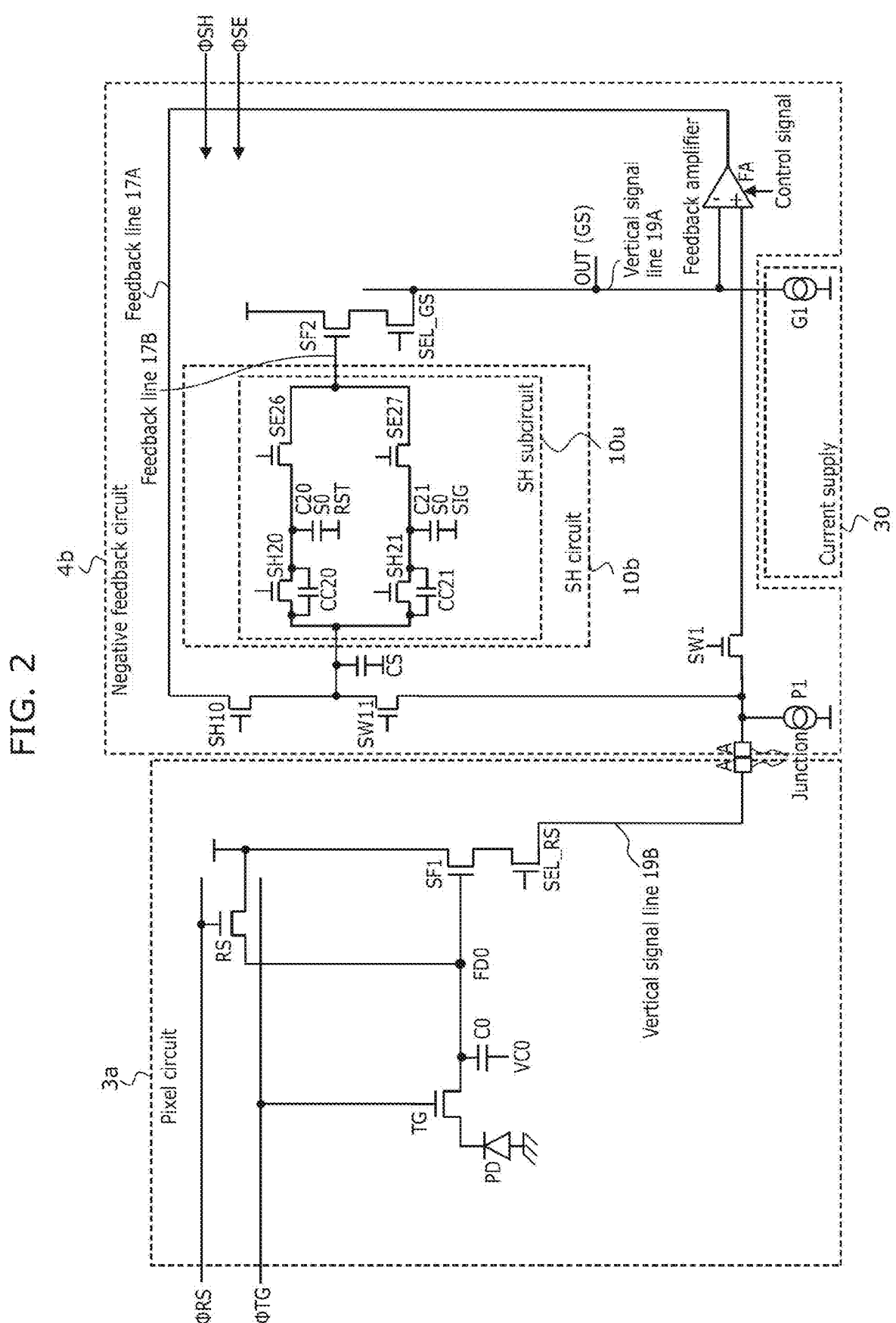
FIG. 2 illustrates a circuit example of a pixel circuit and a negative feedback circuit according to Embodiment 1B.

Negative feedback circuit 4a illustrated in FIG. 1A is one example of the negative feedback circuit, and may be negative feedback circuit 4b illustrated FIG. 2 or negative feedback circuit 4c illustrated FIG. 14 and FIG. 15.

Next, three configuration examples (a first configuration example, a second configuration example, and a third configuration example) will be given as an overview of the solid-state imaging apparatus according to one aspect of the present disclosure. The first configuration example includes pixel circuit 3a and negative feedback circuit 4a illustrated in FIG. 1A. The second configuration example includes pixel circuit 3b and negative feedback circuit 4c illustrated in FIG. 14. The third configuration example includes pixel circuit 3c and negative feedback circuit 4c illustrated in FIG. 15.

First Configuration Example of the Solid-State Imaging Apparatus

First, the first configuration example will be given.

Figure 3:
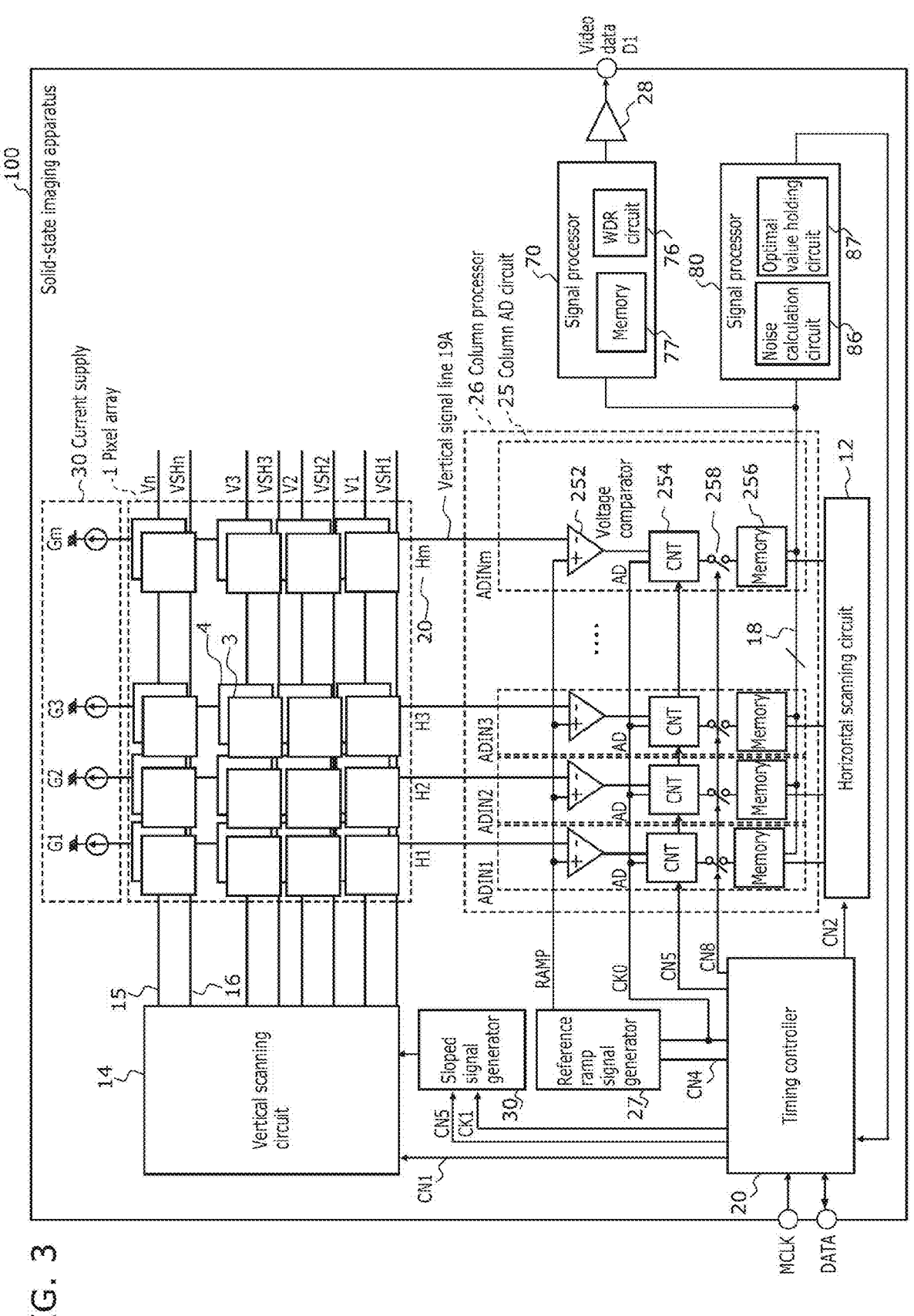
FIG. 3 is a block diagram illustrating an example of a configuration of a solid-state imaging apparatus.

Solid-state imaging apparatus 100 illustrated in FIG. 3 includes a plurality of pixel circuits 3 arranged in a matrix and a plurality of negative feedback circuits 4 arranged in a matrix. Pixel circuit 3 is one of pixel circuits 3a, 3b, and 3c. Where there is no particular need to distinguish between them, pixel circuits 3a, 3b, and 3c are denoted simply as pixel circuit 3. Negative feedback circuit 4 is one of negative feedback circuits 4a, 4b, and 4c. Where there is no particular need to distinguish between them, negative feedback circuits 4a, 4b, and 4c are denoted simply as negative feedback circuit 4.

The first configuration example of solid-state imaging apparatus 100 includes pixel circuit 3a and negative feedback circuit 4a connected to pixel circuit 3a that are illustrated in FIG. 1A.

Pixel circuit 3a includes photodiode PD, transfer transistor TG, charge storage FD0, transfer transistor TG, amplification transistor SF1, reset transistor RS, and selection transistor SEL_RS.

Photodiode PD is a photoelectric conversion element that converts incident light into a signal charge.

Charge storage FD0 is formed as, for example, a floating diffusion layer, and holds the signal charge generated by photodiode PD. In the same FIGURE, the storage capacitive element of charge storage FD0 is denoted as C0.

Amplification transistor SF1 outputs a pixel signal corresponding to the signal charge in charge storage FD0 to vertical signal line 19B via selection transistor SEL_RS.

Reset transistor RS resets charge storage FD0.

Selection transistor SEL_RS is a switching element that selects whether or not to output the pixel signal from amplification transistor SF1 to vertical signal line 19B.

The pixel signal has at least two types, a reset component and a signal component.

Negative feedback circuit 4a will be described later.

Second Configuration Example of the Solid-State Imaging Apparatus

Next, the second configuration example will be given. The second configuration example is a configuration including the above-described storage circuit in the horizontal direction.

The second configuration example of solid-state imaging apparatus 100 includes pixel circuit 3b and negative feedback circuit 4c connected to pixel circuit 3b that are illustrated in FIG. 14.

The second configuration example illustrated in FIG. 14 differs from the first configuration example illustrated in FIG. 1A in regard to the circuit configuration of pixel circuit 3b and negative feedback circuit 4c. The following description will focus on this point of difference.

Pixel circuit 3b differs from pixel circuit 3a in that the positions of first storage capacitive element C1, first gain control transistor GC1, second storage capacitive element C2, and second gain control transistor GC2 are added in the horizontal direction in terms of charge transfer.

Reset transistor RS can perform three different resets depending on how first gain control transistor GC1 and second gain control transistor GC2 are controlled. Stated differently, reset transistor RS can reset charge storage FD0, first charge storage FD1, and second charge storage FD2.

The charge that overflows at charge storage FD0 when transfer transistor TG is on is transferred to and held by first storage capacitive element C1, as shown by dotted arrow line A in the same FIGURE.

First gain control transistor GC1 is a transistor that controls the connection between charge storage FD0 and first storage capacitive element C1. First gain control transistor GC1 takes on and off states as a switching element.

The signal charge that overflows from photodiode PD during exposure is transferred to and held by second storage capacitive element C2, as shown by dotted arrow line B in the same FIGURE. Overflow element OF is provided between photodiode PD and second storage capacitive element C2. The signal charge that overflows from photodiode PD is transferred to second storage capacitive element C2 via overflow element OF, instead of being transferred to first storage capacitive element C1 via transfer transistor TG.

Furthermore, the signal charge that overflows from second storage capacitive element C2 is discharged to the power supply via second gain control transistors GC2 and reset transistor RS.

The second configuration example of pixel circuit 3b can reduce the effect of the dark current component in charge storage FD0 since the signal charge that overflows from photodiode PD is stored in storage capacitive element C2 without passing through charge storage FD0, as shown by dotted arrow line B. Providing overflow element OF makes it possible to control the level of overflow and the depth of the charge channel, thereby reducing the effect of the dark current component generated in the surface layer.

Second gain control transistor GC2 is a gain control transistor that controls the connection between first storage capacitive element C1 and second storage capacitive element C2. Second gain control transistor GC2 takes on and off states as a switching element.

In the second configuration example of solid-state imaging apparatus 100 illustrated in FIG. 14, solid-state imaging apparatus 100 includes overflow storage circuits for holding the signal charge that overflows from photodiode PD. A single storage circuit is made up of a switching element and a storage capacitive element. The first stage storage circuit is made up of first gain control transistor GC1 and first storage capacitive element C1. The second stage storage circuit is made up of second gain control transistor GC2 and second storage capacitive element C2.

Negative feedback circuit 4c will be described later. With this second configuration example, it possible to achieve both dynamic range extension and S/N improvement.

Third Configuration Example of the Solid-State Imaging Apparatus

Next, the third configuration example will be given. The third configuration example is a configuration including two stages (m=2) of the storage circuits connected in the vertical direction.

FIG. 15 illustrates, as the third configuration example, one of the plurality of pixel circuits 3c arranged in a matrix in solid-state imaging apparatus 100 illustrated in FIG. 3, and negative feedback circuit 4c connected to pixel circuit 3c.

The third configuration example illustrated in FIG. 15 differs from the second configuration example illustrated in FIG. 14 in regard to pixel circuit 3b. Negative feedback circuit 4c is the same. The following description will focus on this point of difference.

The same FIGURE illustrates one of the plurality of pixel circuits 3c arranged in a matrix. Pixel circuit 3c includes photodiode PD, transfer transistor TG, charge storage FD0, transfer transistor TG, amplification transistor SF1, reset transistor RS, first storage capacitive element C1, first gain control transistor GC1, second storage capacitive element C2, second gain control transistor GC2, and selection transistor SEL_RS.

Photodiode PD is a photoelectric conversion element that converts incident light into a signal charge. The signal charge that overflows from photodiode PD during exposure is transferred to and held by first storage capacitive element C1, as shown by dotted arrow line D in the same FIGURE. The signal charge that overflows at first storage capacitive element C1 is further transferred to and held by second storage capacitive element C2.

Charge storage FD0 is formed as, for example, a floating diffusion layer, and holds the signal charge generated by photodiode PD. In the same FIGURE, the storage capacitive element of charge storage FD0 is denoted as C0.

Amplification transistor SF1 outputs a pixel signal corresponding to the signal charge in charge storage FD0 to vertical signal line 19B via selection transistor SEL_RS.

Reset transistor RS resets charge storage FD0. More specifically, reset transistor RS can perform three different resets depending on how first gain control transistor GC1 and second gain control transistor GC2 are controlled. Stated differently, reset transistor RS can reset charge storage FD0, first charge storage FD1, and second charge storage FD2.

First storage capacitive element C1 holds the signal charge that overflows from photodiode PD. For example, first storage capacitive element C1 stores the signal charge that overflows from photodiode PD during exposure via transfer transistor TG and first gain control transistor GC1.

First gain control transistor GC1 is a transistor that controls the connection between charge storage FD0 and first storage capacitive element C1. First gain control transistor GC1 takes on and off states as a switching element. Note that during exposure, a gate voltage of transfer transistor TG and a gate voltage of first gain control transistor GC1 need not be completely off and may be set so as to enable a signal charge that overflows from photodiode PD to be transferred from transfer transistor TG to first storage capacitive element C1 via charge storage FD0 and first gain control transistor GC1.

Second storage capacitive element C2 holds the signal charge that overflows from first storage capacitive element C1. For example, second storage capacitive element C2 stores the signal charge that overflows from first storage capacitive element C1 via second gain control transistor GC2.

Second gain control transistor GC2 is a gain control transistor that controls the connection between first storage capacitive element C1 and second storage capacitive element C2. Second gain control transistor GC2 takes on and off states as a switching element. Note that during exposure, a gate voltage of second gain control transistor GC2 need not be completely off and may be set so as to enable a signal charge that overflows from first storage capacitive element C1 to be transferred to second storage capacitive element C2 via second gain control transistor GC2.

Negative feedback circuit 4c will be described later.

With this second configuration example as well, it possible to achieve both dynamic range extension and S/N improvement.

Configuration Example of the Negative Feedback Circuit of the Solid-State Imaging Apparatus Negative feedback circuit 4a and negative feedback circuit 4c pertaining to the above first through third configuration examples will be described. In addition, negative feedback circuits 4b and 4d will also be described.

Regarding negative feedback circuit 4a and negative feedback circuit 4c, one feedback amplifier FA is provided for each sample and hold circuit 10a, sample and hold circuit 10b, and sample and hold circuit 10c corresponding one-to-one to pixel circuit 3a, pixel circuit 3b, and pixel circuit 3c, respectively. The same is true for feedback amplifier FA in negative feedback circuit 4b. Alternatively, regarding negative feedback circuit 4d, one feedback amplifier FA is provided for the plurality of sample and hold circuits 10 (SH circuits 10a, 10b, and 10c) that correspond one-to-one to the plurality of pixel circuits 3a, the plurality of pixel circuits 3b, or the plurality of pixel circuits 3c.

Hereafter, as necessary, sample and hold circuits 10a, 10b, and 10c may be collectively referred to as sample and hold circuit 10. Similarly, as necessary, negative feedback circuits 4a, 4b, 4c, and 4d may be collectively referred to as negative feedback circuit 4.

In negative feedback circuit 4, the output of amplification transistor SF1 of the pixel circuit is input to the positive input terminal of feedback amplifier FA. The output signal of sample and hold circuit 10 is negatively fed back to sample and hold circuit 10 via feedback line 17A. The output signal of sample and hold circuit 10 is input to the negative input terminal of feedback amplifier FA via feedback line 17B and amplification transistor SF2. Feedback amplifier FA operates so that the difference in voltage between the output of amplification transistor SF1 and the output of amplification transistor SF2 (amplification transistor SF3) converges to zero.

Here, when negative feedback circuit 4 is applying negative feedback, selection transistor SEL_GS is always on by selection control signal φSEL_GS, which electrically connects the source of amplification transistor SF2 (amplification transistor SF3) and vertical signal line 19A. Similarly, selection transistor SEL_RS is always on by selection control signal φSEL_RS, which electrically connects the source of amplification transistor SF1 and vertical signal line 19B.

When the signal of the sample and hold capacitive element C of negative feedback circuit 4 is read out by vertical signal line 19A and AD processed by column AD circuit 25, SEL_GS is placed in the on state by selection control signal φSEL_GS.

In the first to third configuration examples described above, for example, the following operations are performed: imaging a low-illuminance frame, imaging a high-illuminance frame, imaging a composite of a low-illuminance frame and a high-illuminance frame, and imaging a composite of a low-illuminance frame, a medium-illuminance frame, and a high-illuminance frame.

Here, a low-illuminance frame is, for example, a frame that is imaged with all storage circuits turned off, and is suitable for low-illuminance environments. A high-illuminance frame is, for example, a frame that is imaged with all storage circuits turned on, and is suitable for high illuminance environments. A medium-illuminance frame is, for example, a frame that is imaged with some of the storage circuits turned on, and is suitable for medium-illuminance environments. Note that high illuminance, medium illuminance, and low illuminance do not refer to absolute illuminances, but rather relative illuminances.

In low-illuminance frame imaging, the signal component signal is read out by negative feedback circuit 4 from the signal charge fully transferred from photodiode PD to charge storage FD0 as a result of imaging the plurality of storage circuits in the off state. The reset component and signal component signals are transitioned from on to off by applying a gradually sloped signal to control signal φSH of each sample and hold switching element (SH) of sample and hold circuit 10 in negative feedback circuit 4, and by negative feedback through feedback amplifier FA, the kTC noise of the sample and hold capacitive elements can be reduced and the signal can be held.

Similarly, in medium-illuminance frame imaging, by imaging the first stage storage circuit (GC1) in the on state, the signal charge fully transferred from photodiode PD to charge storage FD0 is mixed with the charge of the first stage storage capacitance (GC1), and the signal component signal is read out by negative feedback circuit 4. The reset component and signal component signals are transitioned from on to off by applying a gradually sloped signal to control signal φSH of each sample and hold switching element (SH) of sample and hold circuit 10 in negative feedback circuit 4, and by negative feedback through feedback amplifier FA, the kTC noise of the sample and hold capacitive elements can be reduced and the signal can be held.

Similarly, in high-illuminance frame imaging, by imaging the first stage storage circuit (GC1) and the second storage circuit (GC2) in the on state, the signal charge fully transferred from photodiode PD to charge storage FD0 is mixed with the charge of the first stage storage capacitance (GC1) and the second stage storage capacitance (GC2), and the signal component signal is read out by negative feedback circuit 4. The reset component and signal component signals are transitioned from on to off by applying a gradually sloped signal to control signal φSH of each sample and hold switching element (SH) of sample and hold circuit 10 in negative feedback circuit 4, and by negative feedback through feedback amplifier FA, the kTC noise of the sample and hold capacitive elements can be reduced and the signal can be held.

The signals of each sample and hold capacitive element are read out via a rolling method row by row by readout selection switching element control signal φSE, and only the signal level is extracted after CDS (=signal component—reset component) processing by the ADC circuit.

This makes it possible to further extend the dynamic range by combining the signal components read out in the low-illuminance region with the signal components read out in the high-illuminance region, or by selectively reading out the appropriate frames according to the illuminance.

According to this method, only the signal charge transferred from photodiode PD to charge storage FD0 is used in low-illuminance frame imaging, which allows the gain in the pixel, i.e., the gain to convert the signal charge into a voltage by amplification transistor SF, to be higher, and the voltage (pixel signal) corresponding to the amount of light received can be increased relative to noise generated by amplification transistor SF and the analog circuit. Furthermore, the kTC noise generated during sample and hold of pixel signals can be reduced by negative feedback circuit 4. In other words, for dark subjects, this enables the output of high-quality images with a high signal to noise ratio (S/N).

On the other hand, in medium-illuminance frame and high-illuminance frame imaging, a plurality or all of the storage circuits are used to lower the intra-pixel gain, thereby extending the dynamic range and enabling high-illuminance light reception. Furthermore, negative feedback circuit 4 can improve S/N. Stated differently, for bright subjects, the camera accurately reproduces tones according to the subject, enabling output of images with no whitewash.

Furthermore, since the three frames—the high-illuminance exposure, the medium-illuminance exposure, and the high-illuminance exposure frames—for achieving a wide dynamic range (WDR) can be generated by the exact same pixels at the exact same time, false color, coloring, and blurring can be eliminated.

The technique of reducing kTC noise generated during sample and hold of pixel signals by negative feedback circuit 4 can be deployed not only as a global-shutter imaging apparatus, but also as a time of flight (TOF) distance-measuring apparatus. Of course, the technique can be expanded to a rolling shutter method in addition to the global shutter method.

Note that by, for example, including a plurality of photodiodes PD with different sensitivities in pixel circuit 3 and increasing the number of storage capacitive elements, the number of pixel signals can be further increased by combining these signal charges. This increases the number of WDR frames and thus further extends the dynamic range.

In general, it is very difficult to use highly saturated pixels, but the technique according to the present embodiment allows the saturation level to be extended with the limited capacitance of photodiode PD. To expand the storage capacitance in the storage circuit, the voltage amplitude between the capacitor terminals may be expanded, and to expand the capacitance surface area in a limited number of pixel cells, a three-dimensional or multi-layered semiconductor chip that constitutes the solid-state imaging apparatus may be implemented.

For example, the storage capacitive elements of the storage circuits may be placed on the semiconductor chip including the pixels or on the semiconductor chip including the logic circuits. Even when placed on the semiconductor chip including the pixels, the storage capacitive elements may be formed in the top layer or the bottom layer of the metal layers.

As described in the above overview, the solid-state imaging apparatus according to one aspect of the present disclosure includes pixel circuit 3 and negative feedback circuit 4. Pixel circuit 3 includes photodiode PD, charge storage FD0, transfer transistor TG that transfers the signal charge generated in photodiode PD to charge storage FD0, amplification transistor SF1 that outputs a pixel signal corresponding to the signal charge of charge storage FD0, reset transistor RS that resets charge storage FD0, first storage capacitive element C1, first gain control transistor GC1 that controls the connectivity of charge storage FD0 and first storage capacitive element C1, and second gain control transistor GC2 that controls the connectivity of first storage capacitive element C1 and second storage capacitive element C2. Negative feedback circuit 4 includes sample and hold circuit 10 and feedback amplifier FA. The output signal of pixel circuit 3 is input into the positive input terminal of feedback amplifier FA via amplification transistor SF1. The output of feedback amplifier FA is negatively fed back to sample and hold circuit 10, and input into the negative input terminal of feedback amplifier FA via amplification transistor SF2 (amplification transistor SF3). With this configuration, kTC noise can be reduced during sample and hold of one or more pixel signals.

As described in the above overview, a solid-state imaging apparatus according to one aspect of present disclosure includes pixel circuit 3 that outputs a pixel signal and negative feedback circuit 4. Negative feedback circuit 4 includes sample and hold circuit 10 that samples and holds the pixel signal, and feedback amplifier FA that negatively feeds back, to SH circuit 10, a feedback signal according to a difference between the pixel signal from pixel circuit 3 and an output signal from SH circuit 10.

With this configuration, kTC noise generated in SH circuit can be inhibited by applying negative feedback, which improves image quality in low illuminance and extends the dynamic range.

Here, SH circuit 10 may include: SH subcircuit 10*u* that samples and holds the pixel signal; and amplification transistor SF2 that amplifies and outputs, to feedback amplifier FA, an output signal of SH subcircuit 10*u*. SH subcircuit 10*u* may include: first sample and hold switching element SH for sampling the feedback signal; and first sample and hold capacitive element C connected to first sample and hold switching element SH. The pixel signal from pixel circuit 3 may be input into a positive input terminal of feedback amplifier FA. The feedback signal from feedback amplifier FA may be input into first sample and hold switching element SH. The output signal from amplification transistor SF2 may be input into a negative input terminal of feedback amplifier FA. Feedback amplifier FA, SH subcircuit 10*u*, and amplification transistor SF2 may form a feedback loop.

With this configuration, in one or more pixel signals, the voltage levels of the pixel signal and each of the sample and hold capacitive elements C can be matched, and furthermore, kTC noise generated in SH circuit 10 can be inhibited by applying negative feedback. This in turn improves image quality in low illuminance and extends the dynamic range.

Here, the SH subcircuit may include a first readout selection switching element that connects the first sample and hold capacitive element and the amplification transistor.

With this, compared to a configuration that does not include the first readout selection switching element, influence from parasitic capacitance of the wiring can be inhibited in the SH subcircuit. For example, the time it takes for the feedback loop to stabilize in the sampling operation can be reduced.

Here, negative feedback circuit 4 may include: feedback capacitive element CS connected to, among two terminals of first sample and hold switching element SH, a terminal into which the feedback signal is input; and attenuator capacitive element CC connected in parallel to first sample and hold switching element SH.

This can further inhibit kTC noise generated in SH circuit 10. This in turn improves image quality in low illuminance and extends the dynamic range.

Here, pixel circuit 3 may output a plurality of the pixel signals, and sample and hold circuit 10 includes a plurality of SH subcircuits 10*u* corresponding to the plurality of pixel signals.

With this, in a plurality of pixel signals at a plurality of illuminance gains, kTC noise that generates in SH circuit 10 can be inhibited by implementing negative feedback. Accordingly, image quality in pixel signals in low illuminance can be improved and pixel signals at a plurality of illuminance gains can be generated, making it possible to easily extend the dynamic range.

Here, the plurality of pixel signals may include a first pixel signal, a second pixel signal, and a third pixel signal with mutually different exposure sensitivities, and the plurality of SH subcircuits may include a first SH subcircuit, a second SH subcircuit, and a third SH subcircuit.

With this, for example, in the low-illuminance high conversion gain (HCG) first pixel signal, the medium-illuminance middle conversion gain (MCG) second pixel signal, and the high-illuminance low conversion gain (LCG) third pixel signal, kTC noise that generates in SH circuit 10 can be inhibited by implementing negative feedback. Accordingly image quality in the low-illuminance first pixel signal can be improved, and these three signals can be combined to easily extend the dynamic range.

Here, by connecting the first sample and hold capacitive elements in two or more SH subcircuits among the plurality of SH subcircuits in parallel, corresponding pixel signals among the plurality of pixel signals may be mixed. Here, the solid-state imaging apparatus may include a plurality of pixel circuits 3 and a plurality of SH circuits 10, and the feedback amplifier (FA) may be shared by two or more of the plurality of SH circuits (10).

With this, a single feedback amplifier FA is shared by a plurality of sample and hold circuits, and negative feedback can be implemented. This makes the layout surface area efficient and particularly effective for smaller pixel circuits.

Here, the pixel signal includes a reset component and a signal component. SH subcircuit 10*u* includes: first sample and hold switching element SH; first sample and hold capacitive element C; a second sample and hold switching element for sampling the feedback signal; and a second sample and hold capacitive element connected to the second sample and hold switching element. First sample and hold capacitive element C holds the reset component, and the second sample and hold capacitive element (C) holds the signal component.

With this, even if the characteristics of the solid-state imaging apparatus (for example, threshold Vt of amplification transistor SF2, process, temperature, and voltage conditions) vary, the CDS can cancel the variation by subtracting the reset component from the signal component to obtain the correct pixel signal.

Here, the SH subcircuit may include: a first readout selection switching element that connects the first sample and hold capacitive element and the amplification transistor, and a second readout selection switching element that connects the second sample and hold capacitive element and the amplification transistor.

With this, compared to a configuration that does not include the first readout selection switching element, influence from parasitic capacitance of the wiring can be inhibited in the SH subcircuit. For example, the time it takes for the feedback loop to stabilize in the sampling operation can be reduced.

Here, the plurality of pixel circuits 3 may be arranged in a matrix, the plurality of SH circuits 10 may be arranged in a matrix, the plurality of pixel circuits 3 and the plurality of SH circuits 10 may be arranged in a one-to-one stacked arrangement, and in plan view, feedback amplifier FA may be interposed between the plurality of SH circuits 10.

This shortens the readout distance from the pixel circuits 3 to the SH circuits 10 that correspond one-to-one. Moreover, the negative feedback load from feedback amplifier FA to SH circuit 10 is approximately equal on both the left and right sides, making the kTC noise reduction effect approximately equal and eliminating the regular fixed component of noise.

Here, first sample and hold switching element SH may transition from on to off according to a control signal including a sloped voltage waveform.

With this, the turn-off operation by the control signals of sample and hold switching elements SH in negative feedback circuit 4 that includes a sloped voltage waveform can further inhibit generation of kTC noise.

Here, negative feedback circuit 4 may include, in the feedback loop, third sample and hold switching element SH10 inserted between an output terminal of feedback amplifier FA and an input terminal of first sample and hold switching element SH. Third sample and hold switching element SH10 may transition from on to off according to a control signal including a sloped voltage waveform.

With this, the turn-off operation by the control signal of sample and hold switching element SH10 in negative feedback circuit 4 that includes a sloped voltage waveform can further inhibit generation of kTC noise.

Here, negative feedback circuit 4 may include: measurement unit 6 configured to measure a noise level of first sample and hold capacitive element C in SH circuit 10; and a determination unit configured to determine an incline of the sloped voltage waveform that decreases the measured noise level.

This makes it possible to adequately inhibit kTC noise level even when the characteristics of sample and hold circuit 10 and the control signal of sample and hold switching element SH vary.

Here, the negative feedback circuit may include a switching circuit (SW11, SH10) that switches between implementing and not implementing negative feedback in a sample and hold operation, and among the plurality of pixel signals, negative feedback may be implemented for at least one pixel signal and not implemented for other pixel signals.

With this, when reading pixel signals from pixel circuit 3 to negative feedback circuit 4, for example, since kTC noise can be reduced because negative feedback is applied to at least pixel signal 1 (HCG), low-illuminance noise can be improved. Furthermore, if negative feedback is not applied to pixel signal 2 (MCG) or pixel signal 3 (LCG), speed can also be increased, and thus both characteristics can be achieved.

Here, feedback amplifier FA may include a gain switching function, and in negative feedback circuit 4, a gain of the feedback amplifier may be set per pixel signal among the plurality of pixel signals.

With this, when reading pixel signals from pixel circuit 3 to negative feedback circuit 4, for example, since kTC noise can be greatly reduced because negative feedback is applied to at least pixel signal 1 (HCG) while the gain of feedback amplifier FA is high, low-illuminance noise can be improved. Furthermore, since negative feedback is applied to pixel signal 2 (MCG) or pixel signal 3 (LCG) with a low gain of feedback amplifier FA, although kTC noise cannot be significantly reduced, convergence time can be made faster, and thus both characteristics can be achieved.

Here, a capacitance value of first sample and hold capacitive element C may vary among the plurality of SH subcircuits 10u according to a corresponding pixel signal among the plurality of pixel signals.

With this, when reading pixel signals to pixel circuit 3c, for example, if the capacitance value of pixel signal 1 (HCG) is made to be the largest, kTC noise can be reduced the most compared to pixel signal 2 (MCG) and pixel signal 3 (LCG), thus improving low-illuminance noise.

Here, pixel circuit 3 may include output transistor SF1 that outputs the pixel signal, and a size of amplification transistor SF2 is greater than a size of output transistor SF1.

This reduces device noise generated when signals are read out from negative feedback circuit 4 via amplification transistor SF2.

Here, the plurality of pixel circuits 3 may be exposed using a global shutter method or a rolling shutter method, the plurality of pixel circuits 3 may simultaneously output pixel signals for all pixels to the plurality of SH circuits 10, and the plurality of SH circuits 10 may perform readout using a rolling method.

With this, the system can be provided in an imaging apparatus and in a distance-measuring imaging apparatus that capture subjects with a wide dynamic range and without distortion or blurring between each of the pixel signals (HCG, MCG, and LCG).

Here, the solid-state imaging apparatus may include a plurality of semiconductor chips bonded together, any of the plurality of semiconductor chips may include the plurality of pixel circuits 3, and any other of the plurality of semiconductor chips may include the plurality of SH circuits 10.

With this, for example, feedback amplifier FA can be mounted on a separate chip from the plurality of sample switching elements (SH) and sample and hold capacitive elements (C) that are shared, thus reducing the number of shared elements. The readout time from pixel circuit 3 to negative feedback circuit 4 can thus be accelerated, which is favorable for pixel characteristics and optical characteristics. This is particularly more effective in microcells.

An imaging apparatus according to one aspect of the present disclosure includes: the solid-state imaging apparatus described above that captures an image of a subject; an imaging optical system that guides incident light from the subject to the solid-state imaging apparatus; and a signal processor that processes an output signal from the solid-state imaging apparatus.

A distance-measuring imaging apparatus according to one aspect of the present disclosure includes: the solid-state imaging apparatus described above that captures reflected light from a target irradiated with pulsed light; an imaging optical system that guides the reflected light from the target to the solid-state imaging apparatus; and a signal processor that processes an output signal from the solid-state imaging apparatus.

Hereinafter, a solid-state imaging apparatus according to embodiments for implementing the present disclosure will be described with reference to the drawings.

Embodiment 1A

First, an example of a configuration of the solid-state imaging apparatus according to the present embodiment will be given. In Embodiment 1A, a configuration example in which the intra-pixel gain in pixel circuit 3a in the first configuration example illustrated in FIG. 1A is a single gain is described in detail.

Solid-State Imaging Apparatus 100 Configuration Example

FIG. 3 is a block diagram illustrating an example of a configuration of solid-state imaging apparatus 100 according to Embodiment 1A.

Solid-state imaging apparatus 100 illustrated in the same figure includes pixel array 1, horizontal scanning circuit 12, vertical scanning circuit 14, a plurality of vertical signal lines 19A, timing controller 20, column processor 26, reference ramp signal generator 27, output circuit 28, and signal processors 70 and 80. Solid-state imaging apparatus 100 further includes a MCLK terminal that receives an input of a master clock signal from an external component, a DATA terminal for transmitting and receiving a command or data to and from an external component, and a D1 terminal for transmitting video data to an external component, and still further includes other sorts of terminals to which power supply voltage and ground voltage are supplied.

Pixel array 1 includes a plurality of pixel circuits 3a arranged in a matrix. In FIG. 3, the plurality of pixel circuits 3 are arranged in n rows and m columns.

Horizontal scanning circuit 12 outputs AD converted pixel signals to signal processors 70 and 80 via a horizontal signal line by sequentially scanning memories 256 in the plurality of column AD circuits 25. This scanning may be performed in the order of alignment of column AD circuits 25.

Vertical scanning circuit 14 scans, row by row, horizontal scan line groups (also referred to as a "row control line groups") provided per row of pixel circuits 3 in pixel array 1. With this, vertical scanning circuit 14 selects pixel circuits 3a row by row, and concurrently outputs pixel signals from pixel circuits 3a belonging to the selected row to m vertical signal lines 19. The number of horizontal scan line groups 15 provided is the same as the number of pixel circuits 3 provided.

In FIG. 3, n horizontal scan line groups 15 (V1, V2, . . . , and Vn) are provided for pixel circuits 3a, and each includes reset control signal φRS, readout control signal φTG, and selection control line φSEL_RS.

Moreover, n horizontal scan line groups 16 (VSH1, VSH2, . . . , and VSHn) are provided for negative feedback circuits 4a, and each includes sample and hold control signal φSH, readout selection switching element control signal φSE, and selection control line φSEL_GS that constitute the corresponding sample and hold circuit 10.

Vertical signal line 19A is provided in negative feedback circuit 4, and transmits pixel signals from pixel circuits 3 belonging to the selected row to column AD circuit 25. In FIG. 3, there are m vertical signal lines 19A (H1, . . . , Hm). Moreover, there are m ADC input lines (ADIN1, . . . , ADINm).

Sloped signal generator 30 determines the slope of sample and hold switch control signal φSH and, if necessary, the slope of readout selection switching element control signal φSE for each of negative feedback circuits 4a to generate an optimal sloped signal to reduce kTC noise.

Vertical scanning circuit 14 supplies the output signal supplied from sloped signal generator 30 as sample and hold switching control signals φSH (SH1, SH2, . . . , and SHn) and, if necessary, readout selection switching element control signals φSE (SE1, SE2, . . . , and SEn) of negative feedback circuits 4 via horizontal scan line groups 16 (VSHn) based on control signal group CN1.

Timing controller 20 controls the entire solid-state imaging apparatus 100 by generating various groups of control signals. The various groups of control signals include control signal groups CN1, CN2, CN4, CN5, and CN8, and counter clock signals CK0 and CK1. For example, timing controller 20 receives master clock MCLK via a terminal, generates various internal clocks, and controls horizontal scanning circuit 12 and vertical scanning circuit 14 and the like.

Column processor 26 includes a column AD circuit 25 for each column. Each column AD circuit 25 AD converts pixel signals from vertical signal line 19A.

Each column AD circuit 25 includes voltage comparator 252, counter 254, and memory 256.

Voltage comparator 252 compares an analog pixel signal from vertical signal line 19A and reference signal RAMP that is generated by reference ramp signal generator 27 and includes a ramp waveform (i.e., a triangular wave), and, for example, when the former exceeds the latter, inverts an output signal indicating the comparison result.

Counter 254 counts time from a start of a change in the triangular wave of reference signal RAMP until the output signal from voltage comparator 252 is inverted. Since the time until the inversion is defined according to the value of an analog pixel signal, the count value is a value of a digitized pixel signal.

Memory 256 holds count values of counter 254, i.e., digital pixel signals.

Reference ramp signal generator 27 generates reference signal RAMP including a triangular wave, and outputs reference signal RAMP to the positive input terminal of voltage comparator 252 in each column AD circuit 25.

Output circuit 28 outputs digital pixel signals to video data terminal D1.

Signal processor 70 includes WDR circuit 76, and consists of memory 77, low-illuminance signal circuit 71, medium-illuminance signal circuit 72, high-illuminance signal circuit 73, and WDR circuit 76.

Signal processor 80 detects the kTC noise in the kTC noise detection area using noise calculation circuit 86 and holds the optimal value of the noise in optimal value holding circuit 87. The kTC noise detection area is, for example, the OB area. The OB area is the area that includes the optical black pixels. As soon as the search in the kTC noise detection area is completed, signal processor 80 sends the optimal value to the timing control circuit, and sloped signal generator 30 reads out the signal at the optimal slope voltage.

With this, signal processor 70 and signal processor 80 both extend the dynamic range and improve S/N.

Vertical scanning circuit 14, reference ramp signal generator 27, and sloped signal generator 30 may collectively be referred to as a drive unit. Column processor 26 and horizontal scanning circuit 12 may collectively be referred to as a control unit. Noise calculation circuit 86 may be referred to as a measurement unit. Optimal value holding circuit 87 may be referred to as a determination unit.

Pixel Circuit Configuration Example

Next, an example of a configuration of pixel circuit 3a will be described.

FIG. 1A illustrates a circuit example of pixel circuit 3a according to Embodiment 1A. Pixel circuit 3a illustrated in the same FIGURE includes photodiode PD, transfer transistor TG, storage capacitive element C0, charge storage FD0, reset transistor RS, first gain control transistor GC1, amplification transistor SF1, and selection transistor SEL_RS.

Horizontal scan line group 15 (Vn) includes reset control signal φRS, readout control signal φTG, first gain control signal φGC1, second gain control signal φGC2, and selection control line φSEL_RS.

Horizontal scan line group 16 (VSHn) includes sample and hold switch control signal φSH, readout selection switching element control signal φSE, and selection control line φSEL_GS.

Photodiode PD is a photoelectric conversion element, such as a photodiode, that performs photoelectric conversion at a given sensitivity, that is to say, generates a charge according to the amount of light received.

Moreover, storage capacitive element C0 connected to charge storage FD0 holds a signal charge (for example, electrons) transferred from photodiode PD, converts the held signal charge into voltage, and supplies the voltage resulting from the conversion to the gate of amplification transistor SF1. Practically speaking, the capacitance of charge storage FD0 is not only the capacitance of charge storage FD0 itself, but also includes the gate capacitance of amplification transistor SF, the gate-drain capacitance of amplification transistor SF, and the floating capacitance of the gate-drain capacitance.

The transfer transistor (TG) is a switching transistor that turns on and off according to readout control signal φTG. When readout control signal φTG is high-level, transfer transistor TG transfers the signal charge resulting from photoelectric conversion by photodiode PD to charge storage FD0.

Reset transistor RS is a switching transistor that turns on and off according to reset control signal φRS. When reset control signal φRS is high-level, reset transistor RS sets the power supply voltage applied to the drain in charge storage FD0.

Amplification transistor SF1 forms a source follower paired together with load current supply P1 connected to vertical signal line 19B, and outputs the voltage of the gate, that is to say, the voltage of charge storage FD0 to vertical signal line 19B as an analog pixel signal.

Selection transistor SEL_RS is a switching transistor that turns on and off according to selection control signal φSEL_RS. Selection transistor SEL_RS electrically connects the source of amplification transistor SF1 and vertical signal line 19B when selection control signal φSEL_RS is high-level.

Figure 1B:
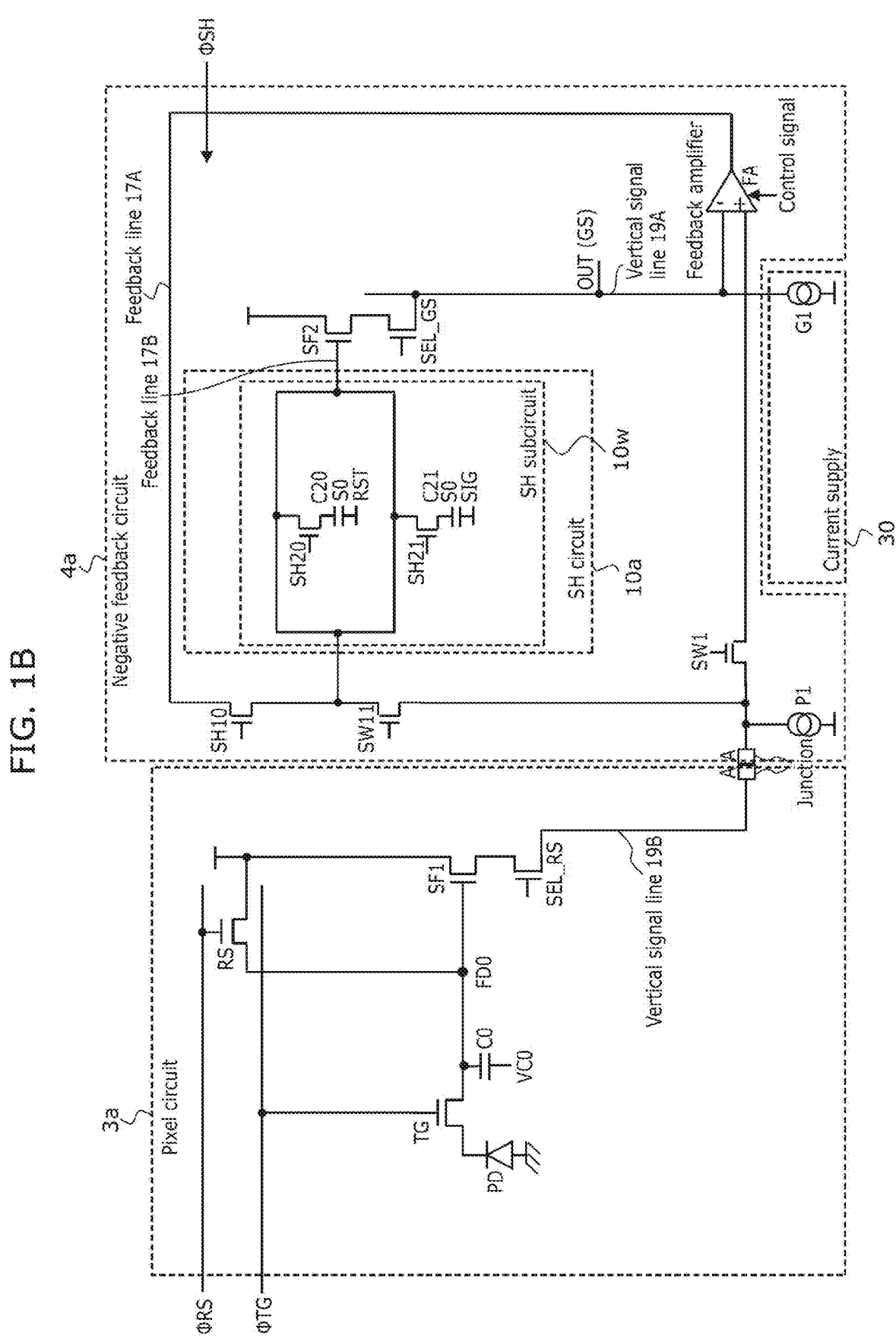
FIG. 1B illustrates another circuit example of a pixel circuit and a negative feedback circuit according to Embodiment 1A.
Figure 4:
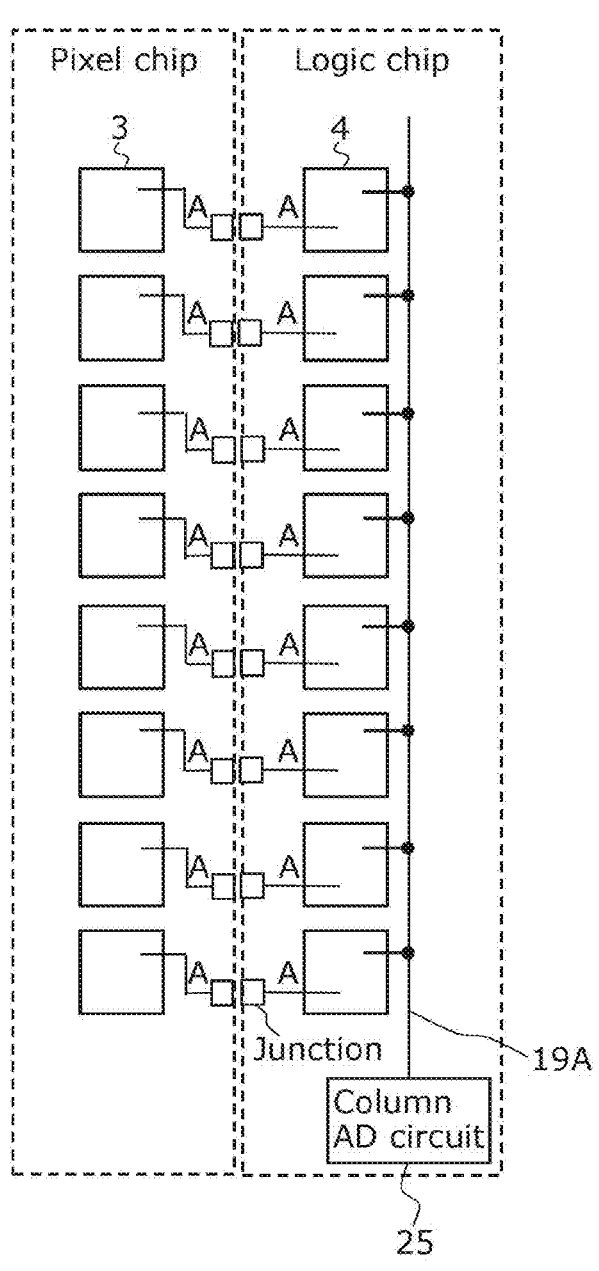
FIG. 4 illustrates an example of a junction between a pixel circuit and a negative feedback circuit according to Embodiments 1A, 1B, 2A, 2B, and 4.

FIG. 4 illustrates the junctions of the pixel chips and logic chips illustrated in FIG. 1A, FIG. 1B, and FIG. 2. Pixel circuit 3 is joined to negative feedback circuit 4 pixel by pixel and signals are input pixel by pixel. The signal of negative feedback circuit 4 is read out through vertical signal line 19A. The number of vertical signal lines may be increased and the number of readout signals of the pixel signals may be increased to increase speed.

HCG Readout Operation Example

Next, the high conversion gain (HCG) readout operation in solid-state imaging apparatus 100 including pixel circuit 3a and negative feedback circuit 4a that is illustrated in FIG. 1A will be described. The HCG readout operation uses only charge storage FD0 to store the signal charge and increases the conversion gain of amplification transistor SF1. Hence, the HCG operation is a high-sensitivity imaging operation, suitable for imaging in low-illuminance environments.

In correlated double sampling (CDS) in the HCG readout operation from negative feedback circuit 4a, the signal level is read out after the kTC noise of the analog pixel signal is read out. In CDS, the difference between the kTC noise and the signal level is taken.

Configuration and Operation Examples of Negative Feedback Circuit

For high illuminance, signal charge is stored in photodiode PD of the pixel circuit, while for low illuminance, kTC noise can be reduced by negative feedback circuit 4a to achieve low noise. This extends the dynamic range. Typically, kTC noise is generated in the sample and hold capacitive elements (C20 and C21) when sample and hold is performed by control signal φSH of the sample and hold switching elements (SH20 and SH21).

As a measure for this, the output of amplification transistor SF1 of the pixel circuit is input to the positive input terminal of feedback amplifier FA. Sample and hold circuit 10a includes sample and hold capacitive elements (C20 and C21), sample and hold switching elements (SH20 and SH21), and the readout selection switching elements (SE26 and SE27), is connected to feedback line 17B, and inputs to the gate of amplification transistor SF2. The output of amplification transistor SF2 is connected to the negative input terminal of the feedback amplifier, and feedback line 17A, which is the output signal of the feedback, is connected to the input terminal of the sample and hold switching elements (SH20 and SH21) to provide negative feedback.

As a result, the sample and hold capacitive elements (C20 and C21) hold a noise-reduced signal equal to the pixel signal level.

Control signal φSH input to the sample and hold switching elements (SH20 and SH21) has a sloped voltage waveform that gradually transitions it from on to off. Hereinafter, signals with a sloped voltage waveform are referred to as sloped signals.

Figure 7:
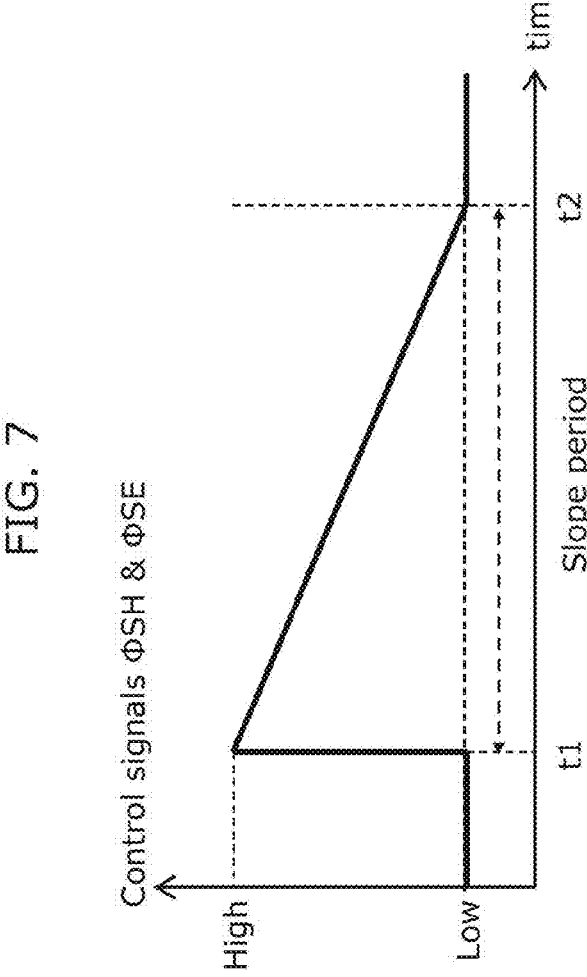
FIG. 7 illustrates the waveform of a sloped signal of a sample and hold switch control signal ($\varphi$SH) and a readout selection switching element control signal ($\varphi$SE).
Figure 8:
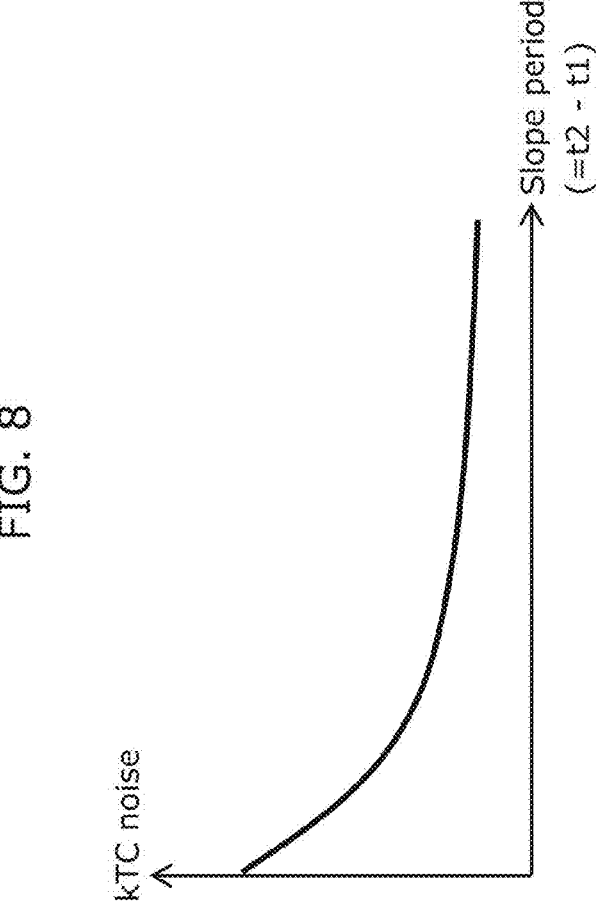
FIG. 8 illustrates the relationship between the slope period and kTC noise level.
Figure 9:
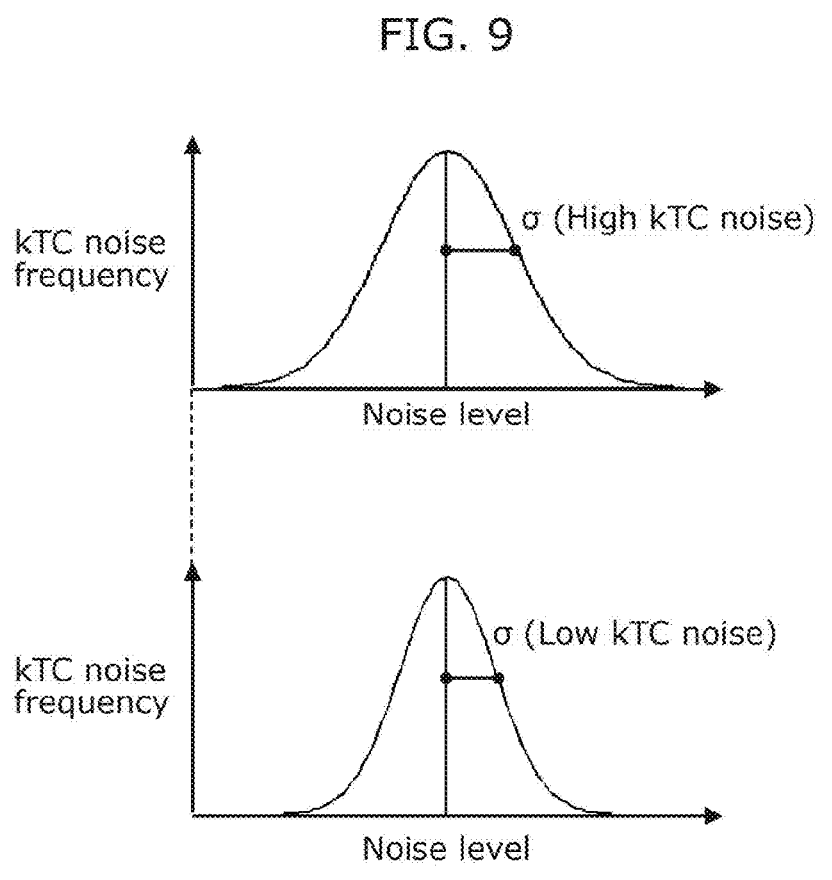

FIG. 7 illustrates the waveform of the sloped signal. As illustrated in FIG. 7, the control voltage of the sample and hold capacitive element changes gradually as a sloped signal. FIG. 8 illustrates the relationship between the slope period and the noise level of the sample and hold capacitive element. As illustrated in FIG. 8 and FIG. 9, the kTC noise is an asymptote while negative feedback is applied, as the input voltage at one end of the feedback amplifier asymptotically approaches the output voltage of amplification transistor SF1 of pixel circuit 3. As both electric potentials come closer together, the rate of change of the voltage in the sample and hold capacitive elements (C20 and C21) decreases. When both electric potentials are equal, the electric potential of the sample and hold capacitive elements (C20 and C21) are fixed.

Lastly, the operation can be completed turning off feedback amplifier FA.

The sample and hold capacitive element (C20) holds the signal of the reset component (RST component) of the HCG. On the other hand, the sample and hold capacitive element (C21) holds the signal of the signal component (SIG component) of the HCG.

Moreover, by canceling variations by subtracting the reset component from the signal component via CDS, the kTC noise can be reduced and the signal can be extracted with good S/N.

Here, the product of bandwidth B and gain G of feedback amplifier FA is constant. If gain G is set high, kTC noise can be reduced efficiently, but bandwidth B becomes narrower and convergence time is relatively slow. However, if convergence is achieved in a short time (wide bandwidth B), gain G becomes low and kTC noise cannot be reduced efficiently.

The bandwidth of feedback amplifier FA is preferably wider than the bandwidth of the pixel portion, in which case the high-frequency component of the kTC noise can be canceled efficiently.

As described above, in the present embodiment, the dynamic range can be extended by improving low illuminance by reducing kTC noise.

Selection transistor SEL_GS is a switching transistor that turns on and off according to selection control signal φSEL_GS. Selection transistor SEL_GS electrically connects the source of amplification transistor SF2 and vertical signal line 19A when selection control signal φSEL_GS is high-level.

Photodiode PD is exposed for the duration of the exposure period using a global shutter method or a rolling shutter method. The amount of charge generated by the exposure is denoted as Q0.

In the global shutter method, the global reset is performed simultaneously for all pixels to start exposure, and the exposure time is represented by T_Q0. Next, the charge from the photodiode is read out simultaneously to the sample and hold capacitive elements (C20 and C21). Thereafter, the signal charges of the sample and hold capacitive elements (C20 and C21) are read out from vertical signal line A row by row using the rolling method.

In the rolling shutter method, all pixels are scanned per selected row to start exposure, and the exposure time is represented by T_Q0. Next, the readout of charge from the photodiode is performed for the row selected by scanning row by row to the sample and hold capacitive elements (C20 and C21). Thereafter, the signal charge of the sample and hold capacitive elements (C20 and C21) is read out from vertical signal line 19A row by row using the rolling method.

Figure 5:
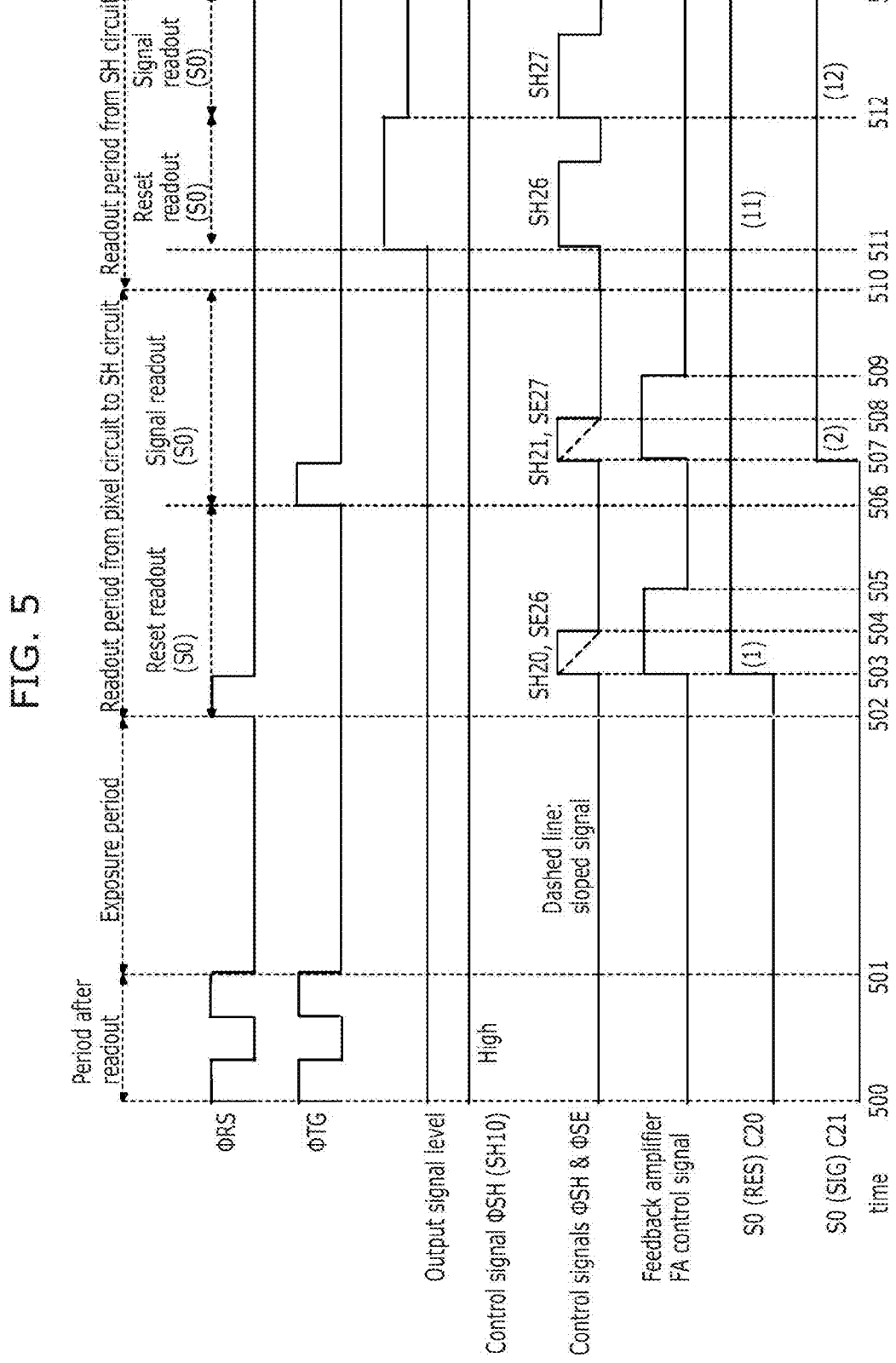
FIG. 5 illustrates a period of readout from a pixel circuit to a sample and hold circuit and timings of readout from the sample and hold circuit according to Embodiment 1A.

FIG. 5 illustrates an example of the timing of the signal readout operation.

First, at time t500, photodiode PD and charge storage FD0 are reset, and the system waits for the exposure to start. Then, at time t501, the shutter operates to start the exposure. The exposure time ends at time t502.

Next, at time t502, RS is turned on, FD0 is reset, and the reset component readout period begins. At time t506, TG is turned on and the signal charge stored in the photodiode is transferred to FD0 by the transfer signal (TG), and the signal component readout period begins.

First, the sample and hold capacitive elements (C20 and C21) are connected to feedback line 17A and feedback line 17B by turning on control signals φSH of the sample and hold switching elements (SH20 and SH21) and control signals φSE of the readout selection switching elements (SE26 and SE27) at the respective times t503 and t507. As a result, the output signal of pixel circuit 3a is negatively returned to the sample and hold capacitive elements (C20 and C21).

Here, sample and hold switching element SH10 is always on in negative feedback circuit 4a. Moreover, switching element SW1 is always on and switching element SW11 is always off.

In negative feedback circuit 4a, address selection is performed by control signals φSH of the sample and hold switching elements (SH20 and SH21) and control signals φSE of the readout selection switching elements (SE26 and SE27), a signal is sampled and held with respect to one of the plurality of sample and hold capacitive elements (C20 and C21) shared by feedback amplifier FA to reduce noise, and this operation is repeated.

First, by the sample and hold switching elements (SH20 and SH21) and the readout selection switching elements (SE26 and SE27) turned on at the respective times t503 and t507, the signals of the sample and hold capacitive elements (C20 and C21) are supplied to the negative input terminal of feedback amplifier FA through amplification transistor SF2. Here, the output voltage of the above sample and hold capacitive elements (C20 and C21) through amplification transistor SF2 operates to converge with the output signal of pixel circuit 3 through amplification transistor SF1 that is applied to the positive input terminal of feedback amplifier FA.

Next, at the respective times t504 and t508, kTC noise is generated by turning off control signals φSH of the sample and hold switching elements (SH20 and SH21). kTC noise is thus added to the voltages of the sample and hold capacitive elements (C20 and C21) after reset. While feedback amplifier FA is operating and the output thereof is connected to feedback line 17A (until times t505 and t509), the negative feedback circuit remains formed. Therefore, the kTC noise caused by turning off control signals φSH of the sample and hold switching elements (SH20 and SH21) at the respective times t504 and t508 is reduced to a magnitude of $1/(1+A)$, where A represents the gain of feedback amplifier FA.

Although kTC noise is generated at the node of the gate of amplification transistor SF2 by turning off control signals φSE of the readout selection switching elements (SE26 and SE27), this parasitic capacitance is sufficiently small compared to that of the sample and hold capacitive elements (C20 and C21) and is thus negligible. This can be seen from the fact that the charge of kTC noise is expressed as $\sqrt{(kTC)(C)}$.

For the above reasons, readout selection switching element control signal φSE may be turned off with a sloped or rectangular signal in coordination with the corresponding sample and hold switch control signal φSH or after the corresponding sample and hold switch control signal φSH.

Feedback amplifier FA may be in constant operation during the readout period from pixel circuit 3a to sample and hold circuit 10a (from time t502 to t510).

The above operation causes the voltage through amplification transistor SF2 just before turning off control signals φSH of the sample and hold switching elements (SH20 and SH21) (just before the start of noise reduction) to converge to a level approximately equal to the voltage through amplification transistor SF2 of the pixel signal applied to the positive input terminal of feedback amplifier FA.

Typically, since the product of gain G and bandwidth B (i.e., G×B) of the amplifiers that make up feedback amplifier FA is constant, increasing gain G causes bandwidth B to narrow (results in a lower cut-off frequency). In other words, convergence in feedback amplifier FA takes time. Conversely, decreasing gain G causes bandwidth B to widen (results in a higher cut-off frequency). In other words, it reduces the time for convergence in feedback amplifier FA.

The noise level and convergence time must therefore be taken into account when determining the gain of feedback amplifier FA.

In this way, according to an embodiment of the present disclosure, it is possible to reduce kTC noise generated due to turning off control signals φSH of the sample and hold switching elements (SH20 and SH21) and cancel generated kTC noise in a relatively short amount of time.

In this example, the reset component of the HCG (signal for RST) is held in the sample and hold capacitive elements (C20 and C21), and the signal component of the HCG (signal for SIG) is held in sample and hold capacitive element C21.

Next, the reset component (sample and hold capacitive element C20) is read out and transferred through amplification transistor SF2 by turning on control signal φSE of readout selection switching element SE26 at time t511, and the signal component (sample and hold capacitive element C21) is read out and transferred through amplification transistor SF2 by turning on control signal φSE of readout selection switching element SE27 at time t512.

Here, if there is variation ΔV1 in amplification transistor SF1, ΔV1 is added to the signal level of sample and hold capacitive element C20 for the signal component and the signal level of sample and hold capacitive element C21 for the reset component, but the CDS in the AD conversion circuit subtracts the reset component from the signal component, so the variation is canceled.

Here, if there is variation ΔV2 in amplification transistor SF2, ΔV2 is reduced from the signal level of sample and hold capacitive element C20 for the signal component and the signal level of sample and hold capacitive element C21 for the reset component, but the CDS in the AD conversion circuit subtracts the reset component from the signal component, so the variation is canceled in the same way as described above.

Here, when sample and hold switching elements SH20 and SH21 are turned OFF, coupling ΔV3 is superimposed on sample and hold capacitive elements C20 for the signal component and on sample and hold capacitive element C21 for the reset component due to parasitic capacitance values Cgs of the sample and hold switching elements and the sample and hold capacitance values, but the CDS in the AD conversion circuit subtracts the reset component from the signal component, so ΔV3 is canceled in the same way as described above.

The negative feedback operation reduces the noise to a magnitude of 1/(1+A), but the noise slightly remains. Since the CDS in the AD conversion circuit subtracts the reset component from the signal component, the total noise is given by the average of the squares of the noise generated by sample and hold capacitive element C20 for the signal component and sample and hold capacitive element C21 for the reset component, but it is slight.

In the conventional technique described above (PTL 1), there is no negative feedback circuit, so kTC noise is generated when the sample and hold switch is turned off, which worsens the low-illuminance noise and narrows the dynamic range.

In the present embodiment, kTC noise can be significantly reduced since the sample and hold switch is turned off while the negative feedback circuit is applied to the reset and signal components of the pixel. Since the CDS in the AD conversion circuit subtracts the reset component from the signal component, circuit variations such as in the circuits of amplification transistor SF1 and amplification transistor SF2 are canceled. This results in reduced low-illuminance noise and an extended dynamic range.

In addition, since negative feedback circuit 4a according to the present embodiment includes only two sample and hold capacitive elements (C20 and C21), the readout time from pixel circuit 3a to negative feedback circuit 4a (the time from t502 to t510) is short, i.e., the amount of time that the signal is held in FD0 is short, negative feedback circuit 4a is less affected by the dark current in FD0 and by parasitic sensitivity, and both characteristics are favorable.

In sample and hold circuit 10a of negative feedback circuit 4a according to the present embodiment, the output terminals of the sample and hold switching elements (SH20 and SH21) are connected to the respective sample and hold capacitive elements (C20 and C21) and the respective readout selection switching elements (SE26 and SE27). The output terminals of the sample and hold switching elements (SH20 and SH21) are connected to the node of the gate of amplification transistor SF2 via the respective readout selection switching elements (SE26 and SE27). Note that sample and hold circuit 10a is not limited to this configuration, and may have the configuration illustrated in FIG. 1B that includes SH subcircuit 10w. SH subcircuit 10w differs from SH subcircuit 10u in FIG. 1A in that the readout selection switching elements (SE26 and SE27) are removed and new connection wiring is added to the input terminals of the sample and hold switching elements (SH20 and SH21). The new connection wiring connects the input terminals (which also act as output terminals) of the sample and hold switching elements (SH20 and SH21) to the node of the gate of amplification transistor SF2.

Stated differently, the input terminals (doubling as output terminals) of the sample and hold switching elements (SH20 and SH21) are directly connected to the node connecting sample and hold switching element SH10 and switching element SW11 and the node of the gate of amplification transistor SF2. The other terminal of the sample and hold switching element (SH20) is connected to the sample and hold capacitive elements (C20 and C21) as in FIG. 1A. As a result, the sample and hold switching elements (SH20 and SH21) illustrated in FIG. 1B serve the functions of the sample and hold switching elements (SH20 and SH21) as well as the functions of the readout selection switching elements (SE26 and SE27) illustrated in FIG. 1A.

In this configuration, in the operation and timing diagram of negative feedback circuit 4, the timing of readout selection switching element control signals φSE (SE26 and SE27 in this example) should be read as the timing of sample and hold switch control signals φSH (SH20 and SH21 in this example). When reading out the signals of the sample and hold capacitive elements (C20 and C21), sample and hold switching element SH10 and switching element SW11 must be turned off. Here, the parasitic capacitance value of the wiring in the floating state is negligible compared to the capacitance values of the sample and hold capacitive elements (C20 and C21), and does not affect the holding voltage of the sample and hold capacitive elements (C20 and C21).

This configuration has the advantage of reduced surface area due to a reduced number of elements and simplified control signals due to a reduced number of control signals.

In sample and hold circuit 10a of negative feedback circuit 4a according to the present embodiment, the output terminals of the sample and hold switching elements (SH20 and SH21) are connected to the respective sample and hold capacitive elements (C20 and C21) and the respective readout selection switching elements (SE26 and SE27), and to the node of the gate of a single amplification transistor SF2, but a configuration in which the readout selection switching elements (SE26 and SE27) are removed, the output terminal of a sample and hold switching element (SH20) is connected to sample and hold capacitive element (C20) and the node of the gate of amplification transistor SF2, and the output terminal of a sample and hold switching element (SH21) is connected to sample and hold capacitive element (C21) and the node of the gate of third amplification transistor SF3 is also acceptable.

Although vertical signal line 19A is conventionally provided on the pixel chip and not susceptible to noise, in the present embodiment, it may be susceptible to noise because it passes through the analog circuitry of the logic chip.

Therefore, in the logic chip, the power supply or GND wiring layer may be placed in the layer above or below the wiring layer of vertical signal line 19A to serve as an electromagnetic shield.

Amplification transistor SF2 of negative feedback circuit 4 has device noise (thermal noise, 1/f noise, RTS noise), etc. To inhibit this noise, it is effective to make the transistor surface area as large as possible in order to reduce device noise, and it is preferable to make the transistor surface area larger than that of amplification transistor SF2 of pixel circuit 3.

The sample and hold capacitors are MIM and MOS capacitors, which require low-leakage and high-density capacitance characteristics, and a light-shielding layer is required at the substrate contact area to inhibit parasitic sensitivity.

Circuit Example of Sloped Signal as Control Signal for Switching Element

The present embodiment includes photodiode PD, a transfer transistor (TG), and negative feedback circuit 4a. Negative feedback circuit 4a includes sample and hold switching elements (SH20 and SH21), sample and hold capacitive elements (C20 and C21), amplification transistor SF2, and feedback amplifier FA. The present embodiment also includes readout selection switching elements (SE26 and SE27).

Sample and hold switch control signal φSH and, if necessary, readout selection switching element control signal φSE are supplied via horizontal scan line group 16 (VSHn).

Control signals φSH of these sample and hold switching elements (SH20 and SH21) are turned off by applying a gradually sloped signal when the sample and hold is turned off, as described above, so that negative feedback circuit 4a operates effectively and kTC noise is reduced. For example, FIG. 7 illustrates how this sloped signal gradually transitions to an off state during the slope period. FIG. 8 illustrates the relationship between this slope period and kTC noise level. This shows that the noise level drops rapidly in the beginning of the slope period, but after some time, the noise level gradually decreases.

The issue here is variations arising from processing, power supply voltage, and temperature of the switching elements. Variations due to processing can be fixed to the optimal value in outgoing inspection. On the other hand, variations due to power supply voltage and temperature vary with actual operating conditions and must be compensated for during operation.

FIG. 3 illustrates a circuit as a measure to address this. Sloped signal generator 30 has a built-in DAC circuit, and first generates sloped signal using clock CK1 and control signal CN5 transmitted from timing controller 20. The sloped signal is configured so that when reading the noise components in the kTC noise detection area (OB area of FIG. 3), the signal is in a predetermined area read by control signal CN5 and the incline of the slope is determined by clock CK1.

FIG. 9 illustrates the variation (standard deviation) in the kTC noise in a predetermined area. The readout signal in the kTC noise detection area (OB area) is normally distributed in FIG. 9 for each predetermined area by noise calculation circuit 86 in signal processor 80, the a (standard deviation) of the noise signal is calculated, and the most optimal incline setting is held in optimal value holding circuit 87.

Here, the optimal value is the value when the signal readout in the kTC noise detection area is at its minimum.

The determination of the incline of the sample and hold switching elements (SH20 and SH21) may be performed for a predetermined area or for different areas. Moreover, the determination may be performed a plurality of times.

For each row of pixel circuits in the kTC noise detection area as a predetermined area, signal processor 80 measures the kTC noise while varying the incline of the voltage waveform, calculates the variation σ (standard deviation), and determines the optimal incline of the voltage waveform based on the variation per row of pixel circuits in the predetermined area.

Operation Example of Sloped Signal as Control Signal for Switching Element

In the present embodiment, the OB area is used to generate the sloped signal.

FIG. 10 is a flowchart showing an example of a process for generating a sloped signal of sample and hold switch control signal φSH. First, scanning of the first line of one frame is started in <S1>, and the signals in the OB area are read out in <S2>. The sloped signal is initialized and control signals φSH of the sample and hold switching elements and readout selection switching element control signals φSE in the predetermined area are generated in <S3>. The standard deviation a of the kTC noise of the sample and hold switches in the predetermined area are calculated in <S4>. Here, this may be performed for the predetermined area or for a different area. Moreover, the determination may be performed a plurality of times. The incline of the sloped signal is changed in <S5>. The operations in <S4> and <S5> are repeated to select the incline of the sloped signal with the minimum noise level a as the optimal value in <S6>. The signal of effective area 7 is controlled using control signal φSH and control signal φSE in <S7>. Here, the incline of the sloped signal expresses the incline and time width of the amplitude level.

Moreover, increasing the analog gain when detecting kTC noise increase the accuracy of the kTC noise detection, enabling stable detection.

Thus, the present embodiment can reduce kTC noise in the sample and hold capacitive elements, and can thus improve the low illuminance noise and extend the dynamic range.

Configuration Example of Stacked Structure BSI of Pixel Circuit and Negative Feedback Circuit In particular, when the pixel cells are reduced in size, this can be achieved by providing the sample and hold capacitive elements (for example, MIM and/or MOM capacitor) of SH circuit of negative feedback circuit 4 on the wiring layer side of the logic chip side, thereby increasing the underlying surface area of negative feedback circuit 4.

Figure 11:
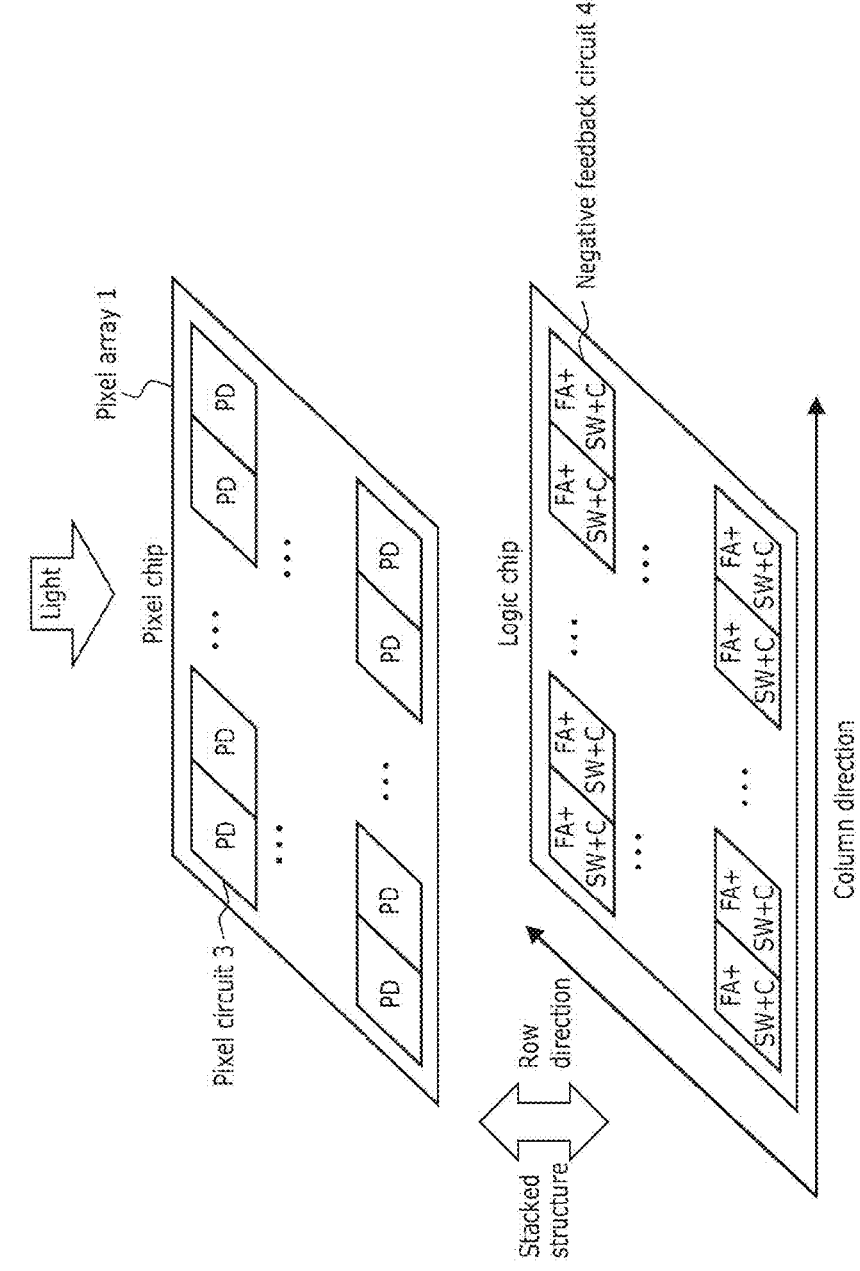
FIG. 11 illustrates an example of the solid-state imaging apparatus according to Embodiments 1A, 1B, 2A, 2B, and 4 configured as a stacked-structure back-side illumination image sensor.
Figure 12:
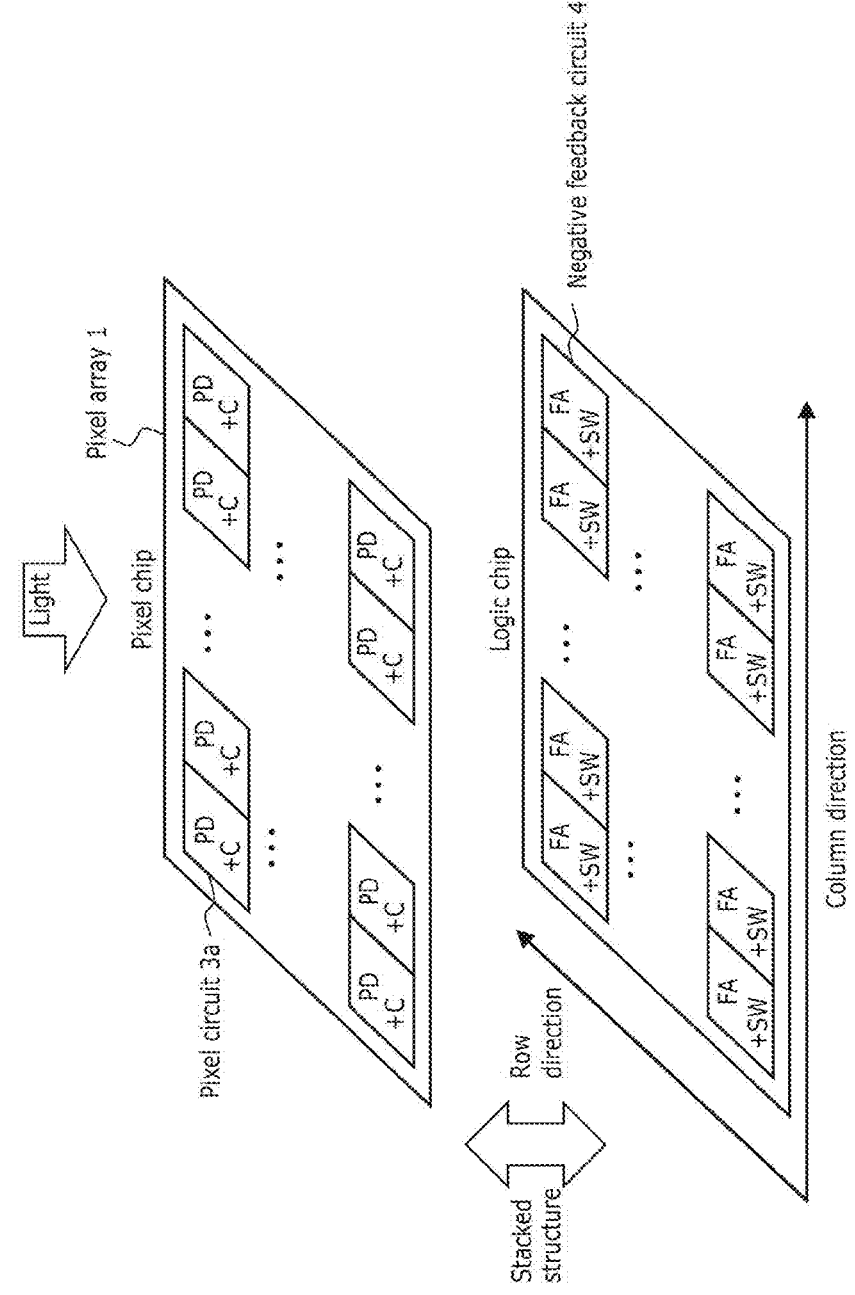
FIG. 12 illustrates an example of the solid-state imaging apparatus according to Embodiments 1A, 1B, 2A, 2B, and 4 configured as a stacked-structure back-side illumination image sensor.

FIG. 11, FIG. 12, and FIG. 13 illustrate examples of the solid-state imaging apparatus according to Embodiment 1A configured as a stacked-structure back-side illumination image sensor. The solid-state imaging apparatus in these FIGS. includes a first semiconductor chip and a second semiconductor chip that are bonded together or a plurality of semiconductor chips. The first semiconductor chip and the second semiconductor chip are bonded to each other on their respective wiring-layer-side surfaces. In the FIGURES, PD indicates photodiode PD, C indicates the first sample and hold capacitive element, FA indicates the feedback amplifier, and SW indicates the sample and hold switching element and the readout selection switching element.

The first semiconductor chip is labeled as the pixel chip in these FIGURES, and includes the main part of solid-state imaging apparatus 100 as a back-side illumination CMOS image sensor. This first semiconductor chip includes photodiode PD of each pixel circuit 3.

The second semiconductor chip and the third semiconductor chip are labeled as logic chip A and logic chip B in these FIGURES, and include the main logic circuits, such as signal processors 70 and 80, for example. The second semiconductor chip includes feedback amplifier FA of negative feedback circuit 4, sample and hold switching element SH and readout selection switching element SE, and sample and hold capacitor C.

In such a solid-state imaging apparatus 100, each pixel is mounted on the pixel chip as a stacked structure BSI type CIS, and negative feedback circuits 4 respectively corresponding to the pixels are mounted on the logic chip. Stated differently, the PD can be provided per pixel circuit 3 on the pixel chip, and negative feedback circuit 4 can be provided per pixel on the logic chip, whereby negative feedback can be applied, so parasitic resistance and parasitic capacitance can be relatively reduced to increase speed, which reduces high frequency noise and reduces kTC noise. Specifically, the pixel chip and the logic chip may include connection point A illustrated in FIG. 1A, FIG. 1B, and FIG. 4.

FIG. 11 illustrates an example of a solid-state imaging apparatus according to Embodiment 1A configured as a stacked-structure back-side illumination image sensor. This is a stacked structure BSI type CIS, with each pixel provided on the pixel chip and negative feedback circuits 4 respectively corresponding to pixel circuits 3 provided on the logic chip. In the pixel chip, photodiode PD is provided for each pixel, and in the logic chip, feedback amplifier FA, sample and hold switching element SH, readout selection switching element SE, and sample and hold capacitive element C are provided for each negative feedback circuit 4. This configuration enables negative feedback to be applied to each pixel thereby increasing speed, which in turn reduces high-frequency noise significantly reduces kTC noise.

FIG. 12 illustrates an example of a solid-state imaging apparatus according to Embodiment 1A configured as a stacked-structure back-side illumination image sensor. This is a stacked structure BSI type CIS, with each pixel provided on the pixel chip and negative feedback circuits 4 respectively corresponding to pixel circuits 3 provided on the logic chip. In the pixel chip, photodiode PD and sample and hold capacitive element C are provided for each pixel, and in the logic chip, feedback amplifier FA, sample and hold switching element SH, and readout selection switching element SE are provided for each negative feedback circuit 4. This configuration enables negative feedback to be applied to each pixel thereby increasing speed, which in turn reduces high-frequency noise significantly reduces kTC noise. Sample and hold capacitive element C may be divided between the pixel chip and the logic chip if the mounting surface area is limited.

FIG. 13 illustrates an example of a solid-state imaging apparatus according to Embodiment 1A configured as a stacked-structure back-side illumination image sensor. This is a stacked structure BSI type CIS, with each pixel provided on the pixel chip and negative feedback circuits 4 respectively corresponding to pixel circuits 3 provided on the logic chip. In the pixel chip, photodiode PD is provided for each pixel, in logic chip A, feedback amplifier FA, sample and hold switching element SH, readout selection switching element SE, and sample and hold capacitive element C are provided for each negative feedback circuit 4, and in logic chip B, feedback amplifier FA is provided for each negative feedback circuit 4. This configuration enables negative feedback to be applied to each pixel thereby increasing speed, which in turn reduces high-frequency noise significantly reduces kTC noise. This configuration is effective for pixel microcells because of the limited mounting surface area.

Embodiment 1B

In Embodiment 1B, a configuration example, in the first configuration example illustrated in FIG. 2, in which feedback capacitive element CS and capacitors (CC20 and CC21) between the sources and drains of the sample and hold switching elements (SH20 and SH21) are included and sample and hold switching element SH10 is controlled will be described in detail. The following description will focus on the points of difference with Embodiment 1A.

In Embodiment 1B, kTC noise can be reduced more and converged faster than in Embodiment 1A, as will be described below.

Configuration and Operation Examples of Negative Feedback Circuit

For high illuminance, signal charge is stored in photodiode PD of the pixel circuit, while for low illuminance, kTC noise can be reduced by negative feedback circuit 4b to achieve low noise. This extends the dynamic range. Typically, kTC noise is generated in the sample and hold capacitive elements (C20 and C21) when sample and hold is performed by control signal φSH of the sample and hold switching elements (SH20 and SH21).

As a measure for this, the output of amplification transistor SF1 of the pixel circuit is input to the positive input terminal of feedback amplifier FA. SH circuit 10b includes sample and hold capacitive elements (C20 and C21), sample and hold switching elements (SH20 and SH21), capacitors (CC20 and CC21) between the sources and drains of the sample and hold switching elements, and the readout selection switching elements (SE26 and SE27), is connected to feedback line 17B, inputs into the gate of amplification transistor SF2, and is connected to the negative input terminal of feedback amplifier FA. Feedback line 17A, which carries the output signal of feedback amplifier FA, is connected to one end of sample and hold switching element SH10, and the other end of sample and hold switching element SH10 is connected to feedback capacitive element CS and the input terminals of the sample and hold switching elements (SH20 and SH21), forming the negative feedback.

As a result, the sample and hold capacitive elements (C20 and C21) hold a noise-reduced signal equal to the pixel signal level.

Control signal φSH input to sample and hold switching element SH10 has a sloped voltage waveform that gradually transitions it from on to off. Hereinafter, signals with a sloped voltage waveform are referred to as sloped signals.

Here, control signal φSH of the sample and hold capacitive element (SH10) illustrated in FIG. 7 is the sloped signal, the relationship between the slope period and the noise level illustrated in FIG. 8, and the kTC noise as illustrated in FIG. 9 are the same as in Embodiment 1A.

The timing regarding the accumulation of charge in photodiode PD in the global shutter method and the rolling shutter method is the same as in Embodiment 1A.

Figure 6:
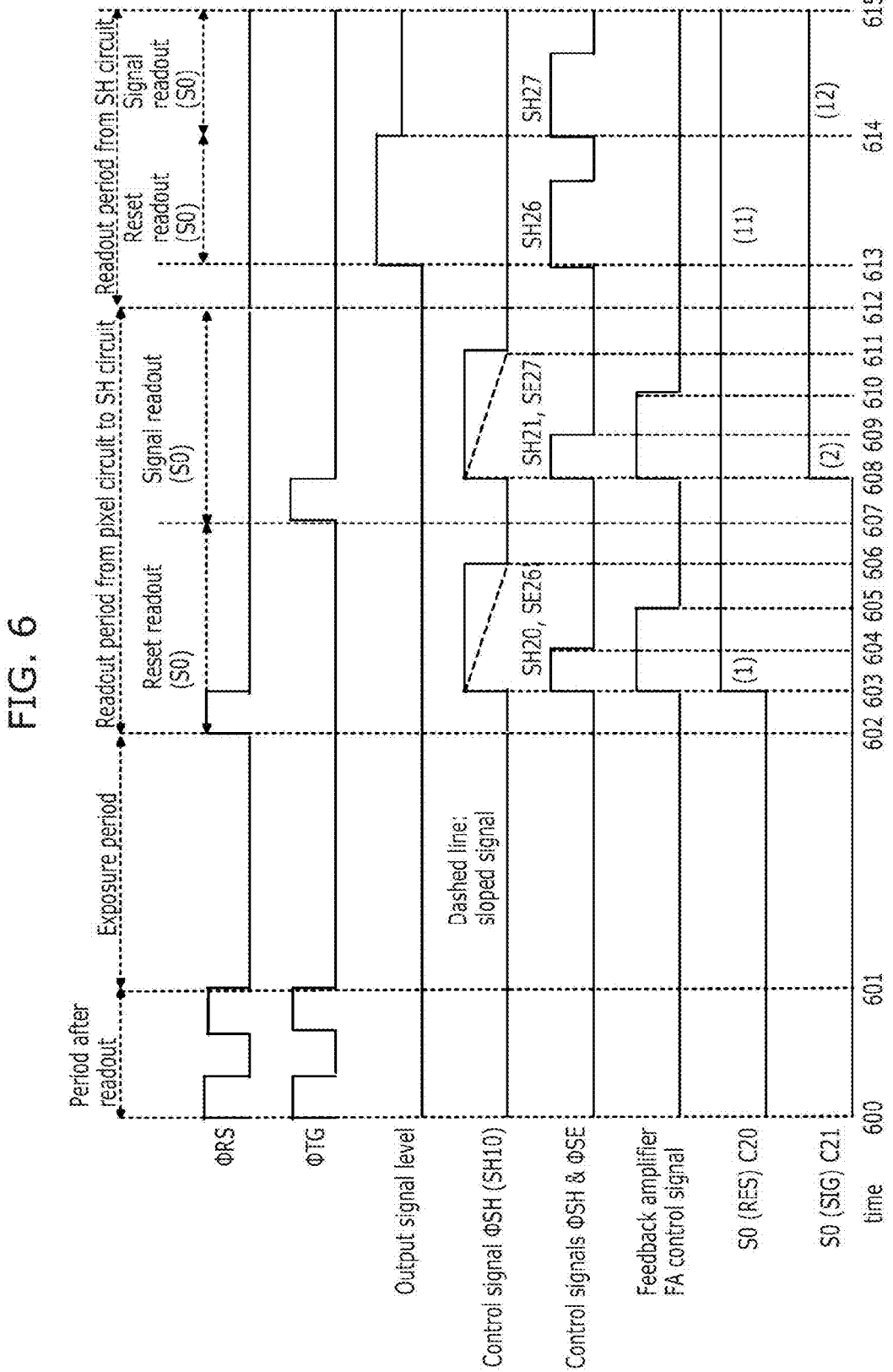
FIG. 6 illustrates a period of readout from a pixel circuit to a sample and hold circuit and timings of readout from the sample and hold circuit according to Embodiment 1B.

FIG. 6 illustrates an example of the timing of the signal readout operation.

First, at time t600, photodiode PD and charge storage FD0 are reset, and the system waits for the exposure to start. Then, at time t601, the shutter operates to start the exposure. The exposure time ends at time t602.

Next, at time t602, RS is turned on, FD0 is reset, and the reset component readout period begins. At time t607, TG is turned on and the signal charge stored in the photodiode is transferred to FD0 by the transfer signal (TG), and the signal component readout period begins.

Here, the configuration of negative feedback circuit 4b will be described with reference to PTL 2 while mentioning the differences.

Negative feedback circuit 4b according to the present embodiment differs from PTL 2 in that while PTL 2 is configured to apply negative feedback only to the reset component (reset transistor) of the pixel signal, negative feedback circuit 4b is configured to apply negative feedback to both the reset component and the signal component, which reduces kTC noise for both signals. Stated differently, if the configuration of PTL 2 were applied as-is to a sample and hold circuit, two negative feedback circuits would be required, one for the reset component and the other for the signal component, but the present embodiment is superior in that it can be realized with a single negative feedback circuit.

Another difference is that a single element each from sample and hold switching element SH10, feedback capacitive element CS, and amplification transistor SF2 is shared with sample and hold switching elements (SH20 and SH21), readout selection switching elements (SE26 and SE27), and sample and hold capacitive elements (C20 and C21) formed as a plurality of pairs to optimize the layout. In negative feedback circuit 4b according to the present embodiment, only two pairs are shared, but more than two pairs is acceptable. The more pairs there are, the greater the layout advantages are.

First, the sample and hold capacitive elements (C20 and C21) are connected to feedback line 17A and feedback line 17B by turning on control signals φSH of the sample and hold switching elements (SH20 and SH21), and control signals φSE of the readout selection switching elements (SE26 and SE27) at the respective times t603 and t608, and control signal φSH of sample and hold switching element (SH10) at both of the times. As a result, the output signal of pixel circuit 3 is negatively returned to the sample and hold capacitive elements (C20 and C21).

Here, switching element SW1 is always on and switching element SW11 is always off.

In negative feedback circuit 4b, address selection is performed by control signals φSH of the sample and hold switching elements (SH20 and SH21) and control signals φSE of the readout selection switching elements (SE26 and SE27), a signal is sampled and held with respect to one of the plurality of sample and hold capacitive elements (C20 and C21) shared by feedback amplifier FA to reduce noise, and this operation is repeated.

First, by sample and hold switching element SH10, the sample and hold switching elements (SH20 and SH21), and the readout selection switching elements (SE26 and SE27) turned on at the respective times t603 and t608, the signals of the sample and hold capacitive elements (C20 and C21) are supplied to the negative input terminal of feedback amplifier FA through amplification transistor SF2. Here, the output voltage of the above sample and hold capacitive elements (C20 and C21) through amplification transistor SF2 operates to converge with the output signal of pixel circuit 3 through amplification transistor SF1 that is applied to the positive input terminal of feedback amplifier FA.

Next, at the respective times t604 and t609, kTC noise is generated by turning off control signals φSH of the sample and hold switching elements (SH20 and SH21). kTC noise is thus added to the voltages of the sample and hold capacitive elements (C20 and C21) after being turned off.

While feedback amplifier FA is operating and the output thereof is connected to feedback line 17A (until times t605 and t610), the negative feedback circuit remains formed. Therefore, the kTC noise caused by turning off control signals φSH of the sample and hold switching elements (SH20 and SH21) at the respective times t604 and t609 is reduced to a magnitude of $1/(1+A)$, where A represents the gain of feedback amplifier FA.

Although kTC noise is generated at the node of the gate of amplification transistor SF2 by turning off control signals φSE of the readout selection switching elements (SE26 and SE27), this parasitic capacitance is sufficiently small compared to that of the sample and hold capacitive elements (C20 and C21) and is thus negligible. This can be seen from the fact that the charge of kTC noise is expressed as $\sqrt{(kTC)(C)}$.

For the above reasons, readout selection switching element control signal φSE may be turned off with a rectangular signal or turned off after sample and hold switch control signal φSH.

The above operation causes the voltage through amplification transistor SF2 just before turning off control signals φSH of the sample and hold switching elements (SH20 and SH21) (just before the start of noise reduction) to converge to a level approximately equal to the voltage through amplification transistor SF2 of the pixel signal applied to the positive input terminal of feedback amplifier FA.

Next, the noise reduction operation during the periods from turning off control signal φSH of sample and hold switching element SH20 to turning off control signal φSH of sample and hold switching element SH10 (times t604 through t606 and times t609 through t611 in FIG. 6) will be described.

Typically, since the product of gain G and bandwidth B (i.e., G×B) of the amplifiers that make up feedback amplifier FA is constant, increasing gain G causes bandwidth B to narrow (results in a lower cut-off frequency). In other words, convergence in feedback amplifier FA takes time.

Conversely, decreasing gain G causes bandwidth B to widen (results in a higher cut-off frequency). In other words, it reduces the time for convergence in feedback amplifier FA.

At times t604 and t609, the gain of feedback amplifier FA is set low in order to prioritize the high speed of convergence. Stated differently, since bandwidth B is set wide, noise can be reduced with priority given to high speed in the early stages of the noise reduction period.

Next, at times t605 and t610, the gain of feedback amplifier FA is set high in order to prioritize noise reduction. This allows for a greater reduction in noise level due to the magnitude of $1/(1+A)$ described above. In this case, bandwidth B is set narrow so that convergence in feedback amplifier FA takes more time. However, during time t604 through t605 and time t609 through t610, since the voltage levels of the sample and hold capacitive elements (C20 and C21) are already controlled near the convergence level, the width of the voltage to be converged is smaller, whereby overall an increase in convergence time due to the narrowing of the bandwidth can be inhibited.

Next, control signal φSH of sample and hold switching element SH10 is turned off (at times t606 and t611), at which time kTC noise is generated. The magnitude of kTC noise added to the sample and hold capacitive elements (C20 and C21) is approximately $(C20/CS)^{1/2} \times (CC20/(CC20+C20))$ times larger than that without sample and hold switching element SH10, feedback capacitive element CS, and capacitor CC20 between the source and drain of the sample and hold switch (here CC20=CC21). Thus, the larger feedback capacitive element CS, the smaller the noise generated, and the smaller the capacitors (CC20 and CC21) between sources and the drains of the sample and hold switching elements (SH20 and SH21), the larger the attenuation rate.

In this way, according to an embodiment of the present disclosure, it is possible to reduce kTC noise generated due to turning off control signals φSH of the sample and hold switching elements (SH20 and SH21) and cancel generated kTC noise in a relatively short amount of time.

By sharing feedback capacitive element CS and appropriately setting the capacitors (CC20 and CC21) between the sources and drains of the sample and hold switches, the kTC noise generated by turning off control signal φSH of sample and hold switching element SH10 can be sufficiently reduced.

In this example, the reset component of the HCG (signal for RST) is held in the sample and hold capacitive elements (C20 and C21), and the signal component of the HCG (signal for SIG) is held in sample and hold capacitive element C21.

Next, the reset component (sample and hold capacitive element C20) is read out and transferred through amplification transistor SF2 by turning on control signal φSE of readout selection switching element SE26 at time t613, and the signal component (sample and hold capacitive element C21) is read out and transferred through amplification transistor SF2 by turning on control signal φSE of readout selection switching element SE27 at time t614.

Then, as described in Embodiment 1A, the variations are canceled since the reset component is subtracted from the signal component by the CDS of the AD conversion circuit.

Embodiment 2A

FIG. 14 illustrates Embodiment 2A. In Embodiment 2A, a second configuration example including one stage of the storage circuits in the horizontal direction in the first configuration example illustrated in FIG. 1A will be described in detail. The following description will focus on the points of difference with Embodiment 1A.

Solid-state imaging apparatus 100 according to Embodiment 2A will be described with a focus on the differences from Embodiment 1A. In one example of a configuration of solid-state imaging apparatus 100, the number of controls Vn for horizontal scan line groups 15 differ, but all other aspects are the same.

In the present embodiment, the charge that overflows from photodiode PD is stored directly in second storage capacitive element C2 without passing through the FD portion or near the surface, thus reducing the dark current component.

Pixel Circuit Configuration Example

Next, an example of a configuration of pixel circuit 3b will be described.

FIG. 14 illustrates a circuit example of pixel circuit 3b and negative feedback circuit 4c according to Embodiment 2A.

Pixel circuit 3b illustrated in the same FIGURE includes a photodiode (PD), transfer transistor TG, overflow element OF, first storage capacitive element C1, second storage capacitive element C2, first gain control transistor GC1, second gain control transistor GC2, charge storage FD0, storage capacitive element C0, charge storage FD1, charge storage FD2, reset transistor RS, amplification transistor SF1, and selection transistor SEL_RS.

Vn of Horizontal scan line group 15 includes reset control signal φRS, readout control signal φTG, overflow control line φOF, and selection control line φSEL_RS.

Photodiode PD is a photoelectric conversion element, such as a photodiode, that performs photoelectric conversion at a given sensitivity, that is to say, generates a charge according to the amount of light received.

Moreover, storage capacitive element C0 connected to charge storage FD0 holds a signal charge (for example, electrons) transferred from photodiode PD, converts the held signal charge into voltage, and supplies the voltage resulting from the conversion to the gate of amplification transistor SF1. Practically speaking, the capacitance of charge storage FD0 is not only the capacitance of charge storage FD0 itself, but also includes the gate capacitance of amplification transistor SF1, the gate-drain capacitance and gate-source capacitance of amplification transistor SF1, and the floating capacitance of the source line of first gain control transistor GC1 when first gain control transistor GC1 is off.

Transfer transistor TG is a switching transistor that turns on and off according to readout control signal φTG. When readout control signal φTG is high-level, transfer transistor TG transfers the signal charge resulting from photoelectric conversion by photodiode PD to charge storage FD0.

First gain control transistor GC1 is a switching transistor that turns on and off according to readout control signal φGC1. Second gain control transistor GC2 transfers the signal charge stored in second storage capacitive element C2 to charge storage FD0 when readout control signal φGC2 is high-level.

Even if overflow gate OF is always off according to readout control signal φOF, the signal charge resulting from photoelectric conversion by photodiode PD is transferred to second storage capacitive element C2 via overflow gate OF. Alternatively, as an overflow gate/switching transistor that turns on and off according to readout control signal φOF, the signal charge resulting from photoelectric conversion by photodiode PD can be transferred to second storage capacitive element C2 via overflow gate OF when readout control signal φOF is high-level.

Second storage capacitive element C2 changes to the conversion gain at which the signal charge in charge storage FD0 is converted into voltage. In other words, in the transferring of the signal charge from photodiode PD to charge storage FD0, the conversion gain of charge storage FD0 can be increased further to C0 if second gain control transistor GC2 is turned off. Conversely, if second gain control transistor GC2 is turned on, charge storages FD0 and FD1 are connected and the conversion gain can be lowered to C0+C1+C2 to allow more signal charge to be stored.

Reset transistor RS is a switching transistor that turns on and off according to reset control signal φRS. Reset transistor RS can reset charge storage FD0, charge storage FD1, and charge storage FD2 by making reset control signal φRS high-level.

Amplification transistor SF1 forms a source follower paired together with load current supply P1 connected to vertical signal line 19B, and outputs the voltage of the gate, that is to say, the voltage of charge storage FD0 to vertical signal line 19B as an analog pixel signal.

Selection transistor SEL_RS is a switching transistor that turns on and off according to selection control signal φSEL_RS. Selection transistor SEL_RS electrically connects the source of amplification transistor SF1 and vertical signal line 19B when selection control signal φSEL_RS is high-level.

Here, low-illuminance exposure is exposure for low illuminance and the intra-pixel gain is set high (HCG), medium-illuminance exposure is exposure for medium illuminance and the intra-pixel gain is set to medium (MCG), and high-illuminance exposure is exposure for high illuminance and the intra-pixel gain is set low (LCG).

HCG, MCG, and LCG Readout Operation Example

First, the high conversion gain (HCG), middle conversion gain (MCG), and low conversion gain (LCG) readout operations in solid-state imaging apparatus 100 illustrated in FIG. 3 will be explained.

Figure 17:
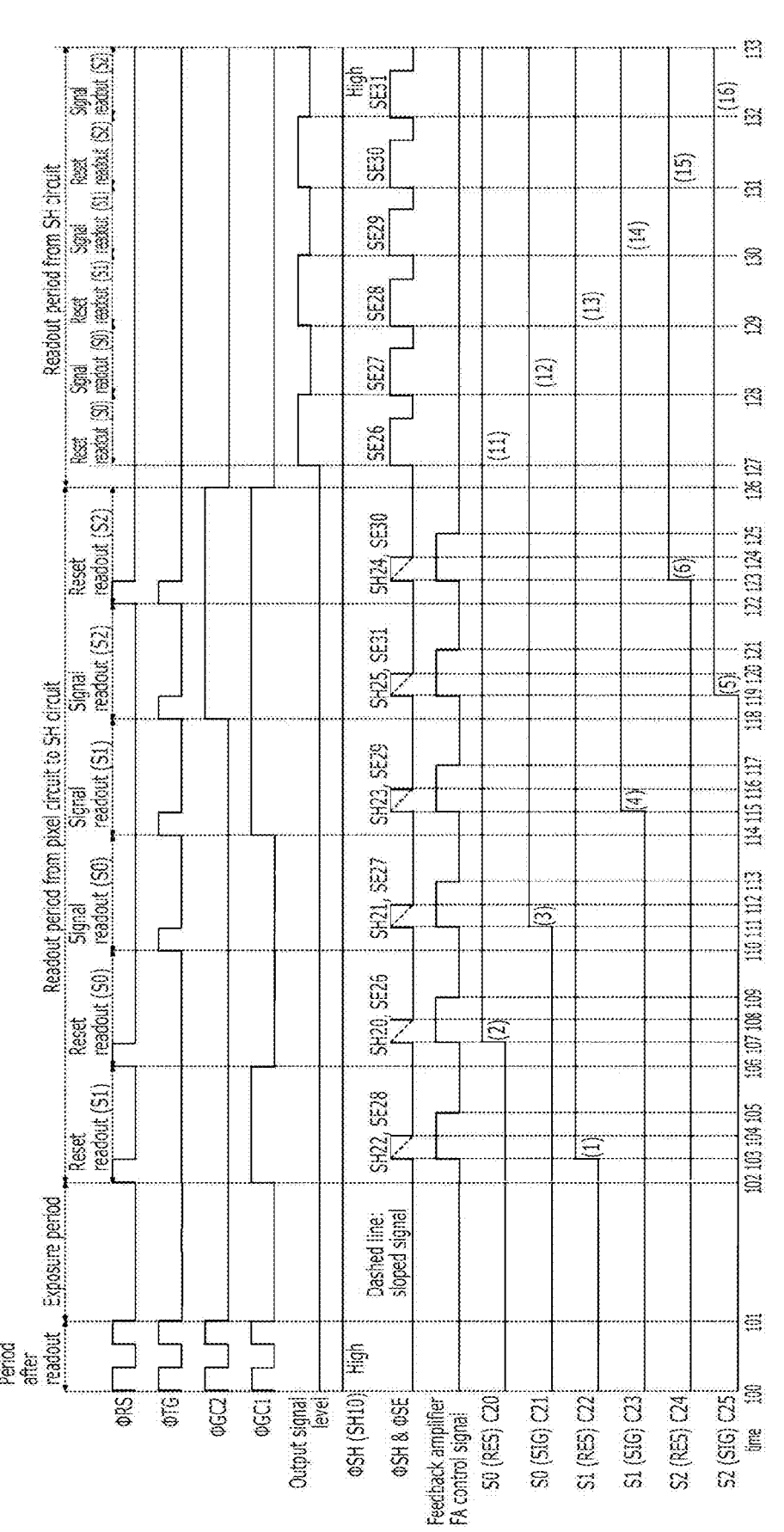
FIG. 17 illustrates a period of readout from a pixel circuit to a sample and hold circuit and timings of readout from the sample and hold circuit according to Embodiment 2A.

In Embodiment 2A, as illustrated in FIG. 17, first, the MCG reset component (C22 of S1) is read from time t102 to t106, the HCG reset component (C20 of S0) is read from time t106 to t110, the HCG signal component (C21 of S0) is read from t110 to t114, the MCG signal component (C23 of S1) is read from time t114 to t118, the LCG signal component (C25 of S2) is read from time t118 to t122, and the LCG reset component (C24 of S2) is read from time t122 to t126.

HCG Readout Operation Example

Next, the high conversion gain (HCG) readout operation in solid-state imaging apparatus 100 illustrated in FIG. 3 will be described. The HCG readout operation is an imaging operation that does not use first storage capacitive element C1 by turning first gain control transistor GC1 off, and uses only charge storage FD0 for signal charge accumulation to increase the conversion gain of amplification transistor SF1. Hence, the HCG operation is a high-sensitivity imaging operation, suitable for imaging in low-illuminance environments.

The HCG readout operation is the same as the HCG readout operation of FIG. 5 of Embodiment 1A.

MCG Readout Operation Example

Next, the middle conversion gain (MCG) readout operation in solid-state imaging apparatus 100 illustrated in FIG. 3 will be described. The MCG readout operation is an imaging operation that uses first storage capacitive element C1 by turning first gain control transistor GC1 on, and uses both charge storage FD0 and first storage capacitive element C1 for signal charge accumulation to lower the conversion gain of amplification transistor SF1. Hence, the MCG operation is a mid-sensitivity imaging operation, suitable for imaging in high-illuminance environments. The gain for converting the signal charge into a voltage in charge storage FD1 can be selectively switched between high gain and low gain according to whether first gain control transistor GC1 is on or off.

LCG Readout Operation Example

Next, the low conversion gain (LCG) readout operation in solid-state imaging apparatus 100 illustrated in FIG. 3 will be described. The LCG readout operation is an imaging operation that uses first storage capacitive element C1 and second storage capacitive element C2 by turning first gain control transistor GC1 and second gain control transistor GC2 on, and uses charge storage FD0, first storage capacitive element C1, and second storage capacitive element C2 for signal charge accumulation to lower the conversion gain of amplification transistor SF1. Hence, the LCG operation is a low-sensitivity imaging operation, suitable for imaging in high-illuminance environments. The gain for converting the signal charge into a voltage in charge storage FD2 can be selectively switched between high gain and low gain according to whether second gain control transistor GC2 is on or off.

Configuration and Operation Examples of Negative Feedback Circuit

In high illuminance, signal charge is stored in first storage capacitive element C1 and second storage capacitive element C2 of the pixel circuit, while in low illuminance, kTC noise can be reduced by negative feedback circuit 4b to achieve low noise. This extends the dynamic range. Typically, kTC noise is generated in the sample and hold capacitive elements (C20, C21, C22, C23, C24, and C25) when sample and hold is performed by control signal φSH of the sample and hold switching elements (SH20, SH21, SH22, SH23, SH24, and SH25).

As a measure for this, the output of amplification transistor SF1 of the pixel circuit is input to the positive input terminal of feedback amplifier FA. SH circuit 10c includes sample and hold capacitive elements (C20, C21, C22, C23, C24, and C25), sample and hold switching elements (SH20, SH21, SH22, SH23, SH24, and SH25), and the readout selection switching elements (SE26, SE27, SE28, SE29, SE30, and SE31), is connected to feedback line 17B, and inputs to the gate of amplification transistor SF2. The output of amplification transistor SF2 is connected to the negative input terminal of the feedback amplifier. Feedback line 17A, which is the output signal of the feedback, is connected to the input terminal of the sample and hold switching elements (SH20, SH21, SH22, SH23, SH24, and SH25) to provide negative feedback.

As a result, the sample and hold capacitive elements (C20, C21, C22, C23, C24, and C25) hold a noise-reduced signal equal to the pixel signal level.

Control signal φSH input to the sample and hold switching elements (SH20, SH21, SH22, SH23, SH24, and SH25) has a sloped voltage waveform that gradually transitions it from on to off. Hereinafter, signals with a sloped voltage waveform are referred to as sloped signals.

FIG. 7 illustrates the waveform of the sloped signal. As illustrated in FIG. 7, sample and hold switch control signal φSH changes gradually as a sloped signal. FIG. 8 illustrates the relationship between the slope period and the noise level of the sample and hold capacitive element. As illustrated in FIG. 8 and FIG. 9, the kTC noise is an asymptote while negative feedback is applied, as the input voltage at one end of the feedback amplifier asymptotically approaches the output voltage of amplification transistor SF1 of pixel circuit 3. As both electric potentials come closer together, the rate of change of the voltage in the sample and hold capacitive elements (C20, C21, C22, C23, C24, and C25) decreases. When both electric potentials are equal, the electric potential of the sample and hold capacitive elements (C20, C21, C22, C23, C24, and C25) are fixed.

Lastly, the operation of feedback amplifier FA can be stopped or the negative feedback loop can be shut down to stop the negative feedback and complete the operation.

The sample and hold capacitive element (C20) holds the signal of the RST component of the HCG. On the other hand, the sample and hold capacitive element (C21) holds the signal of the signal component of the HCG.

The sample and hold capacitor (C22) holds the signal of the RST component of the MCG. On the other hand, the sample and hold capacitor (C23) holds the signal of the signal component of the MCG.

The sample and hold capacitor (C24) holds the signal of the RST component of the LCG. On the other hand, the sample and hold capacitor (C25) holds the signal of the signal component of the LCG.

Photodiode PD, first storage capacitive element C1, and second storage capacitive element C2 are exposed for the duration of the exposure period using a global shutter method or a rolling shutter method. The amount of charge generated in photodiode PD, first storage capacitive element C1, and second storage capacitive element C2 shall be expressed as Q0, Q1, and Q2.

In the global shutter method, the global reset is performed simultaneously for all pixels to start exposure, and since the exposure periods are the same, the exposure time is represented by $T\_Q0=T\_Q1=T\_Q2$. Next, the charge from the photodiode is read out simultaneously to the sample and hold capacitive elements (C20, C21, C22, C23, C24, and C25). Thereafter, the signal charges of the sample and hold capacitive elements (C20, C21, C22, C23, C24, and C25) are read out using the rolling method.

In the rolling shutter method, all pixels are scanned per selected row to start exposure, and since the exposure periods are the same, the exposure time is represented by $T\_Q0=T\_Q1=T\_Q2$. Next, the readout of charge from the photodiode is performed for the row selected by scanning row by row to the sample and hold capacitive elements (C20, C21, C22, C23, C24, and C25). Thereafter, the signal charges of the sample and hold capacitive elements (C20, C21, C22, C23, C24, and C25) are read out using the rolling method.

FIG. 17 illustrates an example of the timing of the signal readout operation.

First, photodiode PD, FD0, GC1, and GC2 are reset at time t100, and the process waits for the exposure to start. Then, at time t101, the shutter operates to start the exposure. The exposure time ends at time t102.

Next, at time t102, RS and GC1 are turned on, FD0 is reset, and the MCG reset component readout period begins. Next, at time t106, GC1 is turned off, and the HCG reset component readout period begins. Next, at time t110, TG is turned on and the signal charge stored in the photodiode is transferred to FD0 by the transfer signal (TG), and the HCG signal component (Q0) readout period begins. Next, at time t114, TG and GC1 are turned on and the signal charge that overflows at FD0 is transferred to the storage capacitive element (C1) by GC1, and the MCG signal component (Q0+Q1) readout period begins. Next, at time t118, TG, GC1, and GC2 are turned on and the charge in storage capacitive element C2 is transferred to FD0 by GC2, and the LCG signal component (Q0+Q1+Q2) readout period begins. Next, at time t122, RS, GC1, and GC2 are turned on, and the LCG reset component readout period begins.

Then, the sample and hold capacitive elements (C22, C20, C21, C23, C25, and C24) are connected to feedback line 17A and feedback line 17B by turning on the control signals of the sample and hold switching elements (SH22, SH20, SH21, SH23, SH25, and SH24) and the readout selection switching elements (SE28, SE26, SE27, SE29, SE31, and SE30) at the respective times t103, t107, t111, t115, t119, and t123. As a result, the output signal of pixel circuit 3 is negatively returned to the sample and hold capacitive elements (C22, C20, C21, C23, C25, and C24).

Here, control signal φSH of sample and hold switching element SH10 is always on. Moreover, switching element SW1 is always on and switching element SW11 is always off.

In negative feedback circuit 4c, address selection is performed by control signals φSH of the sample and hold switching elements (SH22, SH20, SH21, SH23, SH25, and SH24) and control signals φSE of the readout selection switching elements (SE28, SE26, SE27, SE29, SE31, and SE30), a signal is sampled and held with respect to one of the plurality of sample and hold capacitive elements (C22, C20, C21, C23, C25, and C24) shared by feedback amplifier FA to reduce noise, and this operation is repeated.

First, by the sample and hold switching elements (SH22, SH20, SH21, SH23, SH25, and SH24), and the readout selection switching elements (SE28, SE26, SE27, SE29, SE31, and SE30) turned on at the respective times t103, t107, t111, t115, t119, and t123, the signals of the sample and hold capacitive elements (C22, C20, C21, C23, C25, and C24) are supplied to the negative input terminal of feedback amplifier FA through amplification transistor SF2. Here, the output voltage of the above sample and hold capacitive elements (C22, C20, C21, C23, C25, and C24) through amplification transistor SF2 operates to converge with the output signal of pixel circuit 3 through amplification transistor SF1 that is applied to the positive input terminal of feedback amplifier FA.

Next, at the respective times t104, t108, t112, t116, t120, and t124, kTC noise is generated by turning off control signals φSH of the sample and hold switching elements (SH22, SH20, SH21, SH23, SH25, and SH24) and control signals φSE of the readout selection switching elements (SE28, SE26, SE27, SE29, SE31, and SE30). kTC noise is thus added to the voltages of the sample and hold capacitive elements (C22, C20, C21, C23, C25, and C24) after reset.

While feedback amplifier FA is operating and the output thereof is connected to feedback line 17A, the negative feedback circuit remains formed (until times t105, t109, t113, t117, t121 and t125). Therefore, the kTC noise caused by turning off control signals φSH of the sample and hold switching elements (SH22, SH20, SH21, SH23, SH25, and SH24) at the respective times t104, t108, t112, t116, t120, and t124 is reduced to a magnitude of $1/(1+A)$, where A represents the gain of feedback amplifier FA.

Although kTC noise is generated at the node of the gate of amplification transistor SF2 by turning off the gate voltage of the readout selection switching elements (SE28, SE26, SE27, SE29, SE31, and SE30), this parasitic capacitance is sufficiently small compared to that of the sample and hold capacitive elements (C22, C20, C21, C23, C25, and C24) and is thus negligible. This can be seen from the fact that the charge of kTC noise is expressed as $\sqrt{(kTC)(C)}$.

For the above reasons, readout selection switching element control signal φSE may be turned off with a sloped or rectangular signal in coordination with the corresponding sample and hold switch control signal φSH or after the corresponding sample and hold switch control signal φSH.

Feedback amplifier FA may be in constant operation during the readout period from pixel circuit 3b to sample and hold circuit 10c (from time t102 to t126).

The above operation causes the voltage through amplification transistor SF2 just before turning off control signals φSH of the sample and hold switching elements (SH22, SH20, SH21, SH23, SH25, and SH24) (just before the start of noise reduction) to converge to a level approximately equal to the voltage through amplification transistor SF2 of the pixel signal applied to the positive input terminal of feedback amplifier FA.

Typically, since the product of gain G and bandwidth B (i.e., G×B) of the amplifiers that make up feedback amplifier FA is constant, increasing gain G causes bandwidth B to narrow (results in a lower cut-off frequency). In other words, convergence in feedback amplifier FA takes time.

Conversely, decreasing gain G causes bandwidth B to widen (results in a higher cut-off frequency). In other words, it reduces the time for convergence in feedback amplifier FA.

The noise level and convergence time must therefore be taken into account when determining the gain of feedback amplifier FA.

In this way, according to an embodiment of the present disclosure, it is possible to reduce kTC noise generated due to turning off control signals φSH of the sample and hold switching elements (SH22, SH20, SH21, SH23, SH25, and SH24) and cancel generated kTC noise in a relatively short amount of time.

Next, the HCG reset component (sample and hold capacitive element C20) is read out and transferred through amplification transistor SF2 by turning on control signal φSE of readout selection switching element SE26 at time t127, and the HCG signal component (sample and hold capacitive element C21) is read out and transferred through amplification transistor SF2 by turning on control signal φSE of readout selection switching element SE27 at time t128.

Next, the MCG reset component (sample and hold capacitive element C22) is read out and transferred through amplification transistor SF2 by turning on control signal φSE of readout selection switching element SE28 at time t129, and the MCG signal component (sample and hold capacitive element C23) is read out and transferred through amplification transistor SF2 by turning on control signal φSE of readout selection switching element SE29 at time t130.

Next, the LCG reset component (sample and hold capacitive element C24) is read out and transferred through amplification transistor SF2 by turning on control signal φSE of readout selection switching element SE30 at time t131, and the LCG signal component (sample and hold capacitive element C25) is read out and transferred through amplification transistor SF2 by turning on control signal φSE of readout selection switching element SE31 at time t132.

With respect to the order in which signals are read out from the sample and hold capacitive elements, there is no particular order in which each gain is read out, and any order is acceptable. Preferably, since CDS is performed, the reset component and then signal component should be read out in this order per gain.

Then, as described in Embodiment 1A, the variations are canceled since the reset component is subtracted from the signal component by the CDS of the AD conversion circuit.
Dynamic Range Extension A feature of the present embodiment is that in the global shutter method and the rolling shutter method, the three frames—the high-illuminance exposure, the medium-illuminance exposure, and the high-illuminance exposure frames—combined to achieve a WDR are exposed at exactly the same timing and the exact same pixels are used, which inhibits false colors, coloring, and blur.

The intra-pixel gain is set high for pixel signals in the frame for the low-illuminance region (i.e., for low-illuminance exposures) (HCG), set medium for pixel signals in the frame for the medium-illuminance region (i.e., for medium-illuminance exposures) (MCG), and set low for pixel signals in the frame for the high-illuminance region (i.e., for high-illuminance exposures) (LCG), which can also improve noise in low-illuminance conditions and extend the dynamic range in high-illuminance conditions.

Figure 16:
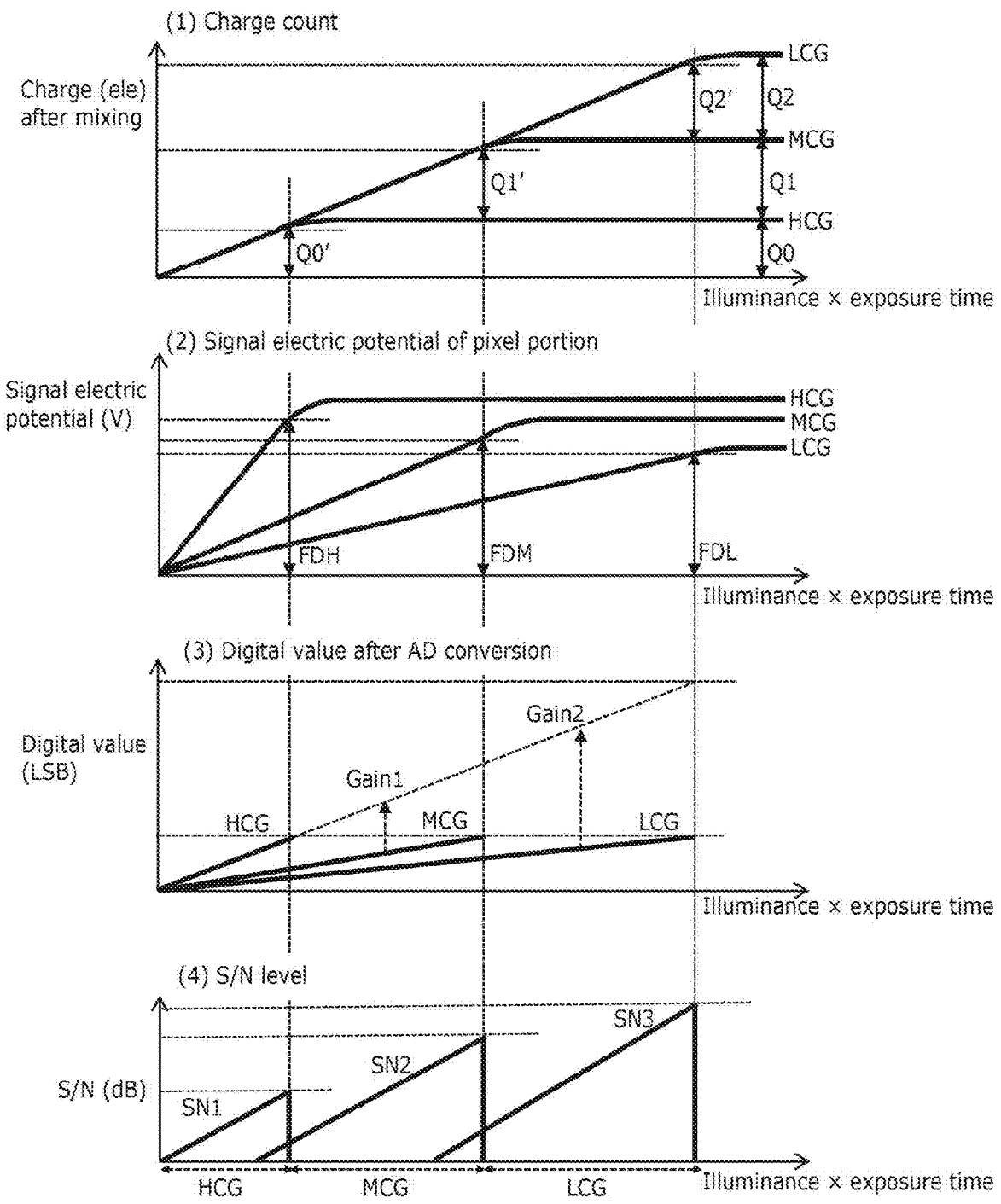
FIG. 16 is an overview of how WDR is implemented within a pixel.
Figure 19:
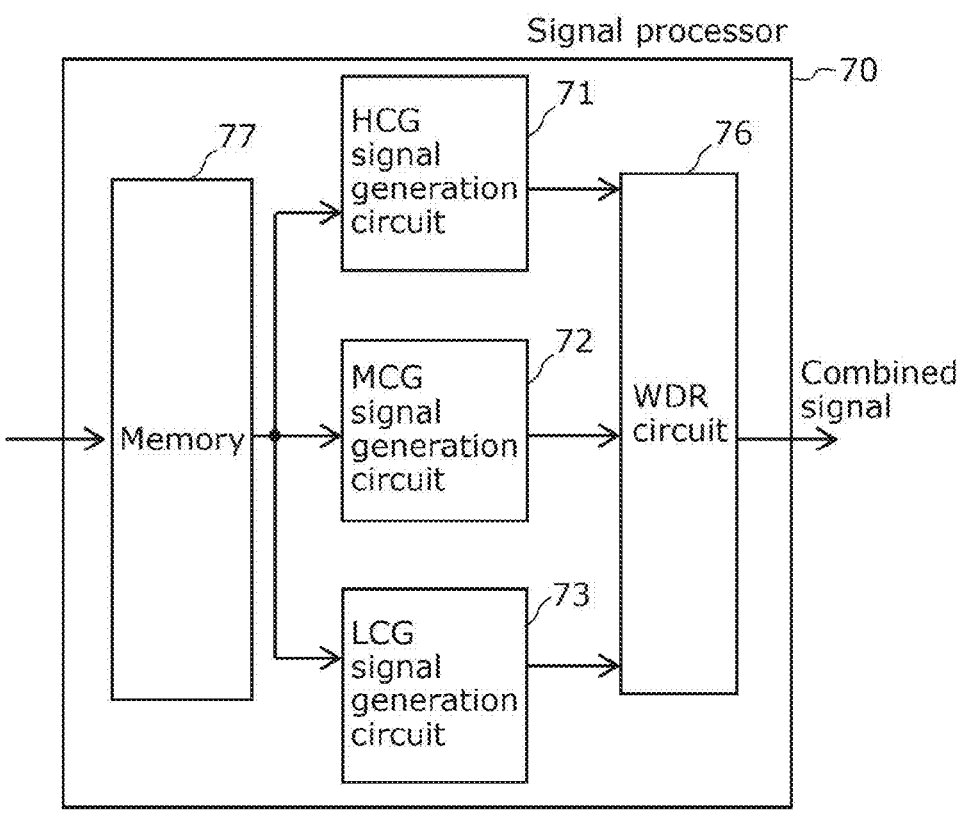
FIG. 19 illustrates an example of a configuration of a signal processor that combines three frames to achieve a WDR.

FIG. 19 is an overview of the combining method used within a pixel to achieve a WDR. FIG. 16 illustrates an example of a configuration of a signal processor that combines three frames to achieve a WDR. The WDR is achieved using the signal charge of Q0 for the low-illuminance exposure set to HCG, the signal charge of (Q0+Q1) for the medium-illuminance exposure set to MCG, and the signal charge of (Q0+Q1+Q2) for the high-illuminance exposure set to LCG.

The product of illuminance and exposure time, illuminance at a certain time, or exposure time at a certain illuminance is represented on the horizontal axes of (1), (2), (3), and (4) in FIG. 16. In (1), charge accumulation level is represented on the vertical axis. In (2), the signal electric potential of the pixel portion is represented on the vertical axis. In (3), the value after AD conversion is represented on the vertical axis. In (4), the S/N level is represented on the vertical axis.

WDR circuit 76 included in signal processor 70 is illustrated in greater detail in (3) and (4) in FIG. 16. The "illuminance×exposure time" at the boundary between low- and medium-illuminance exposures corresponds to charge Q0' just before charge Q0 in (1) saturates and corresponds to signal electric potential FDH in the pixel portion in (2). The "illuminance×exposure time" at the boundary between medium- and high-illuminance exposures corresponds to charge Q0+Q1' just before charge Q0+Q1 in (1) saturates and corresponds to signal electric potential FDM in the pixel portion in (2). The "illuminance×exposure time" which is the maximum, high-illuminance exposure corresponds to charge Q0+Q1+Q2' just before charge Q0+Q1+Q2 in (1) saturates and corresponds to signal electric potential FDL in the pixel portion in (2).

The pixel signal of the first, low-illuminance frame (low-illuminance exposure), the pixel signal of the second, medium-illuminance frame (medium-illuminance exposure), and the pixel signal of the third, high-illuminance frame (high-illuminance exposure) are combined, which achieves a wide dynamic range function (WDR function), or stated differently, functions to extend the dynamic range.

Thus, the present embodiment makes it possible to improve both dynamic range and S/N while reducing the reset noise of the storage capacitive element.

Conventionally, there is no negative feedback circuit, so kTC noise is generated when the sample and hold switch is turned off, which worsens the low-illuminance noise and narrows the dynamic range.

In the present embodiment, kTC noise can be significantly reduced since the sample and hold switch is turned off while the negative feedback circuit is applied to the reset and signal components of the pixel. Since the CDS in the AD conversion circuit subtracts the reset component from the signal component, variations in amplification transistor SF1 and amplification transistor SF2 are canceled. This results in reduced low-illuminance noise and an extended dynamic range.

Embodiment 2B

FIG. 15 illustrates Embodiment 2B. In Embodiment 2B, a third configuration example in which two stages of storage circuits have been added in the vertical direction with respect to the second configuration example illustrated in FIG. 14 in which the storage circuit is provided in the horizontal direction. The following description will focus on the points of difference with Embodiment 2A.

Solid-state imaging apparatus 100 according to Embodiment 2A will be described with a focus on the differences from Embodiment 2A. In one example of a configuration of solid-state imaging apparatus 100, the number of controls for horizontal scan line groups 15 differ, but all other aspects are the same.

Pixel Circuit Configuration Example

Next, an example of a configuration of pixel circuit 3c will be described.

FIG. 15 illustrates a circuit example of pixel circuit 3c and negative feedback circuit 4c according to Embodiment 2B. Pixel circuit 3c illustrated in the same FIGURE includes a photodiode (PD), transfer transistor TG, first storage capacitive element C1, second storage capacitive element C2, first gain control transistor GC1, second gain control transistor GC2, charge storage FD0, storage capacitive element C0, charge storage FD1, charge storage FD2, reset transistor RS, amplification transistor SF1, and selection transistor SEL_RS.

Vn of Horizontal scan line group 15 includes reset control signal φRS, readout control signal φTG, overflow control line φOF, and selection control line φSEL_RS.

Photodiode PD is a photoelectric conversion element that converts incident light into a signal charge. The signal charge that overflows from photodiode PD during exposure is transferred to and held by first storage capacitive element C1, as shown by dotted arrow line D in the same FIGURE. The signal charge that overflows at first storage capacitive element C1 is further transferred to and held by second storage capacitive element C2.

Moreover, storage capacitive element C0 connected to charge storage FD0 holds a signal charge (for example, electrons) transferred from photodiode PD, converts the held signal charge into voltage, and supplies the voltage resulting from the conversion to the gate of amplification transistor SF1. Practically speaking, the capacitance of charge storage FD0 is not only the capacitance of charge storage FD0 itself, but also includes the gate capacitance of amplification transistor SF1, the gate-drain capacitance and gate-source capacitance of amplification transistor SF1, and the floating capacitance of the source line of first gain control transistor GC1 when first gain control transistor GC1 is off.

Transfer transistor TG is a switching transistor that turns on and off according to readout control signal φTG. When readout control signal φTG is high-level, transfer transistor TG transfers the signal charge resulting from photoelectric conversion by photodiode PD to charge storage FD0.

First gain control transistor GC1 transfers the signal charge stored in first storage capacitive element C1 to charge storage FD0 when readout control signal φGC1 is high-level. Second gain control transistor GC2 transfers the signal charge stored in second storage capacitive element C2 to charge storage FD0 when readout control signal φGC2 is high-level.

When the signal charge resulting from photoelectric conversion by photodiode PD overflows, the signal charge is transferred to first storage capacitive element C1 by adjusting control voltage φGC1 of first gain control transistor GC1. Alternatively, the signal charge is transferred when the signal charge exceeds a preset electric potential.

When the signal charge resulting from photoelectric conversion by photodiode PD overflows, the signal charge is transferred to second storage capacitive element C2 by adjusting control voltage φGC2 of second gain control transistor GC2. Alternatively, the signal charge is transferred when the signal charge exceeds a preset electric potential.

First storage capacitive element C1 and second storage capacitive element C2 change to the conversion gain at which the signal charge in charge storage FD0 is converted into voltage. In other words, in the transferring of the signal charge from photodiode PD to charge storage FD0, the conversion gain of charge storage FD0 can be increased further to C0 if second gain control transistor GC2 is turned off. If first gain control transistor GC1 is turned on, charge storages FD0 and FD1 are connected and the conversion gain can be lowered to C0+C1 to allow more signal charge to be stored. Furthermore, if second gain control transistor GC2 is turned on, charge storages FD0, FD1, and FD2 are connected and the conversion gain can be lowered to C0+C1+C2 to allow more signal charge to be stored.

Reset transistor RS is a switching transistor that turns on and off according to reset control signal φRS. Reset transistor RS resets charge storage FD0, charge storage FD1, and charge storage FD2 when reset control signal φRS is high-level.

Amplification transistor SF1 forms a source follower paired together with load current supply P1 connected to vertical signal line 19B, and outputs the voltage of the gate, that is to say, the voltage of charge storage FD0 to vertical signal line 19B as an analog pixel signal.

Selection transistor SEL_RS is a switching transistor that turns on and off according to selection control signal φSEL_RS. Selection transistor SEL_RS electrically connects the source of amplification transistor SF1 and vertical signal line 19B when selection control signal φSEL_RS is high-level.

HCG, MCG, and LCG Readout Operation Example

First, the high conversion gain (HCG), middle conversion gain (MCG), and low conversion gain (LCG) readout operations in solid-state imaging apparatus 100 illustrated in FIG. 3 will be explained.

Figure 18:
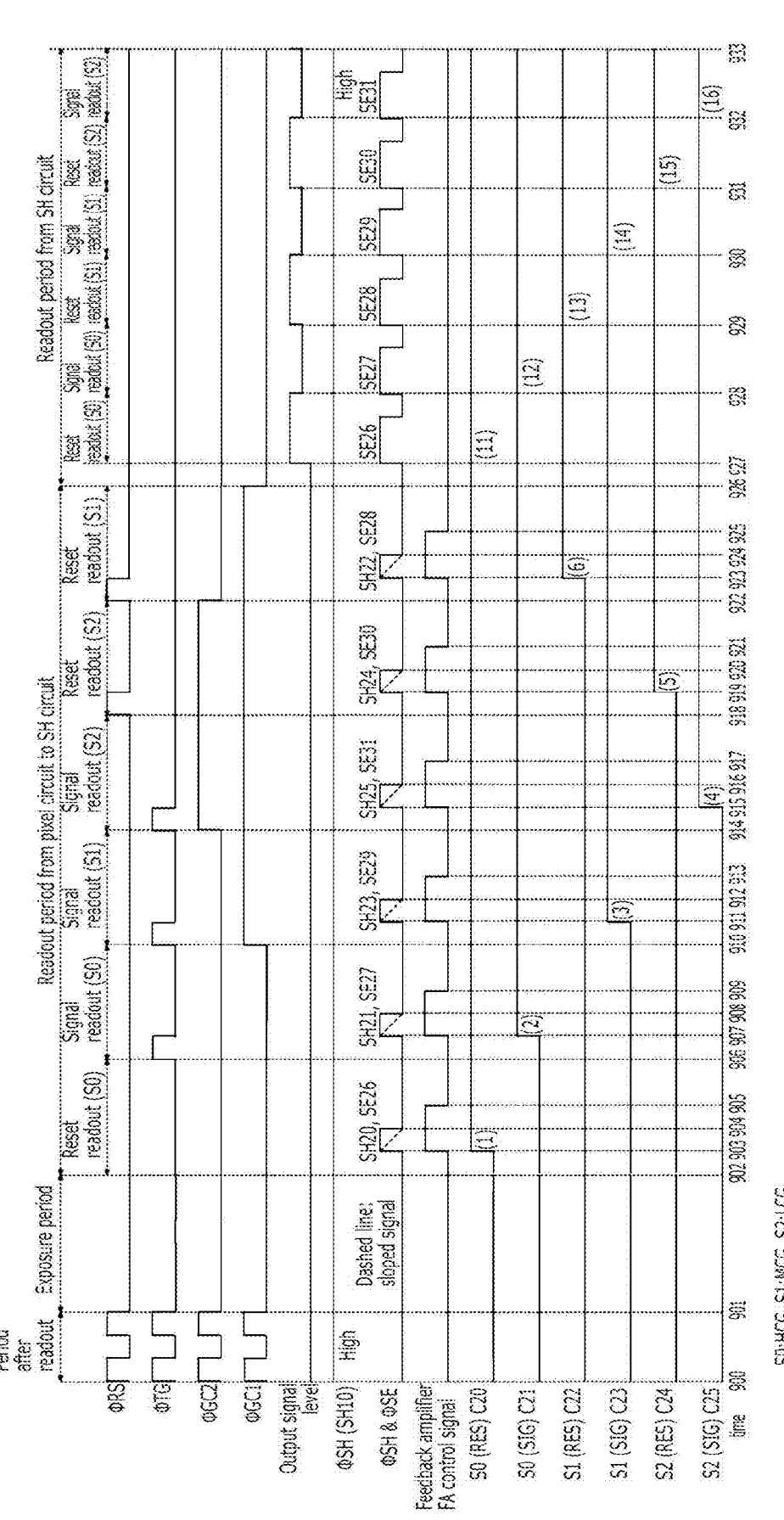
FIG. 18 illustrates a period of readout from a pixel circuit to a sample and hold circuit and timings of readout from the sample and hold circuit according to Embodiment 2B.

In Embodiment 2B, as illustrated in FIG. 18, first, the HCG reset component (C20) is read from time t902 to t906, the HCG signal component (C21) is read from time t906 to t910, the MCG signal component (C23) is read from t910 to t914, the LCG signal component (C25) is read from time t914 to t918, the LCG reset component (C24) is read from time t918 to t922, and the MCG reset component (C22) is read from time t922 to t926.

HCG Readout Operation Example

Next, the high conversion gain (HCG) readout operation in solid-state imaging apparatus 100 illustrated in FIG. 3 will be described. The HCG readout operation is an imaging operation that does not use first storage capacitive element C1 by turning first gain control transistor GC1 off, and uses only charge storage FD0 for signal charge accumulation to increase the conversion gain of amplification transistor SF1. Hence, the HCG operation is a high-sensitivity imaging operation, suitable for imaging in low-illuminance environments.

The HCG readout operation is the same as the HCG readout operation of FIG. 18 of Embodiment 1A and Embodiment 2A.

MCG Readout Operation Example

Next, the middle conversion gain (MCG) readout operation in solid-state imaging apparatus 100 illustrated in FIG. 3 will be described. The MCG readout operation is an imaging operation that uses first storage capacitive element C1 by turning first gain control transistor GC1 on, and uses both charge storage FD0 and first storage capacitive element C1 for signal charge accumulation to lower the conversion gain of amplification transistor SF1. Hence, the MCG operation is a mid-sensitivity imaging operation, suitable for imaging in high-illuminance environments. The gain for converting the signal charge into a voltage in charge storage FD1 can be selectively switched between high gain and low gain according to whether first gain control transistor GC1 is on or off.

LCG Readout Operation Example

Next, the low conversion gain (LCG) readout operation in solid-state imaging apparatus 100 illustrated in FIG. 3 will be described. The LCG readout operation is an imaging operation that uses second storage capacitive element C2 by turning second gain control transistor GC2 on, and uses charge storage FD0, first storage capacitive element C1, and second storage capacitive element C2 for signal charge accumulation to lower the conversion gain of amplification transistor SF1. Hence, the LCG operation is a low-sensitivity imaging operation, suitable for imaging in high-illuminance environments. The gain for converting the signal charge into a voltage in charge storage FD2 can be selectively switched between high gain and low gain according to whether second gain control transistor GC2 is on or off.

Configuration and Operation Examples of Negative Feedback Circuit

Since the configuration of negative feedback circuit 4 is the same as in Embodiments 2A and 2B, repeated description will be omitted.

Just as in Embodiment 2A, first, the sample and hold capacitive element (C20) holds the signal of the RST component of the HCG. On the other hand, the sample and hold capacitive element (C21) holds the signal of the signal component of the HCG The sample and hold capacitor (C22) holds the signal of the RST component of the MCG. On the other hand, the sample and hold capacitor (C23) holds the signal of the signal component of the MCG.

The sample and hold capacitor (C24) holds the signal of the RST component of the LCG. On the other hand, the sample and hold capacitor (C25) holds the signal of the signal component of the LCG.

The global shutter exposure method and the rolling shutter exposure method are also the same as in Embodiment 2A, and so repeated description will be omitted.

FIG. 18 illustrates an example of the timing of the readout operation.

First, photodiode PD, FD0, GC1, and GC2 are reset at time t900, and the process waits for the exposure to start. Then, at time t901, the shutter operates to start the exposure. The exposure time ends at time t902.

Next, at time t902, the HCG reset component readout period begins. Next, at time t906, TG is turned on and the signal charge stored in the photodiode is transferred to FD0 by the transfer signal (TG), and the HCG signal component (q0) readout period begins. Next, at time t910, TG and GC1 are turned on and the signal charge that overflows at FD0 is transferred to first storage capacitive element C1 by GC1, and the MCG signal component (Q0+Q1) readout period begins. Next, at time t914, TG, GC1, and GC2 are turned on and the charge in second storage capacitive element C2 is transferred to FD0 by GC2, and the LCG signal component (Q0+Q1+Q2) readout period begins. Next, at time t918, RS, GC1, and GC2 are turned on, and the LCG reset component readout period begins. Next, at time t922, RS and GC1 are turned on, and the MCG reset component readout period begins.

Then, the sample and hold capacitive elements (C20, C21, C23, C25, C24, and C22) are connected to feedback line 17A and feedback line 17B by turning on control signals φSH of the sample and hold switching elements (SH20, SH21, SH23, SH25, SH24, and SH22) and control signals φSE of the readout selection switching elements (SE26, SE27, SE29, SE31, SE30, and SE28) at the respective times t903, t907, t911, t915, t919, and t923. As a result, the output signal of pixel circuit 3 is negatively returned to the sample and hold capacitive elements (C20, C21, C23, C25, C24, and C22).

Here, control signal φSH of sample and hold switching element SH10 is always on. Moreover, switching element SW1 is always on and switching element SW11 is always off.

In negative feedback circuit 4c, address selection is performed by control signals φSH of the sample and hold switching elements (SH20, SH21, SH23, SH25, SH24, and SH22) and control signals φSE of the readout selection switching elements (SE26, SE27, SE29, SE31, SE30, and SE28), a signal is sampled and held with respect to one of the plurality of sample and hold capacitive elements (C20, C21, C23, C25, C24, and C22) shared by feedback amplifier FA to reduce noise.

First, by the sample and hold switching elements (SH20, SH21, SH23, SH25, SH24, and SH22), and the readout selection switching elements (SE26, SE27, SE29, SE31, SE30, and SE28) turned on at the respective times t903, t907, t911, t915, t919, and t923, the signals of the sample and hold capacitive elements (C20, C21, C23, C25, C24, and C22) are supplied to the negative input terminal of feedback amplifier FA through amplification transistor SF2. Here, the output voltage of the above sample and hold capacitive elements (C20, C21, C23, C25, C24, and C22) through amplification transistor SF2 operates to converge with the output signal of pixel circuit 3 through amplification transistor SF1 that is applied to the positive input terminal of feedback amplifier FA.

Next, at the respective times t904, t908, t912, t916, t920, and t924, kTC noise is generated by turning off control signals φSH of the sample and hold switching elements (SH20, SH21, SH23, SH25, SH24, and SH22) and control signals φSE of the readout selection switching elements (SE26, SE27, SE29, SE31, SE30, and SE28). kTC noise is thus added to the voltages of the sample and hold capacitive elements (C20, C21, C23, C25, C24, and C22).

While feedback amplifier FA is operating and the output thereof is connected to feedback line 17A, the negative feedback circuit remains formed (until times t905, t909, t913, t917, t921 and t925). Therefore, the kTC noise caused by turning off control signals φSH of the sample and hold switching elements (SH20, SH21, SH23, SH25, SH24, and SH22) at the respective times t904, t908, t912, t916, t920, and t924 is reduced to a magnitude of 1/(1+A), where A represents the gain of feedback amplifier FA.

Although kTC noise is generated at the node of the gate of amplification transistor SF2 by turning off control signals φSE of the readout selection switching elements (SE26, SE27, SE29, SE31, SE30, and SE28), this parasitic capacitance is sufficiently small compared to that of the sample and hold capacitive elements (C20, C21, C23, C25, C24, and C22) and is thus negligible. This can be seen from the fact that the charge of kTC noise is expressed as $\sqrt{(kTC)(C)}$.

For the above reasons, readout selection switching element control signal φSE may be turned off with a sloped or rectangular signal in conjunction with the corresponding sample and hold switch control signal φSH or after the corresponding sample and hold switch control signal φSH.

Feedback amplifier FA may be in constant operation during the readout period from pixel circuit 3c to sample and hold circuit 10c (from time t902 to t926).

The above operation causes the voltage through amplification transistor SF2 just before turning off control signals φSH of the sample and hold switching elements (SH20, SH21, SH23, SH25, SH24, and SH22) (just before the start of noise reduction) to converge to a level approximately equal to the voltage through amplification transistor SF2 of the pixel signal applied to the positive input terminal of feedback amplifier FA.

Typically, since the product of gain G and bandwidth B (i.e., G×B) of the amplifiers that make up feedback amplifier FA is constant, increasing gain G causes bandwidth B to narrow (results in a lower cut-off frequency). In other words, convergence in feedback amplifier FA takes time.

Conversely, decreasing gain G causes bandwidth B to widen (results in a higher cut-off frequency). In other words, it reduces the time for convergence in feedback amplifier FA.

The noise level and convergence time must therefore be taken into account when determining the gain of feedback amplifier FA.

In this way, according to an embodiment of the present disclosure, it is possible to reduce kTC noise generated due to turning off control signals φSH of the sample and hold switching elements (SH20, SH21, SH23, SH25, SH24, and SH22) and cancel generated kTC noise in a relatively short amount of time.

Next, the HCG reset component (sample and hold capacitive element C20) is read out and transferred through amplification transistor SF2 by turning on control signal φSE of readout selection switching element SE26 at time t927, and the HCG signal component (sample and hold capacitive element C21) is read out and transferred through amplification transistor SF2 by turning on control signal φSE of readout selection switching element SE27 at time t928.

Next, the MCG reset component (sample and hold capacitive element C22) is read out and transferred through amplification transistor SF2 by turning on control signal φSE of readout selection switching element SE28 at time t929, and the MCG signal component (sample and hold capacitive element C23) is read out and transferred through amplification transistor SF2 by turning on control signal φSE of readout selection switching element SE29 at time t930.

Next, the LCG reset component (sample and hold capacitive element C24) is read out and transferred through amplification transistor SF2 by turning on control signal φSE of readout selection switching element SE30 at time t931, and the LCG signal component (sample and hold capacitive element C25) is read out and transferred through amplification transistor SF2 by turning on control signal φSE of readout selection switching element SE31 at time t932.

Then, as described in Embodiment 1A, the variations are canceled since the reset component is subtracted from the signal component by the CDS of the AD conversion circuit.

Dynamic Range Extension

A feature of the present embodiment is that the three frames—the high-illuminance exposure, the medium-illuminance exposure, and the high-illuminance exposure frames—combined to achieve a WDR are exposed at exactly the same timing and the exact same pixels are used, which inhibits false colors, coloring, and blur.

Details regarding the extension of the dynamic range are the same as in Embodiment 2A and so repeated description will be omitted.

Conventionally, there is no negative feedback circuit, so kTC noise is generated when the sample and hold switch is turned off, which worsens the low-illuminance noise and narrows the dynamic range.

In the present embodiment, kTC noise can be significantly reduced since the sample and hold switch is turned off while the negative feedback circuit is applied to the reset and signal components of the pixel. Since the CDS in the AD conversion circuit subtracts the reset component from the signal component, variations in amplification transistor SF1 and amplification transistor SF2 are canceled. This results in reduced low-illuminance noise and an extended dynamic range.

In pixel circuits 3b and 3c according to the present embodiment, one photodiode PD, three storage capacitive elements, and three charge storages are provided to generate three signals—HCG, MCG, and LCG—but if more of each element is provided, three or more signals can be generated and the dynamic range can be extended even further.

Embodiment 3

Solid-State Imaging Apparatus 100 Configuration Example

FIG. 3 is a block diagram illustrating an example of a configuration of solid-state imaging apparatus 100 according to Embodiment 3. The configuration illustrated in FIG. 20 includes pixel array 1 including a plurality of pixel circuits 3, and multi-pixel shared negative feedback circuit 4d including SH circuits corresponding one-to-one to pixel circuits 3, amplification transistors SF2 and SF3, and feedback amplifier FA.

Any of pixel circuits 3a, 3b, and 3c may be applied as pixel circuit 3. Here, a case in which pixel circuit 3b is applied as pixel circuit 3 will be described.

Any of SH circuit 10a, SH circuit 10b, and SH circuit 10c may be applied as sample and hold circuit 10. Here, a case in which sample and hold circuit 10c is applied as sample and hold circuit 10 will be described.

In other words, a case in which Embodiment 2A is applied to Embodiment 3 will be described.

In Embodiment 3, s rows and t columns of pixel circuit 3(b) are provided, and s rows and t columns of SH circuit 10(c) are also provided in one-to-one correspondence with pixel circuits 3. As one example, in FIG. 20, four rows and two columns are provided. In negative feedback circuit 4d, a plurality of sample and hold circuits 10(c) arranged in a matrix are also arranged in four rows and two columns. Here, there is no specific rule for the proportional relationship between s and t in s rows and t columns; proportional relationship is acceptable.

For example, the output signal of pixel A in the F-th column is connected to the positive input terminal of feedback amplifier FA via switching element SW1. Feedback line 17A of feedback amplifier FA is connected to feedback line 17B via sample and hold switching element SH10(c) and sample and hold circuit 10(c) corresponding to pixel A in the F-th column, and connected to the negative input terminal of feedback amplifier FA via amplification transistor SF2 and switching element SW5. With negative feedback circuit 4d configured in this way, the signal of pixel A is held in the sample and hold capacitive element corresponding to pixel A with reduced noise. The same applies to the other pixel signals of the F-th column.

Here, switching element SW1 is always on and switching element SW11 is always off.

With respect to the F-th column, in negative feedback circuit 4d, address selection is performed by control signals φSH of the sample and hold switching elements (SH22, SH20, SH21, SH23, SH25, and SH24 in chronological order in FIG. 17) and control signals φSE of the readout selection switching elements (SE28, SE26, SE27, SE29, SE31, and SE30 in chronological order in the same FIGURE), a signal is sampled and held with respect to one of the plurality of sample and hold capacitive elements (C22, C20, C21, C23, C25, and C24 in chronological order in the same figure) shared by feedback amplifier FA to reduce noise, and this operation is repeated.

For example, the output signal of pixel E in the F+1-th column is connected to the positive input terminal of feedback amplifier FA via switching element SW2. Feedback line 17A of feedback amplifier FA is connected to feedback line 17B via sample and hold switching element SH10(c) and SH circuit 10(c) corresponding to pixel E in the F+1-th column, and connected to the negative input terminal of feedback amplifier FA via amplification transistor SF3 and switching element SW6. With a negative feedback circuit configured in this way, the signal of pixel E is held in the sample and hold capacitive element corresponding to pixel E with reduced noise. The same applies to the other pixel signals of the F+1-th column.

Here, switching element SW2 is always on and switching element SW12 is always off.

With respect to the F+1-th column, in negative feedback circuit 4d, address selection is performed by control signals φSH of the sample and hold switching elements (SH22, SH20, SH21, SH23, SH25, and SH24 in chronological order in FIG. 17) and control signals φSE of the readout selection switching elements (SE28, SE26, SE27, SE29, SE31, and SE30 in chronological order in the same FIGURE), a signal is sampled and held with respect to one of the plurality of sample and hold capacitive elements (C22, C20, C21, C23, C25, and C24 in chronological order in the same figure) shared by feedback amplifier FA to reduce noise, and this operation is repeated.

If negative feedback is not required and higher speed is prioritized over noise reduction, switching elements SW1 and SW2 can be turned off and switching elements SW11 and SW12 turned on to directly sample and hold pixel signals in the sample and hold capacitive elements (C22, C20, C21, C23, C25, and C24). However, since no negative feedback is applied, kTC noise is superimposed without being reduced. For example, this is effective for reducing low illuminance noise by applying negative feedback only to the HCG and not to MCG or LCG to achieve higher speed.

The order of signal readout from the plurality of pixel circuits 3(b) of pixel array 1 to the corresponding sample and hold circuits SH10(c) is not determined; signal readout may be performed with regularity or with randomness. The readout order is given by sample and hold switch control signal φSH and readout selection switching element control signal φSE. In the figure, these control signals are supplied from vertical scanning circuit 14 in the horizontal direction relative to pixel array 1, but they may be supplied from the vertical direction.

The number of vertical signal lines 19A of the plurality of pixel circuits 3(b) included in pixel array 1 and multi-pixel shared negative feedback circuit 4d and including sample and hold circuits 10(c) corresponding one-to-one to the plurality of pixel circuits 3(b) is the same as the number of vertical signal lines 19B of the pixel circuits. Here, the amplification transistors connected to the plurality of SH circuits 10(c) include amplification transistor SF2 and amplification transistor SF3 provided for each column, but if more amplification transistors and vertical signal lines 19A can be provided, many pixels can be read out simultaneously from negative feedback circuit 4d, achieving high speed readout.

Sloped signal generator 30 determines the slope of control signals φSH (SH20, SH21, SH22, SH23, SH24, and SH25) of the sample and hold switches in sample and hold circuits 10(c) included in multi-pixel shared negative feedback circuit 4d to generate optimal sloped signals to reduce kTC noise in the sample and hold capacitive elements (C20, C21, C22, C23, C24, and C25).

Using the horizontal scan line groups (also called row control line groups) 15 provided per row of multi-pixel shared negative feedback circuits 4d, vertical scanning circuit 14 scans control signals φSE (SE26, SE27, SE28, SE29, SE30, SE31) of the readout selection switches included in sample and hold circuit 10 per row. As a result, the pixel signals belonging to the selected rows held in sample and hold circuit 10 can be sequentially output to vertical signal line 19.

Here, output from OUT (GS) is possible with the rolling shutter method and the global shutter method.

To reduce power consumption, current supplies P1 and P2 can be turned on only when the pixel signals of pixel circuit 3 are read out to multi-pixel shared negative feedback circuit 4d.

Column processor 26 includes a column AD circuit 25 for each column. Each column AD circuit 25 AD converts pixel signals from vertical signal line 19.

FIG. 21 illustrates junctions between a pixel chip and a logic chip including multi-pixel shared negative feedback circuits 4d (provided in 4 rows and 2 columns) that is illustrated in FIG. as one example of s rows and t columns of multi-pixel shared negative feedback circuits 4d. Pixel circuits 3(b) are also joined to multi-pixel shared negative feedback circuit 4d in units of 4 rows and 2 columns to which signals are input. The output signals of the F-th and F+1-th columns of multi-pixel shared negative feedback circuits 4*d* (provided in 4 rows and 2 columns) are output to the respective vertical signal lines 19A, in correspondence with the F-th and F+1-th columns of pixel circuits 3(*b*), and are then input to column AD circuit 25. Here, the number of vertical signal lines 19A may be greater than the number of vertical signal lines of the pixel array in order to increase the number of pixel signal readout signals and increase speed.

Note that in FIG. 21, vertical signal lines 19B are disconnected and connected to pixel circuits 3(*b*) in units of the respective negative feedback circuits 4*d*.

Configuration and Operation Examples of Negative Feedback Circuit (for Low Noise)

In high illuminance, signal charge is stored in first storage capacitive element C1 and second storage capacitive element C2 of the pixel circuit, while in low illuminance, kTC noise can be reduced by multi-pixel shared negative feedback circuit 4*d* to achieve low noise. This extends the dynamic range. Typically, kTC noise is generated in the sample and hold capacitive elements (C20, C21, C22, C23, C24, and C25) when sample and hold is performed by control signal φSH of the sample and hold switching elements (SH20, SH21, SH22, SH23, SH24, and SH25).

Since the measure for this is the same as in Embodiment 2A, points of difference will be described here.

The global shutter exposure method and the rolling shutter exposure method are also the same as in Embodiment 2A, and so repeated description will be omitted.

Hereinafter, points of difference with Embodiment 2A will be described.

In Embodiment 2A, per feedback amplifier FA, there is one pixel circuit 3*b* (or pixel circuit 3*c* in Embodiment 2B) and sample and hold circuit 10*c* corresponding one-to-one.

In contrast, Embodiment 3 features, per feedback amplifier FA, a plurality of pixel circuits 3*b* or pixel circuits 3*b* and sample and hold circuits 10*c* corresponding one-to-one in negative feedback circuit 4*d*, and are thus shared by feedback amplifier FA.

Accordingly, signals corresponding to the gains of pixel circuit 3 (for example, pixel circuit 3*b*) must be implemented a plurality of times for sample and hold circuits 10*c* that share feedback amplifier FA.

If one unit includes s rows and t columns of pixel circuits 3 (for example, pixel circuits 3*b*) and sample and hold circuits 10, negative feedback operations must be repeated s×t times, and must be repeated for three gains (HCG, MCG, and LCG) and for the reset and signal components. In this example, there are 4 rows and 2 columns, so 8 times×3 gains×2 components=48 times.

Next, operations will be described with reference to the timing chart illustrated in FIG. 17.

First, the MCG reset components from time t102 to t106 are read out for sample and hold capacitive elements C22 of sample and hold circuits 10*c* corresponding to eight pixels while repeatedly applying negative feedback.

Next, the HCG reset components from time t106 to t110 are read out for sample and hold capacitive elements C20 of sample and hold circuits 10*c* corresponding to eight pixels while repeatedly applying negative feedback.

Next, the HCG signal components from time t110 to t114 are read out for sample and hold capacitive elements C21 of sample and hold circuits 10*c* corresponding to eight pixels while repeatedly applying negative feedback.

Next, the MCG signal components from time t114 to t118 are read out for sample and hold capacitive elements C23 of sample and hold circuits 10*c* corresponding to eight pixels while repeatedly applying negative feedback.

Next, the LCG signal components from time t118 to t122 are read out for sample and hold capacitive elements C25 of sample and hold circuits 10*c* corresponding to eight pixels while repeatedly applying negative feedback.

Next, the LCG reset components from time t122 to t126 are read out for sample and hold capacitive elements C24 of sample and hold circuits 10*c* corresponding to eight pixels while repeatedly applying negative feedback.

Here, so that negative feedback is always applied, switching element SW1 is always on and switching element SW11 is always off for the F-th column readout. Switching element SW2 is always ON and switching element SW12 is always OFF for the F+1-th column readout.

Alternatively, switching elements SW1 and SW2 can be turned on and switching elements SW11 and SW12 can be turned off to control selection transistor SEL_RS in pixel circuit 3 and sample and hold switch control signal φSH of SH circuit 10.

Next, regarding the readout from the sample and hold capacitive elements (C20, C21, C22, C23, C24, and C25), vertical scanning circuit 14 selects multi-pixel shared negative feedback circuits 4*d* row by row, and the pixel signals from the multi-pixel shared negative feedback circuits 4*d* in the selected row are output simultaneously to two vertical signal lines 19A with the F-th column signal being output from amplification transistor SF2 and the F+1-th column signal being output via amplification transistor SF3.

First, in row E, the signal of pixel A in column F is output via amplification transistor SF2 and the signal of pixel E in column F+1 is output via amplification transistor SF3.

First, by turning on control signals φSE of readout selection switching elements SE26 for pixels A and E at time t127, the HCG reset components are read out and transferred simultaneously via amplification transistors SF2 and SF3, and then by turning on control signals φSE of readout selection switching elements SE27 at time t128, the HCG signal components are simultaneously read out and transferred via amplification transistor SF2 and amplification transistor SF3.

Next, by turning on control signals φSE of readout selection switching elements SE28 for pixels A and E at time t129, the MCG reset components are read out and transferred simultaneously via amplification transistors SF2 and SF3, and then by turning on control signals φSE of readout selection switching elements SE29 at time t130, the MCG signal components are simultaneously read out and transferred via amplification transistor SF2 and amplification transistor SF3.

Next, by turning on control signals φSE of readout selection switching elements SE30 for pixels A and E at time t131, the LCG reset components are read out and transferred simultaneously via amplification transistors SF2 and SF3, and then by turning on control signals φSE of readout selection switching elements SE31 at time t132, the LCG signal components are simultaneously read out and transferred via amplification transistor SF2 and amplification transistor SF3.

Next, in row E+1, the signal of pixel B in column F and the signal of pixel F in column F+1 are output via amplification transistor SF2 and amplification transistor SF3, respectively, in the same operation as described above from time t127 to t133.

Next, in row E+2, the signal of pixel C in column F and the signal of pixel G in column F+1 are output via amplification transistor SF2 and amplification transistor SF3, respectively, in the same operation as described above from time t127 to t133.

Next, in row E+3, the signal of pixel D in column F and the signal of pixel H in column F+1 are output via amplification transistor SF2 and amplification transistor SF3, respectively, in the same operation as described above from time t127 to t133.

The order of readout from pixel circuit 3 to negative feedback circuit 4d can be either regular or random, on a frame by frame basis. If there are fixed variations caused by the sample and hold capacitive element, sample and hold switch control signal φSH, and readout selection switching element control signal φSE, when readout is regular, they become fixed noise and are easily visible, but if readout is random, this fixed noise is less visible and the noise is improved in low-illuminance conditions.

Then, as described in Embodiment 1A, the variations are canceled since the reset component is subtracted from the signal component by the CDS of the AD conversion circuit.

Configuration and Operation Examples of Negative Feedback Circuit (for Increased Speed)

Differences between the negative feedback circuit configuration and Operation Example 1 will be described next.

In Embodiment 3A, per feedback amplifier FA, there are a plurality of pixel circuits 3 and sample and hold circuits 10 corresponding one-to-one.

Accordingly, signals corresponding to the gains of pixel circuit 3 (for example, pixel circuit 3b) must be implemented a plurality of times for sample and hold circuits 10 that share feedback amplifier FA.

If one unit includes s rows and t columns of pixel circuits 3 (for example, pixel circuits 3b) and sample and hold circuits 10, negative feedback operations must be repeated s×t times, and must be repeated for three gains (HCG, MCG, and LCG) and for the reset and signal components. In this example, there are 4 rows and 2 columns, so 8 times×3 gains×2 components=48 times.

This reduces noise, but because there are 48 negative feedback operations, readout from pixel circuit 3b to multi-pixel shared negative feedback circuit 4d takes time.

This leads to a long signal holding time (from time t102 to t126) in FD0 of pixel circuit 3, which is affected by the dark current in FD0 and affected by parasitic sensitivity. The readout time from pixel circuit 3b to negative feedback circuit 4d therefore needs to be fast and, as explained thus far, kTC noise needs to be reduced, especially in low-illuminance conditions. Hereinafter, a measure for achieving both high speed and low noise will be described.

As illustrated in (4) in FIG. 16, kTC noise in HCG in WDR determines the low-illuminance characteristics, so a negative feedback operation is required. However, looking at the boundary between MCG and HCG in the S/N curve, there is no problem if the kTC noise in MCG is smaller than the shot noise in HCG. Similarly, looking at the boundary between LCG and MCG in the S/N curve, there is no problem if the kTC noise in LCG is smaller than the shot noise in MCG.

Stated differently, in FIG. 17, the readout of the MCG reset component from time t102 to t106 is performed without negative feedback for sample and hold capacitive elements C22 of sample and hold circuits 10 corresponding to eight pixels, thus speeding up the readout time. Here, switching elements SW1 and SW2 are turned off, and switching elements SW11 and SW12 are turned on.

Next, the HCG reset components from time t106 to t110 are read out for eight sample and hold capacitive elements C20 of sample and hold circuits 10 while repeatedly applying negative feedback. Here, switching elements SW1 and SW2 are turned on, and switching elements SW11 and SW12 are turned off.

Next, the HCG signal components from time t110 to t114 are read out for eight sample and hold capacitive elements C21 of sample and hold circuits 10 while repeatedly applying negative feedback. Here, switching elements SW1 and SW2 are turned on, and switching elements SW11 and SW12 are turned off.

Next, the MCG signal components from time t114 to t118 are read out for eight sample and hold capacitive elements C23 of sample and hold circuits 10 without applying negative feedback to speed up the readout time. Here, switching elements SW1 and SW2 are turned off, and switching elements SW11 and SW12 are turned on.

Next, the LCG signal components from time t118 to t122 are read out for eight sample and hold capacitive elements C25 of sample and hold circuits 10 without applying negative feedback to speed up the readout time. Here, switching elements SW1 and SW2 are turned off, and switching elements SW11 and SW12 are turned on.

Next, the LCG reset components from time t122 to t126 are read out for eight sample and hold capacitive elements C24 of sample and hold circuits 10 without applying negative feedback to speed up the readout time. Here, switching elements SW1 and SW2 are turned off, and switching elements SW11 and SW12 are turned on.

In negative feedback circuit 4, feedback amplifier FA includes a gain switching function, and the gain of feedback amplifier FA for HCG can be set highest compared to the MCG and LCG gains. In such cases, the HCG convergence time takes a little longer but the kTC noise can be reduced, and the kTC noise of MCG and LCG cannot be reduced much but the convergence time can be reduced, thus reducing kTC noise in HCG and making HCG, MCG, and LCG faster overall.

In negative feedback circuit 4, the HCG capacitance values of sample and hold capacitive elements C20 and C21 can be set highest compared to the MCG and LCG capacitance values of sample and hold capacitive elements C22, C23, C24, C25. In such cases, the HCG convergence time takes a little longer but the kTC noise can be reduced, and the kTC noise of MCG and LCG cannot be reduced much but the convergence time can be reduced, thus reducing kTC noise in HCG and making HCG, MCG, and LCG faster overall.

Note that in negative feedback circuit 4, the gain of feedback amplifier FA can be set the same for HCG, MCG, and LCG to reduce the MCG and LCG negative feedback times (times t103 through t105, t115 through t117, t119 through t121, and t123 through t125). In such cases, the HCG convergence time takes a little longer but the kTC noise can be reduced, and the kTC noise of MCG and LCG cannot be reduced much but the convergence time can be reduced, thus reducing kTC noise in HCG and making HCG, MCG, and LCG faster overall.

The timing for signal readout from the sample and hold capacitors thereafter is the same as in the Configuration and Operation Examples of Negative Feedback Circuit (For Low Noise) section of Embodiment 3.

Dynamic Range Extension

A feature of the present embodiment is that the three frames—the high-illuminance exposure, the medium-illuminance exposure, and the high-illuminance exposure frames—combined to achieve a WDR are exposed at exactly the same timing and the exact same pixels are used, which inhibits false colors, coloring, and blur.

Details regarding the extension of the dynamic range are the same as in Embodiments 2A and 2B and so repeated description will be omitted.

Conventionally, there is no negative feedback circuit, so kTC noise is generated when the sample and hold switch is turned off, which worsens the low-illuminance noise and narrows the dynamic range.

In the present embodiment, kTC noise can be significantly reduced to achieve low noise since the sample and hold switch is turned off while the negative feedback circuit is applied to the reset and signal components of the pixel. Since the CDS in the AD conversion circuit subtracts the reset component from the signal component, variations in amplification transistor SF1 and amplification transistor SF2 are canceled. This results in reduced low-illuminance noise and an extended dynamic range.

Multi-Pixel Shared Negative Feedback Circuit Layout Configuration Example

Figure 22:
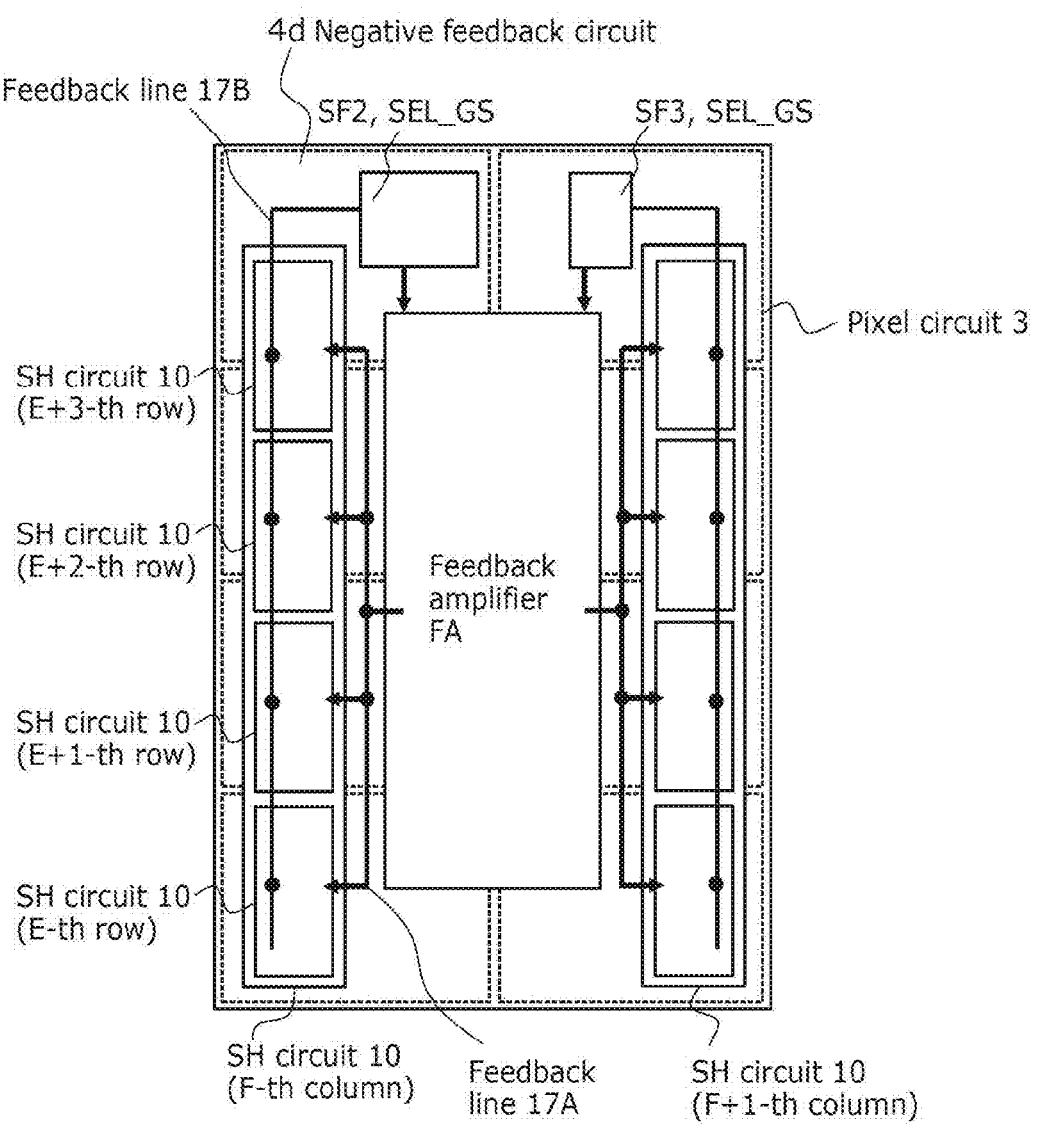
FIG. 22 schematically illustrates a layout of pixel circuits, feedback amplifier FA, and sample and hold circuits according to Embodiment 3.

FIG. 22 illustrates one example of a layout configuration of negative feedback circuit 4*d* shared by s rows and t columns of pixels. Here, a plurality of pixel circuits (3*a, b,* or *c*) and a plurality of sample and hold circuits (10*a, b,* or *c*) are arranged in a matrix (s rows×t columns), in a one-to-one stacked arrangement. In this layout, the feedback amplifier (FA) is interposed between the plurality of sample and hold circuits.

Figure 20:
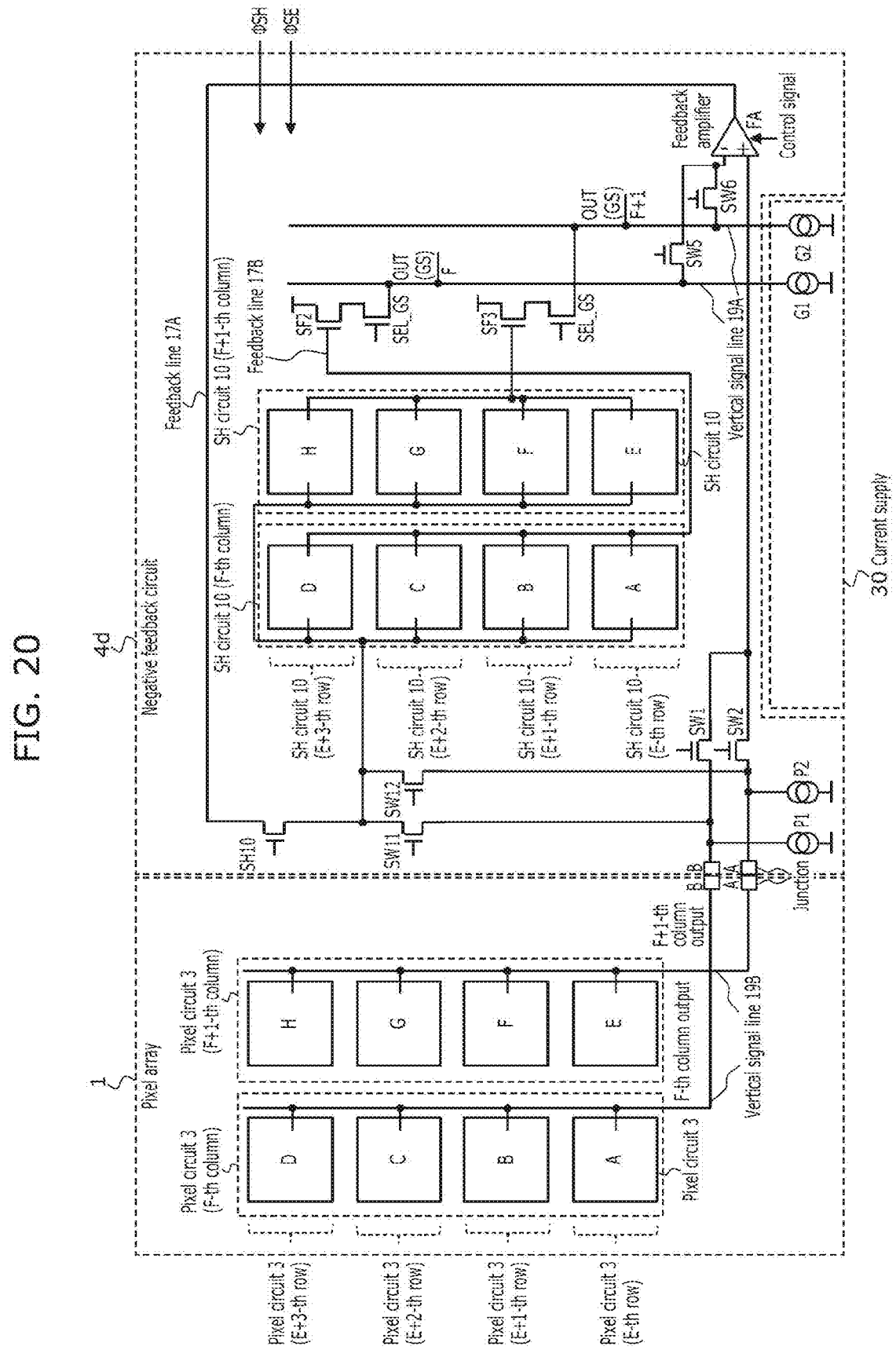
FIG. 20 illustrates a circuit example of a pixel circuit and a negative feedback circuit according to Embodiment 3.

Specifically, in this example, FIG. 22 schematically illustrates the four row, two column layout corresponding to FIG. 20. Feedback amplifier FA in FIG. 20 is interposed between the F-th column of SH circuits 10 and the F+1-th column of SH circuits 10. Feedback amplifier FA may be disposed in the center. Feedback lines A and B are arranged so that the top, bottom, left, and right are approximately equal, and the load is also configured so that the top, bottom, left, and right are approximately equal.

This shortens the readout distance from pixel circuit 3*a*, pixel circuit 3*b*, or pixel circuit 3*c* to SH circuit 10*a*, SH circuit 10*b*, or SH circuit 10*c* that correspond one-to-one. The negative feedback load from feedback amplifier FA to each sample and hold circuit 10*a*, or SH circuit 10*b*, or SH circuit 10*c* is approximately equal on the top, bottom, left, and right, making the kTC noise reduction approximately equal and eliminating the regular fixed component of noise.

Configuration Example of Stacked Structure BSI of Pixel Circuit and Negative Feedback Circuit When pixel cells are reduced in size, it becomes difficult to mount all of the sample and hold capacitive elements (for example, MIM or MOM capacitors) of SH circuits 10 of negative feedback circuits 4*d* on the logic chip side.

Figure 23:
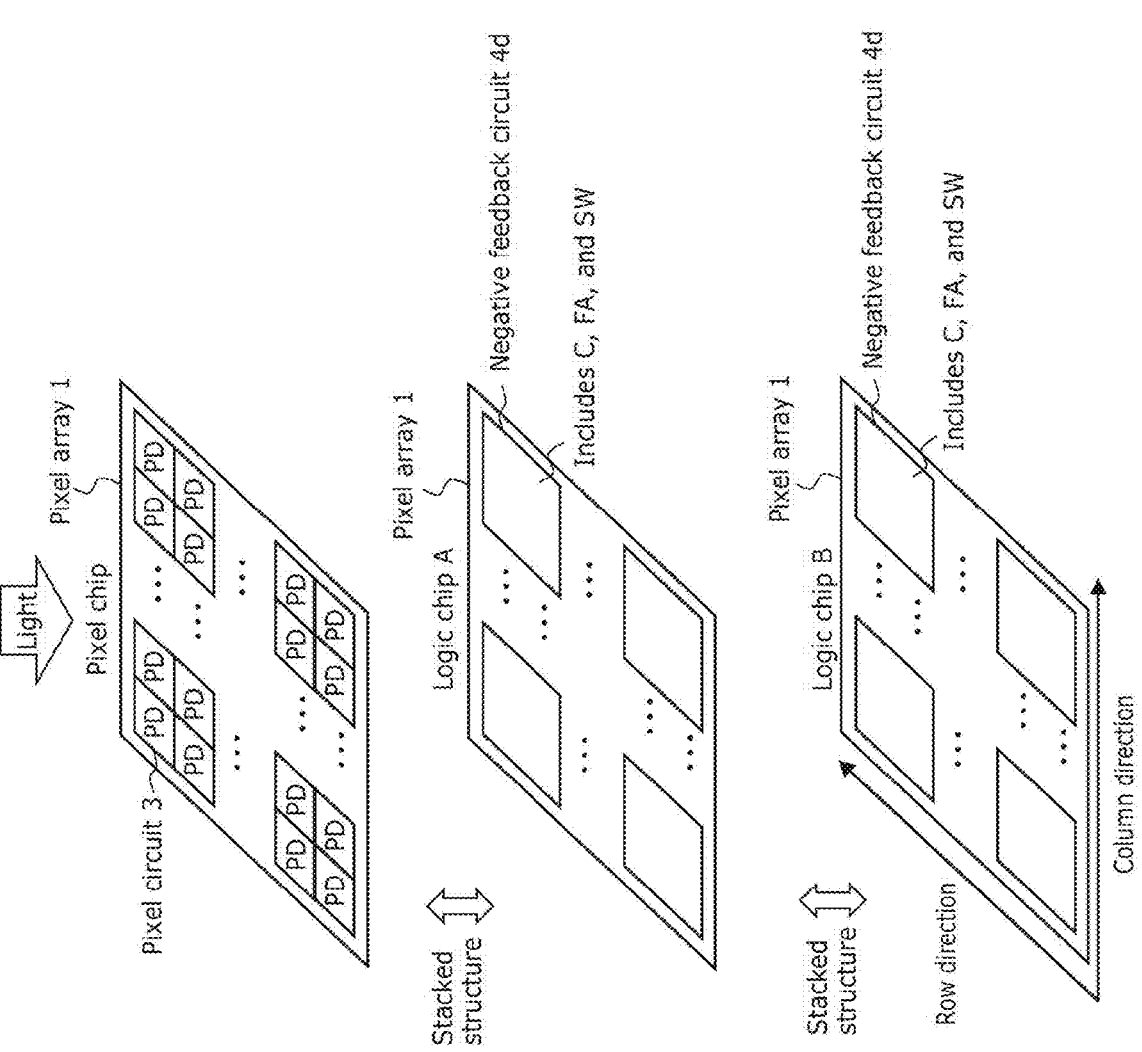
FIG. 23 illustrates an example of a solid-state imaging apparatus according to Embodiment 3 configured as a stacked-structure back-side illumination image sensor.

One example of a solid-state imaging apparatus configured as a stacked-structure back-side illumination image sensor is illustrated in FIG. 23. FIG. 23 illustrates a multi-pixel shared negative feedback circuit configuration, but is similar to the single negative feedback circuit configuration of Embodiment 1A that is illustrated in FIG. 5. The solid-state imaging apparatus can include a first semiconductor chip, a second semiconductor chip, or a plurality of semiconductor chips that are bonded together. Photodiode PD, sample and hold capacitive element C, feedback amplifier FA, and sample and hold switching element SH can be arranged in multi-pixel shared negative feedback circuit 4*d*, just as in Embodiment 1A.

Embodiment 4

Figure 24:
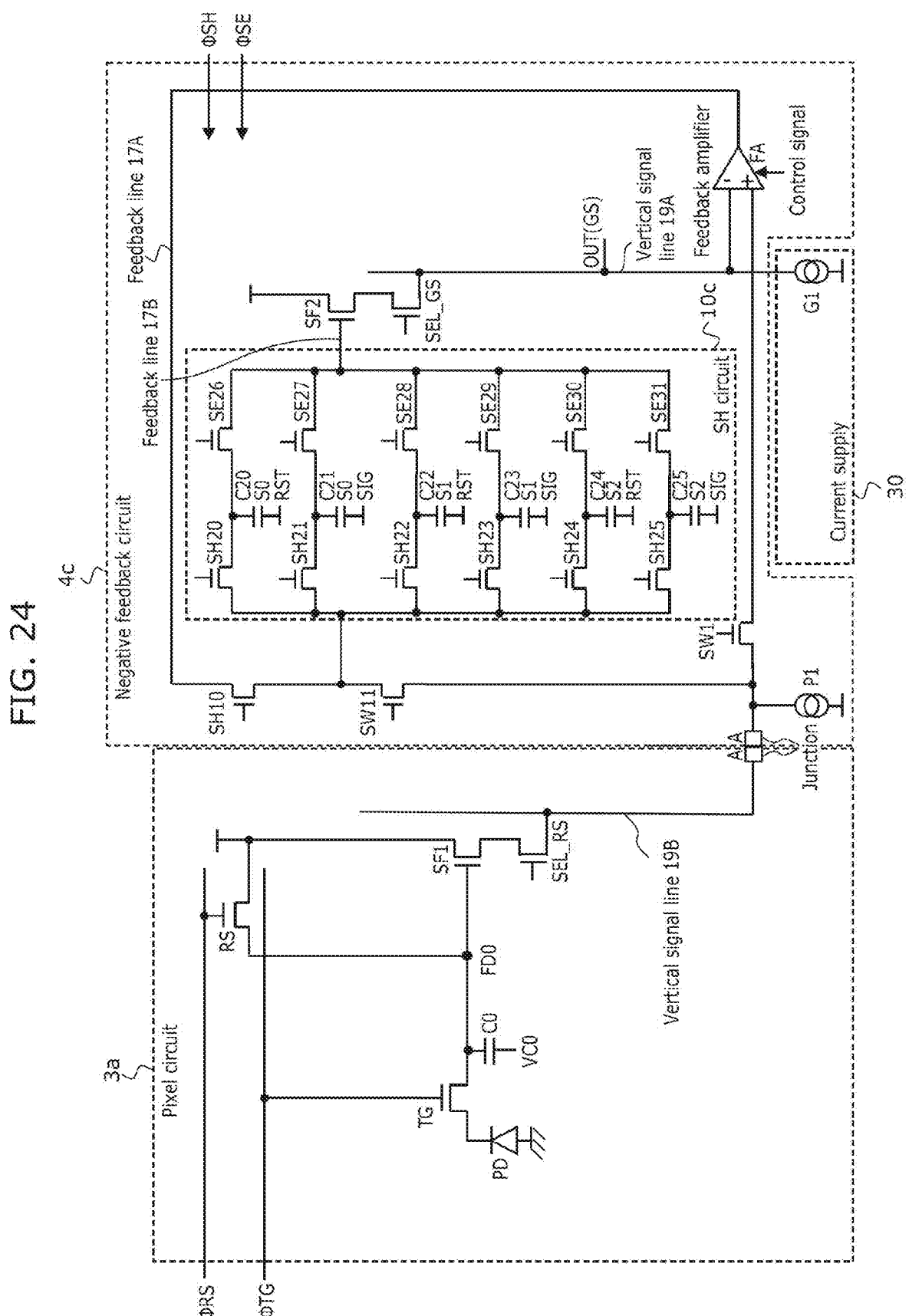
FIG. 24 illustrates a circuit example of a pixel circuit and a negative feedback circuit according to Embodiment 4.

The configuration of Embodiment 4 is illustrated in FIG. 24. Pixel circuit 3*a* is the same as in Embodiment 1A. Negative feedback circuit 4*c* is the same as in Embodiment 2A. Solid-state imaging apparatus 100 is also the same as in the above embodiment. The following description will focus on the points of difference with the above embodiment.

Pixel Circuit Configuration Example

In Embodiment 4, pixel circuit 3*a* is the same as in Embodiment 1A.

HCG Readout Operation Example

Figure 27:
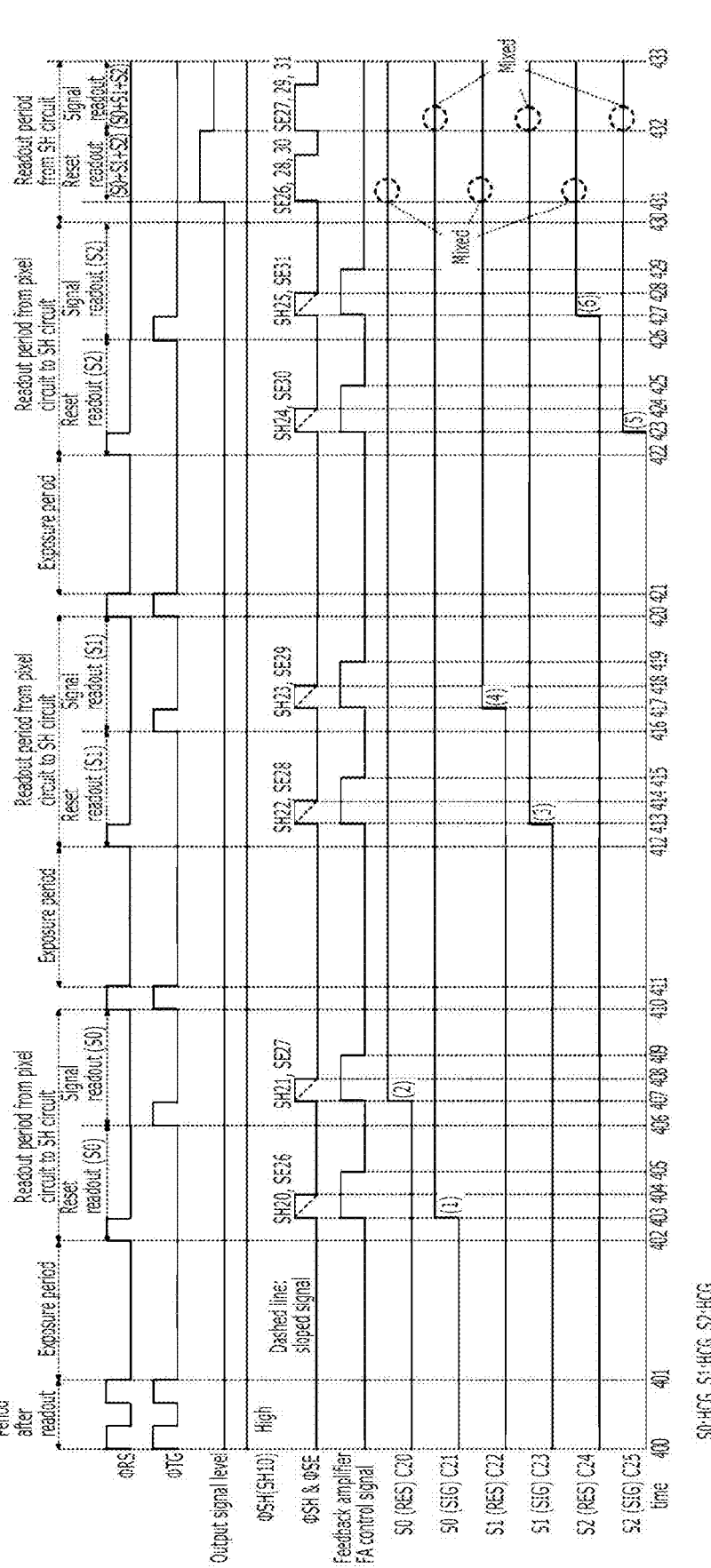
FIG. 27 illustrates a period of readout from a pixel circuit to a sample and hold circuit and timings of readout from the sample and hold circuit according to Embodiment 4.

In Embodiment 4, pixel circuit 3*a* is the same as in Embodiment 1A, and the timing is illustrated in FIG. 27.

Configuration and Operation Examples of Negative Feedback Circuit

In the global shutter method and rolling shutter method, which are the exposure methods used in Embodiment 1A, the exposure is continuous (the exposure period is not divided).

Figure 25:
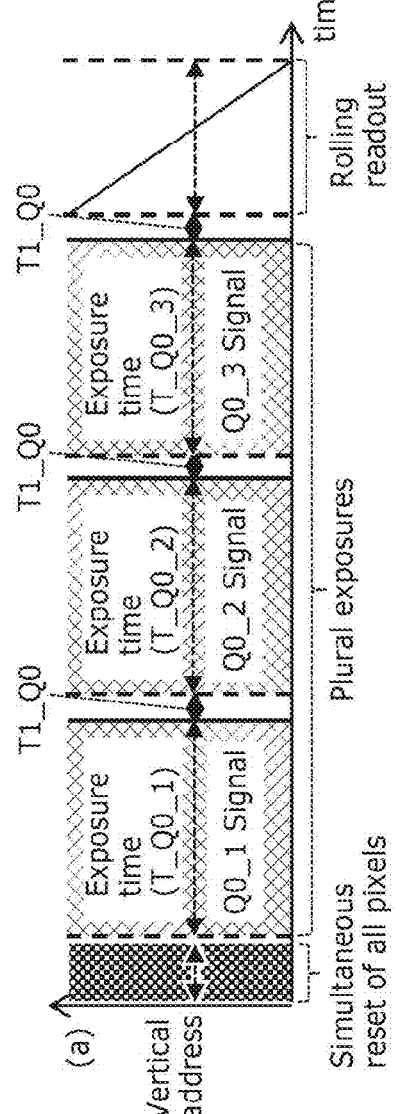
FIG. 25 illustrates timing related to the accumulating of charges of a photodiode and a storage capacitive element when a global shutter method is used according to Embodiment 4.
Figure 26:
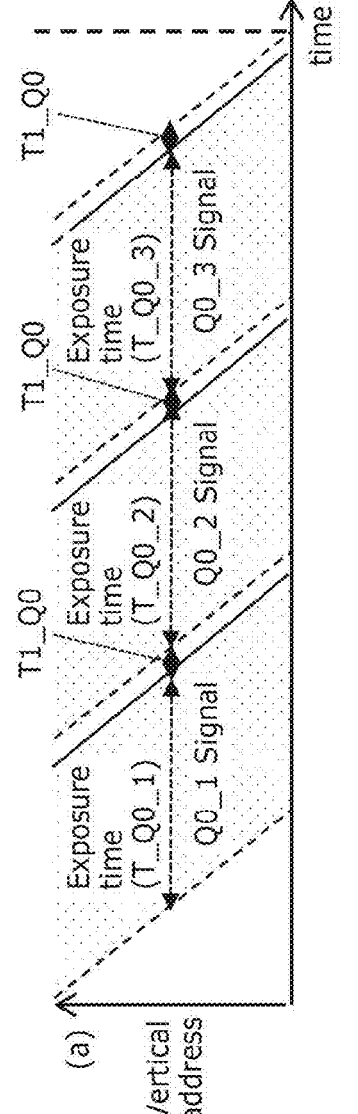
FIG. 26 illustrates timing related to the accumulating of charges of a photodiode and a storage capacitive element when a rolling shutter method is used according to Embodiment 4.

FIG. 25 and FIG. 26 illustrate timing related to the accumulating of charge of photodiode PD, and illustrate the exposure method used in Embodiment 4. The exposure period is divided into a plurality (N) of exposure periods, and in each exposure period, photodiode PD continues to expose for the desired exposure period and the amount of charge is expressed as Q0. Accordingly, the pixel saturation of photodiode PD is magnified by a factor of N. In this example, N=3.

In the global shutter method illustrated in FIG. 25, global reset is performed simultaneously for all pixels, the exposure period is divided into a plurality (N) of exposure periods, and in each exposure period, photodiode PD continues to expose for the desired exposure period and the amount of charge is expressed as Q0. Accordingly, the pixel saturation of photodiode PD is magnified by a factor of N. In this example, N=3.

After exposure time T_Q0_1, the charge from the photodiode is read out simultaneously for all pixels to the sample and hold capacitive elements (C20 and C21). Next, after exposure time T_Q0_2, the charge from the photodiode is read out simultaneously for all pixels to the sample and hold capacitive elements (C22 and C23). Next, after exposure time T_Q0_3, the charge from the photodiode is read out simultaneously for all pixels to the sample and hold capacitive elements (C24 and C25). The analog mixed signals of the sample and hold capacitive elements (C20, C22, and C24) and the sample and hold capacitive elements (C21, C23, and C25) are then read out row by row using the rolling method.

In the rolling shutter method illustrated in FIG. 26, all pixels are scanned per selected row to start exposure, the exposure period is divided into a plurality (N) of exposure periods, and in each exposure period, photodiode PD continues to expose for the desired exposure period and the amount of charge is expressed as Q0. Accordingly, the pixel saturation of photodiode PD is magnified by a factor of N. In this example, N=3.

After exposure time T_Q0_1, the charge from the photodiode is read out per selected row to the sample and hold capacitive elements (C20 and C21). Next, after exposure time T_Q0_2, the charge from the photodiode is read out per selected row to the sample and hold capacitive elements (C22 and C23). Next, after exposure time T_Q0_3, the charge from the photodiode is read out per selected row to the sample and hold capacitive elements (C24 and C25). The analog mixed signals of the sample and hold capacitive elements (C20, C22, and C24) and the sample and hold capacitive elements (C21, C23, and C25) are then read out row by row using the rolling method.

FIG. 27 illustrates an example of the timing of the signal readout operation.

In Embodiment 4, the exposure timing from time 401 to 402 and the readout timing of the reset and signal components of the pixel signal to sample and hold circuit 10 from time 402 to 410 are the same as in Embodiment 1A for pixel circuit 3a.

The same applies to the timing from time 411 to 420, and the timing from time 402 to 410 above is repeated.

The same applies to the timing from time 421 to 430, and the timing from time 402 to 410 above is repeated.

Next, by turning control signals φSE of the readout selection switching elements (SE26, SE28, and SE30) on at time t431, the analog mixed reset components of sample and hold capacitive elements (C20, C22, and C24) are read out and transferred via amplification transistor SF2, and by turning control signals φSE of the readout selection switching elements (SE27, SE29, and SE31) on at time t614, the analog mixed signal components of sample and hold capacitive elements (C21, C23, and C25) are read out and transferred via amplification transistor SF2.

Since the CDS in the AD conversion circuit subtracts the reset component from the signal component, variations in amplification transistor SF1 and amplification transistor SF2 are canceled. This results in reduced low-illuminance noise and an extended dynamic range.

Dynamic Range Extension

A feature of the present embodiment is that one frame—for example, the high-illuminance exposure frame—combined to achieve a WDR is continuously exposed over a plurality (N) of divided exposure periods and the exact same pixels are used, which inhibits false colors, coloring, and blur.

While being a continuous exposure, the pixel saturation can be increased by a factor of N by dividing the exposure into a plurality of (N) exposures. The charge of the sample and hold capacitive element is then mixed by turning on control signal φSE of the readout selection switching element in an analog manner. As a result, the dynamic range can be extended without increasing readout speed and without increasing power consumption.

In this example of a plurality of (N) exposures, since N=3, the dynamic range can be extended by approximately 10 dB. Increasing the number of exposures (i.e., increasing N) can easily extend the dynamic range.

Regarding the concept of analog mixing for example, when the value of the capacitive element is expressed as C and the signal level, which is the amount of charge generated in the capacitive element and depends on illuminance, is expressed as $\Delta V$, then charge $\Delta Q=C \times \Delta V$. If this is repeated three times, the amount of charge can be integrated three times to become $3 \times \Delta Q$, which means that the dynamic range is extended by a factor of three.

Embodiment 5A

FIG. 28 is a diagram illustrating an example of a configuration of imaging apparatus 200 to which solid-state imaging apparatus 100 according to Embodiments 1 to 4 is applied. The imaging apparatus illustrated in the same FIGURE is a camera system, and includes solid-state imaging apparatus 100, imaging optical system 202 including a lens, signal processor 203, drive circuit 204, and system controller 205.

Solid-state imaging apparatus 100 according to Embodiments 1 to 4 is used in imaging apparatus 200.

Drive circuit 204 receives control signals in accordance with the drive mode from system controller 205 and provides drive mode signals to solid-state imaging apparatus 100. In solid-state imaging apparatus 100 to which the drive mode signals are supplied, drive pulses corresponding to the drive mode signals are generated and supplied to each block in solid-state imaging apparatus 100.

Signal processor 203 receives image signals output from solid-state imaging apparatus 100 and performs various signal processing on the image signals.

Thus, the imaging apparatus according to the present embodiment includes solid-state imaging apparatus 100 described above, imaging optical system 202 that guides incident light from a subject to solid-state imaging apparatus 100, and signal processor 203 that processes the output signal from solid-state imaging apparatus 100.

Embodiment 5B

Figure 29:
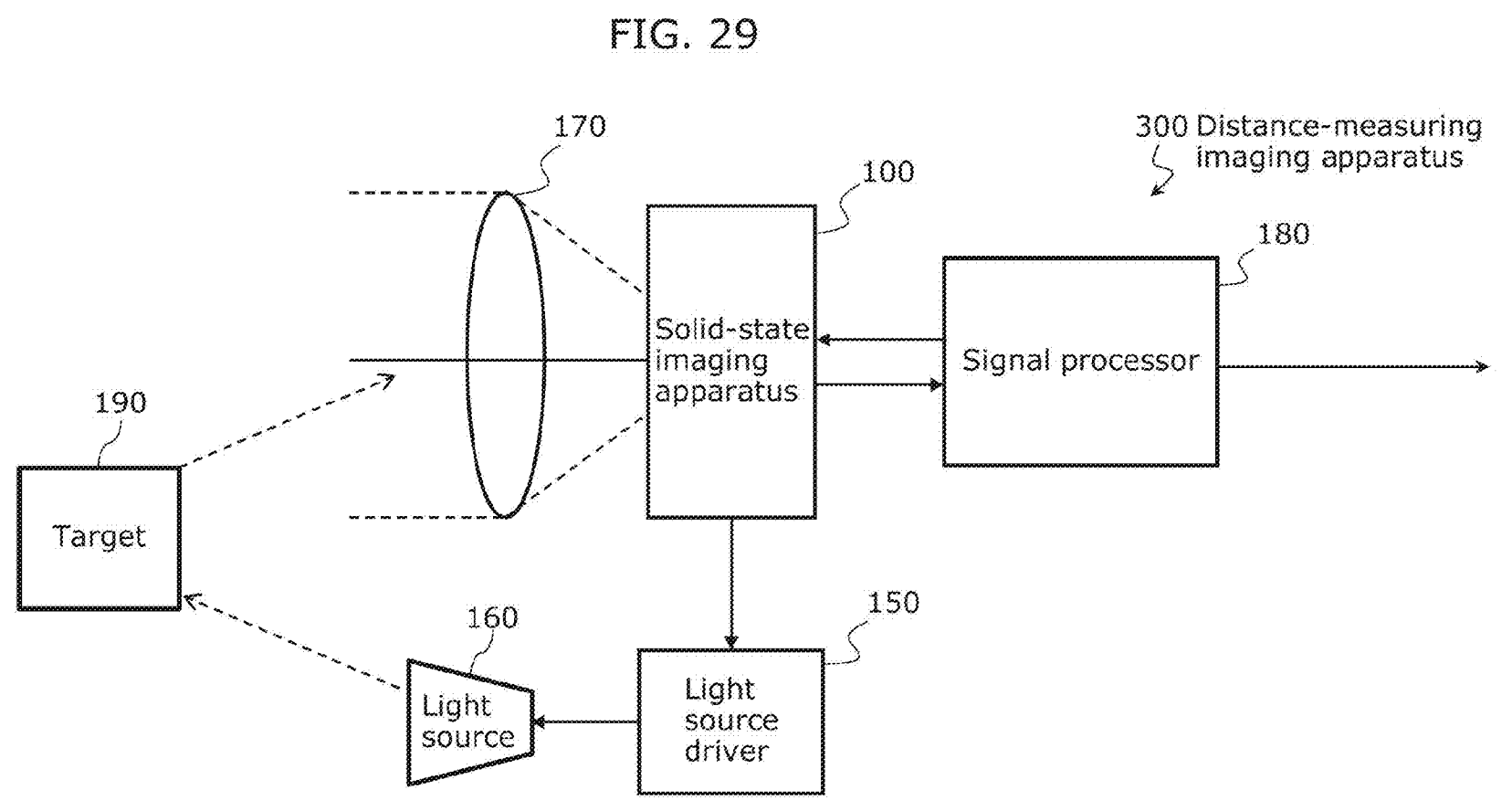

FIG. 29 is a block diagram illustrating an example of a configuration of distance-measuring imaging apparatus 300 according to Embodiments 1 to 4. The target whose distance is to be measured is labeled with reference sign 190.

Distance-measuring imaging apparatus 300 includes light source driver 150, light source 160, optical lens 170, signal processing circuit 180, and solid-state imaging apparatus 100.

Solid-state imaging apparatus 100 according to Embodiments 1 to 4 is used in distance-measuring imaging apparatus 300.

Light source driver 150 supplies drive signals to light source 160 in accordance with signals from solid-state imaging apparatus 100 instructing light emission.

Light source 160 generates pulsed light for distance measuring in accordance with the drive signals of light source driver 150.

Optical lens 170 is a lens for focusing the reflected pulsed light from target 190 corresponding to the pulsed light from light source 160.

Signal processing circuit 180 calculates the distance to target 190 based on the signal received from solid-state imaging apparatus 100.

Solid-state imaging apparatus 100 causes target 190 to be illuminated with near-infrared light from light source 160 under background light. The reflected light from target 190 is incident on pixel array 1 through optical lens 170. Reflected light incident on pixel array 1 is formed into an image, and the formed optical image is converted into a pixel signal. The output of solid-state imaging apparatus 100 is converted to distance data by signal processing circuit 180, and also to a visible distance image or luminance image, depending on the application.

INDUSTRIAL APPLICABILITY

The present disclosure relates to a solid-state imaging apparatus, as well as an imaging apparatus and a distance-measuring imaging apparatus that use the solid-state imaging apparatus as an imaging device, and is suitable for a video camera, a digital camera, and a distance-measuring system, for example.

The invention claimed is:

1. A solid-state imaging apparatus comprising:
a pixel circuit that outputs a pixel signal, the pixel signal comprising both reset and signal components, the reset component being due to a reset of a charge storage of the pixel circuit and the signal component being due to imaging of a photodiode of the pixel circuit; and
a negative feedback circuit, wherein
the negative feedback circuit includes:
a sample and hold circuit (hereinafter "SH circuit") that samples and holds the pixel signal; and
a feedback amplifier that negatively feeds back, to the SH circuit, a feedback signal according to a difference between the pixel signal from the pixel circuit and an output signal from the SH circuit,
the SH circuit includes:
a SH subcircuit that samples and holds the pixel signal; and
an amplification transistor that amplifies and outputs, to the feedback amplifier, an output signal of the SH subcircuit,
the SH subcircuit includes:
a first sample and hold switching element for sampling the feedback signal; and
a first capacitive element connected to the first sample and hold switching element,
the pixel signal from the pixel circuit is input into a positive input terminal of the feedback amplifier,
the feedback signal from the feedback amplifier is input into the first sample and hold switching element,
the output signal from the amplification transistor is input into a negative input terminal of the feedback amplifier,
the feedback amplifier, the SH subcircuit, and the amplification transistor form a feedback loop, and
the negative feedback circuit further includes:
a second capacitive element connected to, among two terminals of the first sample and hold switching element, a terminal into which the feedback signal is input; and
a third capacitive element connected in parallel to the first sample and hold switching element.

2. The solid-state imaging apparatus according to claim 1, wherein
the SH subcircuit includes a first readout selection switching element that connects the first capacitive element and the amplification transistor.

3. The solid-state imaging apparatus according to claim 1, wherein
the pixel circuit outputs a plurality of pixel signals each of which is the pixel signal, and
the SH circuit includes a plurality of SH subcircuits corresponding to the plurality of pixel signals, each of the plurality of SH subcircuits being the SH subcircuit.

4. The solid-state imaging apparatus according to claim 3, wherein
the plurality of pixel signals include a first pixel signal, a second pixel signal, and a third pixel signal with mutually different exposure sensitivities, and
the plurality of SH subcircuits include a first SH subcircuit, a second SH subcircuit, and a third SH subcircuit.

5. The solid-state imaging apparatus according to claim 3, wherein
by connecting first capacitive elements in two or more SH subcircuits among the plurality of SH subcircuits in parallel, corresponding pixel signals among the plurality of pixel signals are mixed.

6. The solid-state imaging apparatus according to claim 3, wherein
the negative feedback circuit includes a switching circuit that switches between implementing and not implementing negative feedback in a sample and hold operation, and
among the plurality of pixel signals, negative feedback is implemented for at least one pixel signal and not implemented for other pixel signals.

7. The solid-state imaging apparatus according to claim 3, wherein
the feedback amplifier includes a gain switching function, and
in the negative feedback circuit, a gain of the feedback amplifier is set per pixel signal among the plurality of pixel signals.

8. The solid-state imaging apparatus according to claim 3, wherein
a capacitance value of the first capacitive element varies among the plurality of SH subcircuits according to a corresponding pixel signal among the plurality of pixel signals.

9. The solid-state imaging apparatus according to claim 1, wherein
the pixel circuit comprises a plurality of pixel circuits and the SH circuit comprises a plurality of SH circuits, and
the feedback amplifier is shared by two or more SH circuits among the plurality of SH circuits.

10. The solid-state imaging apparatus according to claim 9, wherein
the plurality of pixel circuits are arranged in a matrix,
the plurality of SH circuits are arranged in a matrix,
the plurality of pixel circuits and the plurality of SH circuits are arranged in a one-to-one stacked arrangement, and
in plan view, the feedback amplifier is interposed between the plurality of SH circuits.

11. The solid-state imaging apparatus according to claim 1, wherein
the SH subcircuit further includes:
a second sample and hold switching element for sampling the feedback signal; and
a fourth capacitive element connected to the second sample and hold switching element,
the first capacitive element holds the reset component, and
the fourth capacitive element holds the signal component.

12. The solid-state imaging apparatus according to claim 11, wherein
the SH subcircuit further includes:
a first readout selection switching element that connects the first capacitive element and the amplification transistor, and
a second readout selection switching element that connects the fourth capacitive element and the amplification transistor.

13. The solid-state imaging apparatus according to claim 1, wherein the first sample and hold switching element transitions from on to off according to a control signal including a sloped voltage waveform.

14. The solid-state imaging apparatus according to claim 13, wherein the negative feedback circuit includes:

a measurement unit configured to measure a noise level of the first capacitive element in the SH circuit; and a determination unit configured to determine an incline of the sloped voltage waveform that decreases the noise level measured.

15. The solid-state imaging apparatus according to claim 1, wherein the negative feedback circuit includes, in the feedback loop, a third sample and hold switching element inserted between an output terminal of the feedback amplifier and an input terminal of the first sample and hold switching element, and the third sample and hold switching element transitions from on to off according to a control signal including a sloped voltage waveform.

16. The solid-state imaging apparatus according to claim 1, wherein the pixel circuit includes an output transistor that outputs the pixel signal, and a size of the amplification transistor is greater than a size of the output transistor.

17. An imaging apparatus comprising:

the solid-state imaging apparatus according to claim 1 that captures an image of a subject;

an imaging optical system that guides incident light from the subject to the solid-state imaging apparatus; and a signal processor that processes an output signal from the solid-state imaging apparatus.

18. A distance-measuring imaging apparatus comprising:

the solid-state imaging apparatus according to claim 1 that captures reflected light from a target irradiated with pulsed light;

an imaging optical system that guides the reflected light from the target to the solid-state imaging apparatus; and a signal processor that processes an output signal from the solid-state imaging apparatus.

* * * * *